United States Patent
Goto et al.

(10) Patent No.: US 6,197,646 B1
(45) Date of Patent: Mar. 6, 2001

(54) MANUFACTURE OF SEMICONDUCTOR DEVICE WITH SALICIDE ELECTRODE

(75) Inventors: Kenichi Goto; Atsuo Fushida; Tatsuya Yamazaki; Yuzuru Ota; Hideo Takagi; Keisuke Okazaki, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 08/693,635

(22) Filed: Aug. 9, 1996

Related U.S. Application Data

(63) Continuation-in-part of application No. 08/322,546, filed on Oct. 13, 1994, now abandoned.

(30) Foreign Application Priority Data

Feb. 12, 1993 (JP) ..................................... 5-302881
Aug. 31, 1994 (JP) ..................................... 6-207032
Aug. 11, 1995 (JP) ..................................... 7-206198

(51) Int. Cl.$^7$ ................................................ H01L 21/336
(52) U.S. Cl. .................. 438/301; 438/533; 438/586; 438/651; 438/664; 438/683
(58) Field of Search .................................. 438/301, 303, 438/305, 523, 533, 586, 649, 651, 655, 664, 682, 683, 653

(56) References Cited

U.S. PATENT DOCUMENTS

| | | | |
|---|---|---|---|
| 4,378,628 | 4/1983 | Levinstein et al. | 438/592 |
| 5,047,367 | 9/1991 | Wei et al. | 438/607 |
| 5,399,506 | 3/1995 | Tsukamoto | 438/301 |

FOREIGN PATENT DOCUMENTS

| | | |
|---|---|---|
| 58-46633 | 3/1983 | (JP) . |
| 62-149154 | 7/1987 | (JP) . |
| 62-188223 | 8/1987 | (JP) . |

OTHER PUBLICATIONS

Wei, C., et al., "Comparison of Cobalt and Titanium Silicides . . . ", VMIC Conference, Jun. 12–13, 1989, pp. 241–250.*

Berti, C., et al., "A Manufacturable Process for the Formation . . . ", VMIC Conference, Jun. 9–10, 1992, pp. 267–273.

"0.1 $\mu$m MOS . . . ", Nikkei Microdevices, Dec. 1993, EDM 93, p. 772.

Yamazaki, T., et al., "21 p Switching 0.1$\mu$m. CMOS . . . " IEDM 93 Tech. Digest, Dec. 1993, pp. 906–908.

Wang, Q. et al., "Ultra–Shallow Junction . . . " IEEE Trans. Electron Devices, vol. 39, No. 11, Nov. 1992. pp. 2486–2496.

* cited by examiner

Primary Examiner—T. N. Quach
(74) Attorney, Agent, or Firm—Armstrong, Westerman, Hattori, McLeland & Naughton

(57) ABSTRACT

A method of manufacturing a semiconductor device with a silicide electrode is provided which can form a good contact even at a scaled-down pattern. The method includes the steps of: forming an insulated gate structure with side wall spacer on a p-type region of a silicon (Si) substrate; implanting arsenic ions in source/drain regions at a dose less than $5 \times 10^{15}$ cm$^{-2}$; forming a laminated layer of a Co film and a TiN film on the surface of the substrate; heating the substrate to let the Co film react with an underlying Si region for silicidation; and removing the TiN film. Another method includes the steps of: forming a field oxide film on the surface of a silicon (Si) substrate for element isolation; implanting ions in the surface region of the Si substrate defined by the field oxide film to form a conductive silicon region; depositing a Co film on the Si surface extending to the field oxide film; heating the Si substrate under such conditions of a time and a temperature that does not allow CoSi$_2$ to be formed, and lets the Co film react with the conductive silicon region for silicidation, thereby forming Co silicide; removing an unreacted Co film; and subjecting the Si substrate to another heat treatment to convert the Co silicide to CoSi$_2$.

34 Claims, 49 Drawing Sheets

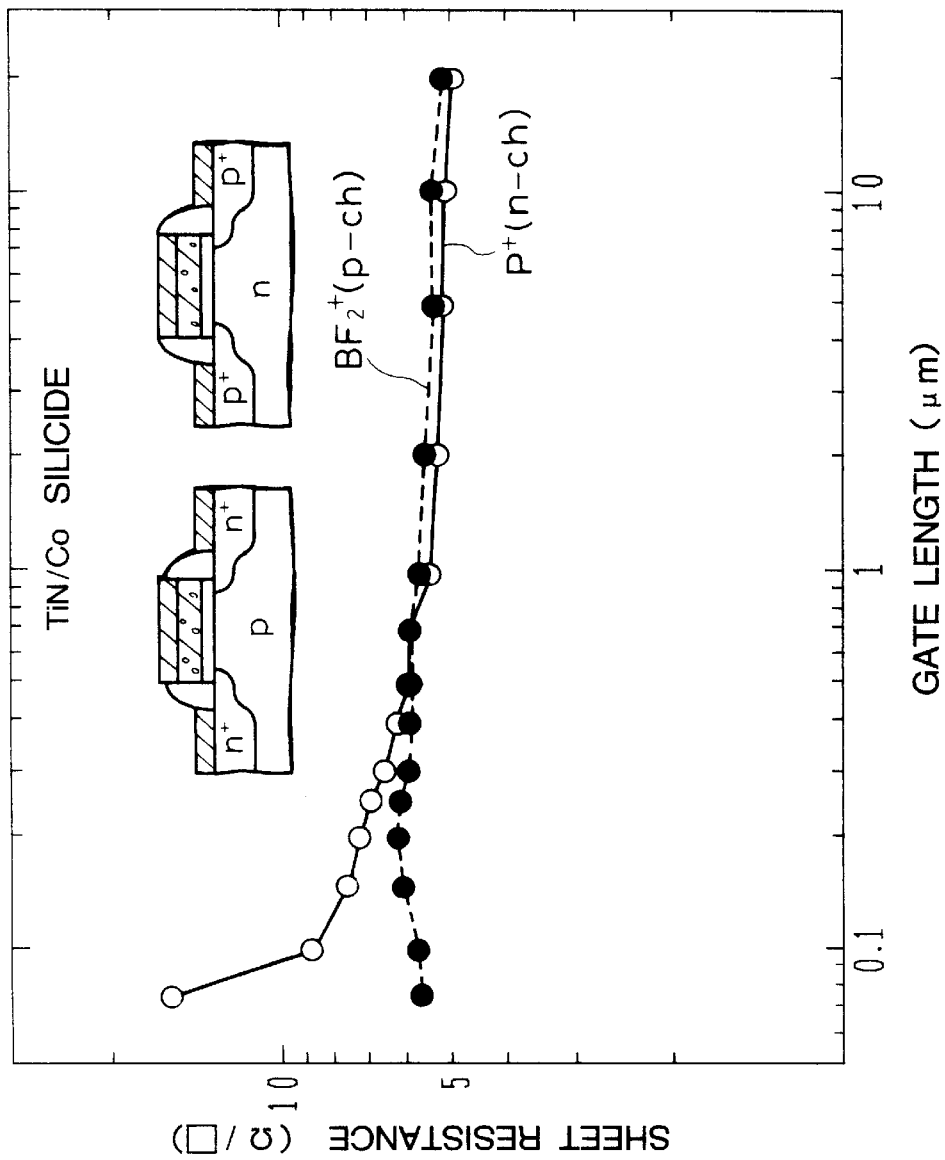

FIG.5

| As (cm⁻²) \ 1ST ANNEAL | 600°C 30sec | 650°C 30sec | 700°C 30sec | 750°C 30sec | 450°C 30min |
|---|---|---|---|---|---|
| $1 \times 10^{15}$ | ◯ | ◯ 3.8 / 3.2 | ◯ 3.5 / 3.3 | ◯ 3.5 / 3.4 | ◯ 14.3 / 3.4 |
| $2 \times 10^{15}$ | ◯ | △ 5.0 / 3.4 | ◯ 4.4 / 3.3 | ◯ 3.5 / 3.4 | ◯ 14.1 / 3.5 |
| $3 \times 10^{15}$ | ✕ | ✕ 16.6 / — | ◯ 4.5 / 3.3 | ◯ 3.9 / 3.6 | ◯ 14.5 / 3.5 |
| $4 \times 10^{15}$ | ✕ | ✕ 17.0 / 16.4 | ✕ 13.0 / 10.2 | ✕ 16.8 / — | ◯ 15.0 / 3.8 |
| $5 \times 10^{15}$ | ✕ | ✕ 16.3 / 15.8 | ✕ — / — | ✕ 16.4 / 16.2 | △ 14.5 / 4.0 |

| METAL | Ti | Pt | Co |
|---|---|---|---|
| THICKNESS T | 30nm | 10~30nm | 18nm |
| 1ST ANNEAL | 675℃ 30sec | 600℃ 30sec | 700-750℃ 30sec |
| WASH-OUT | NH4OH+H2O2+H2O 65℃ 90sec | HNO3+HCl 80℃ 60sec | HCl+H2O2 ROOM TEMP. 3min |
| 2ND ANNEAL | 800℃ 30sec | | |

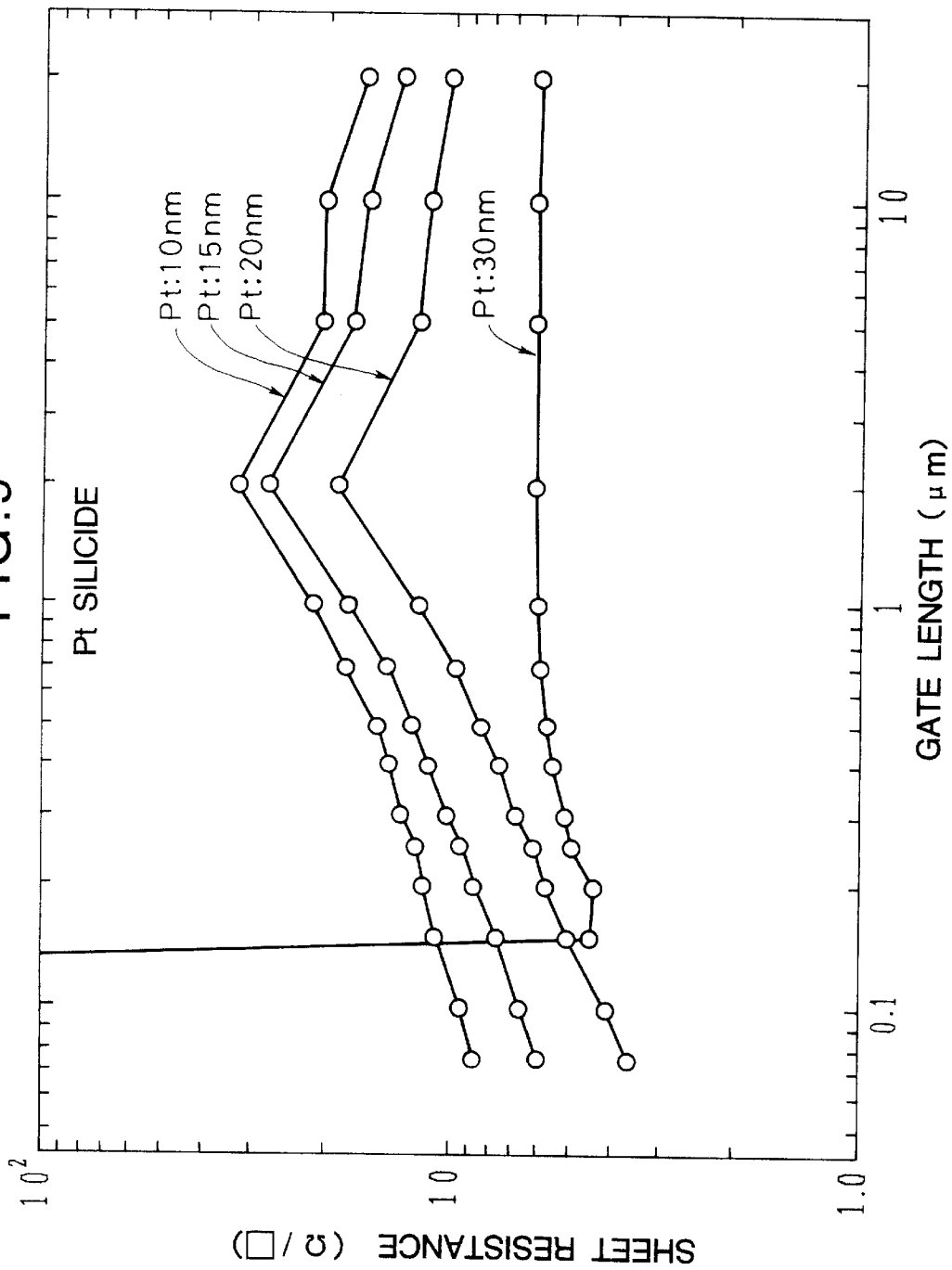

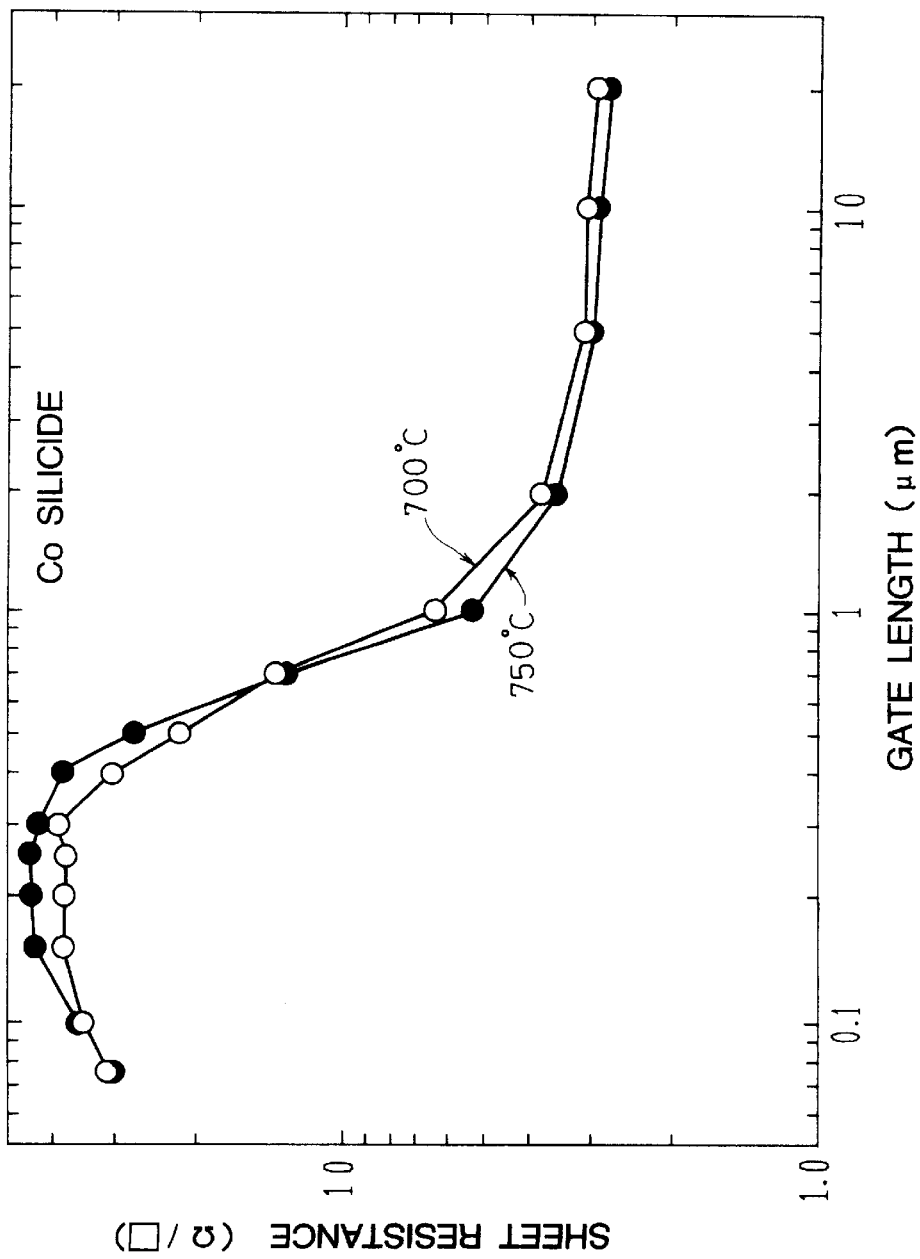

FIG.18

| 1ST ANNEAL<br>As⁺ | 600°C | 650°C | 700°C | 750°C |
|---|---|---|---|---|
| 1E15 | ○ | ○ | ○ | ○ |
| 2E15 | ○ | ○ | ○ | ○ |
| 3E15 | × | × | ○ | ○ |
| 4E15 | × | × | × | × |
| 5E15 | × | × | × | × |

FIG.19

(at ohm/sq.)

| 1ST ANNEAL | | TiN W/O | Co W/O | 2ND ANNEAL |
|---|---|---|---|---|
| 450℃ | 30sec | 47 | 90 | 90 |
| | 5min | 63 | 64 | 5.4 |
| | 10min | 48 | 49 | 2.7 |
| 650℃ | 30sec | 27.6 | ∞ | ∞ |
| | 5min | 2.8 | ∞ | ∞ |
| | 10min | 2.7 | ∞ | ∞ |

As depo

450°C 30sec

650°C 30sec

450°C 10min

650°C 10min

| 1ST ANNEAL | W/O PROCESS | Si $_{2s}$ | Co $_{2p3/2}$ | As $_{3d}$ | O $_{1s}$ |
|---|---|---|---|---|---|
| 450°C 10min | TiN W/O | 25.2 | 9.22 | 0.66 | 46.5 |
|  | Co W/O | 23.7 | 7.73 | 0.58 | 53.2 |
| 650°C 30sec | TiN W/O | 22.8 | 5.78 | 1.15 | 51.6 |
|  | Co W/O(a) | 29.9 | 0.0 | 0.0 | 65.2 |
|  | Co W/O(b) | 31.1 | 0.0 | 1.17 | 59.9 |

FIG.24

(at ohm/sq.)

| 1ST ANNEAL (10min) | TiN W/O | Co W/O | 2ND ANNEAL |
|---|---|---|---|
| 350°C | 63 | ∞ | ∞ |
| 400°C | 79 | 158 | 152 |
| 450°C | 81 | 86 | 3.9 |
| 500°C | 87 | 92 | 8-12 |
| 650°C | 3.1 | ∞ | ∞ |

MANUFACTURE OF SEMICONDUCTOR DEVICE WITH SALICIDE ELECTRODE

This application is a continuation-in-part of application Ser. No. 08/322,546, filed Oct. 13, 1994, abandoned.

BACKGROUND OF THE INVENTION a) Field of the Invention

The present invention relates to a semiconductor device and more particularly to a MOS type semiconductor device with salicide electrodes.

b) Description of the Related Art

As the integration degree of semiconductor integrated circuit devices is becoming high, MOS transistor elements of these devices are scaled down and becoming progressively smaller.

A gate length, for example, has been shortened from sub-micron to half-micron, and has a tendency to further be shortened to 0.35 $\mu$m, 0.25 $\mu$m, and even to 0.1 $\mu$m. The shorter the gate length, the more a high speed operation becomes advantageous. A resistance of a gate electrode is required to be suppressed low even if it is made narrow.

As electrode materials having a low contact resistance to a silicon surface, there are known metal silicides containing Ti, Pt, Co, or other metals. These metal silicides have a low sheet resistance at the interface to silicon, and are suitable for the connection of MOS transistors to wirings such as Al wirings.

Most gate electrodes of MOS transistors use silicon materials such as polycrystalline silicon and amorphous silicon. With a silicon gate electrode, the materials of the source, gate, and drain are all silicon. If a salicide (self-aligned silicide) process is used, contacts can be formed at these silicon regions. In order to make a MOS transistor small, it is necessary to reduce the area of the source/drain regions.

As MOS transistors are becoming small, it is required to form good contacts to small areas of silicon. In addition, as transistors are scaled down, it is necessary not only to shorten gate lengths but also to shallow the source/drain regions in order to avoid a short channel effect.

For example, the depth of source/drain regions is about 150 to 200 nm for a gate length of 0.35 to 0.5 $\mu$m, about 100 nm for a gate length of 0.25 $\mu$m, and about 80 nm for a gate length of 0.15 $\mu$m.

With such small transistors, good contacts are not always formed on silicon by conventional contact forming techniques.

SUMMARY OF THE INVENTION

It is an object of the present invention to provide a semiconductor device manufacturing method capable of forming sufficiently good contacts even to small silicon areas.

It is another object of the present invention to provide a semiconductor device manufacturing method including a silicidation process of a Co film excellent in self-alignment.

It is a further object of the present invention to provide a semiconductor device manufacturing method capable of forming a self-aligned low resistance Co silicide film on a fine silicon area defined by a field oxide film.

According to one aspect of the present invention, there is provided a method of manufacturing a semiconductor device including the steps of: forming an insulated gate structure on a p-type active region of a silicon (Si) substrate, the insulated gate structure having side wall insulating regions; implanting arsenic ions in source/drain regions on opposite sides of the insulated gate electrode structure at a dose less than $5\times10^{15}$ cm$^{-2}$; forming a laminated layer of a Co film and a TiN film on the surface of the substrate; heating the substrate and reacting the Co film with an underlying Si region for silicidation; and removing the TiN film.

If an As dose is set to $5\times10^{15}$ cm$^{-2}$ or more, the phenomenon that even if a Co silicide layer is formed, the sheet resistance does not lower sufficiently or the silicide layer is peeled off. By limiting the As dose less than $5\times10^{15}$ cm$^{-2}$, silicidation of a Co film formed on the active region advances properly.

If a silicidation reaction of a Co film with underlying Si is performed by heating the substrate while covering the Co film with a TiN film, a low resistance Co silicide electrode can be formed. It is supposed that the TiN film has a protection function.

It is possible to perform a salicide (self-aligned silicide) reaction by forming a laminated film of a Co film and a TiN film on an exposed silicon region defined by an insulating region formed on the surface of a semiconductor substrate.

In the above manner, a semiconductor device with electrodes having a sufficiently low sheet resistance can be formed even if the gate electrode has a short gate length.

According to another aspect of the present invention, there is provided a method of manufacturing a semiconductor device including the steps of: forming a field oxide film on the surface of a silicon (Si) substrate for element isolation; implanting ions in the surface region of the Si substrate defined by the field oxide film and forming a conductive silicon region; depositing a Co film on the Si substrate under the condition the Si surface adjacent to the field oxide film is exposed; heating the Si substrate under the conditions of a certain time period and a certain temperature that the Co film reacts with the conductive silicon region for silicidation to form Co silicide, but not to form $CoSi_2$; removing an unreacted Co film; and subjecting the Si substrate to another heat treatment and changing the Co silicide to $CoSi_2$.

The inventors have found a phenomenon that if a Co film formed on the surface of a silicon substrate including a small active silicon region defined by a field oxide film is silicidated, the silicide film on the small active silicon region creeps up along the field oxide film.

The self alignment property of a salicide film is reduced by such a creep-up phenomenon. If element separation is conducted by a narrow field oxide film, there is a great danger of short-circuit between adjacent elements.

According to the results of experiments made by the inventors, a creep-up of a silicide film along a field oxide film occurs under the conditions where $CoSi_2$ is formed. This creep-up can be prevented by dividing a cobalt silicide forming process into two steps. At the primary or first heat treatment it is controlled not to form $CoSi_2$. Thereafter, the second heat treatment is done to form $CoSi_2$ after removing an unreacted Co film.

If a silicidation reaction is performed with a Co film covered with a TiN film, it is possible to maintain a good condition of a Co film surface after the silicidation reaction. By performing the first silicidation reaction under the predetermined conditions, a good final silicide film can be formed.

If an unreacted Co film is removed after the first silicidation reaction, there is no Co source so that the advancement of the second silicidation reaction can be controlled. If the unreacted Co film is removed by mixed solution of sulfuric acid and hydrogen peroxide, adverse affects upon the underlying surface can be alleviated. Even if a great quantity of As is doped in the Si surface, there occurs no problem on the surface of the processed substrate. The unreacted Co film may be removed by mixed solution of hydrochloric acid and hydrogen peroxide if a predetermined condition is satisfied.

In the above manner, it is possible to form a low resistance Co silicide film on a fine Si surface defined by a field oxide film. It is therefore possible to manufacture a high performance, high integration semiconductor circuit device.

Other objects, features, and advantages of the invention will become more apparent from the following description taken in connection with the accompanying drawings.

BRIEF DESCRIPTION OF THE DRAWINGS

FIG. 2 is a graph showing measured resistances of samples manufactured by the method explained with FIGS. 1A to 1F.

FIG. 5 is a table showing performances of salicide electrodes relative to an As ion dose used for forming source/drain regions.

FIG. 9 is a graph showing the experiment results of other samples formed by preparatory experiments.

FIG. 11 is a graph showing the experiment results of other samples formed by preparatory experiments.

FIG. 18 is a table explaining a dependency of the performance of contacts upon a first anneal temperature and a doped arsenic concentration.

FIG. 19 is a table explaining a change in a surface sheet resistance with a first anneal condition.

FIG. 21 is a table showing the results of ESCA of sample surfaces having different first anneal conditions.

FIG. 24 is a table showing a first anneal temperature dependency of a sheet resistance on an As doped Si substrate.

DETAILED DESCRIPTION OF THE PREFERRED EMBODIMENTS

An SRAM device is used as an example of applications of salicide films to semiconductor devices. An SRAM device is used merely for the convenience of description, and the invention is not limited only to SRAM devices.

Figure 35A:
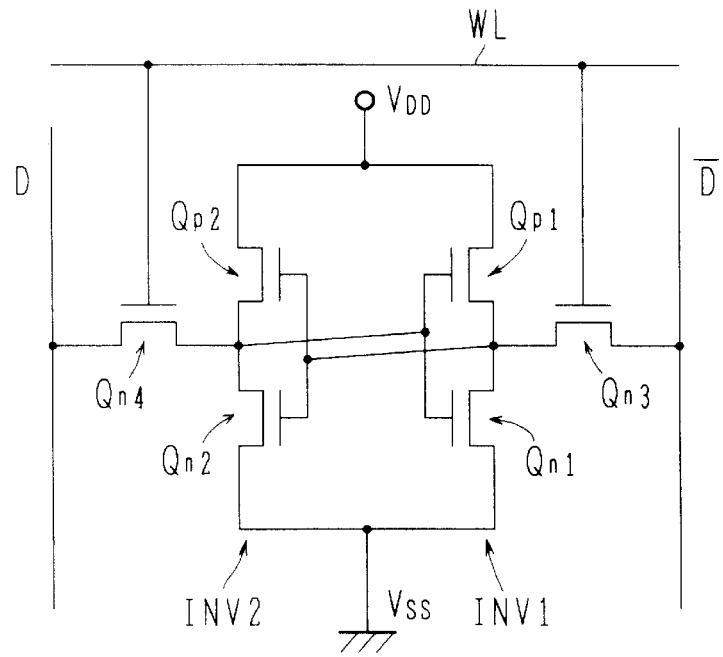
FIGS. 35A and 35B are an equivalent circuit diagram of an SRAM cell and a plan view showing an example of the layout of SRAM cells on an Si substrate surface.
Figure 35B:
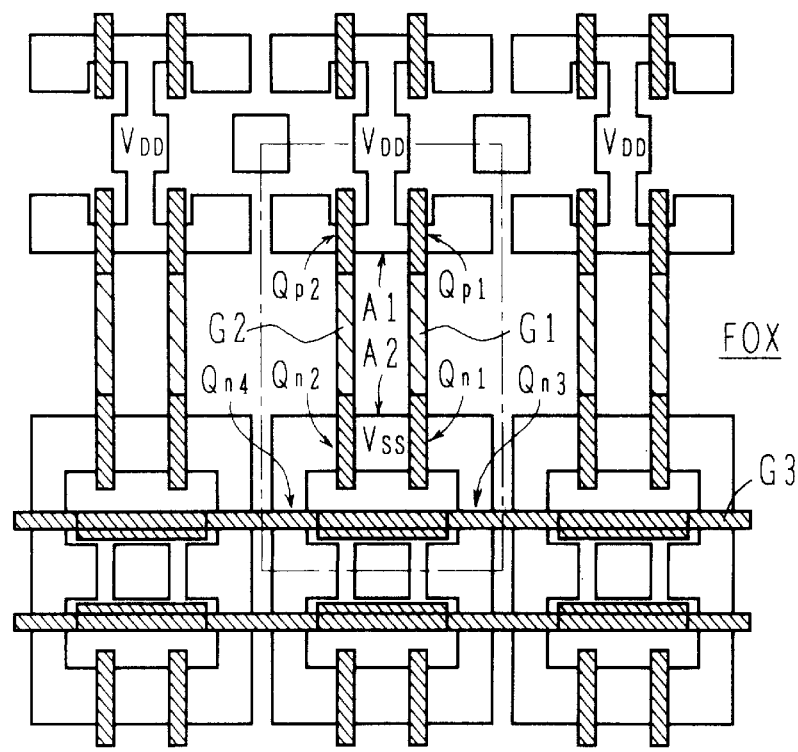

FIG. 35A is an equivalent circuit diagram of an SRAM cell, and FIG. 35B shows an example of the layout of SRAM cells on a semiconductor wafer.

Referring to FIG. 35A, a first inverter circuit INV1 is constituted by a serial circuit of a p-channel MOS transistor Qp1 and an n-channel MOS transistor Qn1.

Similarly, a second inverter circuit INV2 is constituted by a serial circuit of a p-channel MOS transistor Qp2 and an n-channel MOS transistor Qn2. The inverter circuits INV1 and INV2 are connected in parallel between power source voltages $V_{DD}$ and $V_{SS}$. An output point of the first inverter circuit INV1 is connected to the gate electrodes of the second inverter circuit INV2, and an output point of the second inverter circuit INV2 is connected to the gate electrodes of the first inverter circuit INV1.

A transfer gate of an n-channel MOS transistor Qn3 is connected between the output point of the inverter circuit INV1 and a bit line $\overline{D}$. Similarly, a transfer gate of an n-channel MOS transistor Qn4 is connected between the output point of the inverter circuit INV2 and a bit line D. The gate electrodes of the transfer gate transistors Qn3 and Qn4 are connected to a word line. The p-channel transistors Qp serving as the loads in the inverter circuits INV may be replaced by high resistance elements.

FIG. 35B shows an example of the layout of an SRAM circuit such as shown in FIG. 35A and formed on a semiconductor wafer surface. Active regions A1 and A2 are defined on the semiconductor wafer surface, and the peripheries of the active regions A1 and A2 are surrounded by a field oxide film FOX. At the region surrounded by a broken line shown in FIG. 35B, one SRAM cell is formed. Adjacent SRAM cells are disposed in a head-to-head or tail-to-tail fashion in the column direction and use the same power source wiring $V_{DD}$ or $V_{SS}$. In the row direction, SRAM cells of the same structure are disposed in parallel.

Gate electrodes G1 and G2 traverse a partial area of an active region A1 and a partial area of an active region A2. The p-channel MOS transistor Qp1 is formed at a partial area of the active region A1 under the gate electrode G1, and the other p-channel MOS transistor Qp2 is formed at a partial area of the active region A1 under the gate electrode G2. The n-channel MOS transistor Qn1 is formed at a partial area of the active region A2 under the gate electrode G1, and the other n-channel MOS transistor Qn2 is formed at a partial area of the active region A2 under the gate electrode G2.

The other gate electrode G3 is formed at the area lower than the active region A2 as viewed in FIG. 35B. The n-channel transfer gate transistors Qn3 and Qn4 are formed at partial areas under the gate electrode G3 which also forms the word line WL shown in FIG. 35A.

With the above structure, each gate electrode G1 or G2 extends over the active regions A1 and A2 on to the field oxide film FOX. A gate oxide film is being formed under each gate electrode at the active region.

After the side walls of each gate electrode are covered with side wall insulating films, source/drain electrodes are formed on the active regions on opposite sides of the gate electrode.

If inverters are not cross-wired but are cascade-wired and an output is fed back to an input, a ring oscillator is formed.

Figures 7A, 7B:
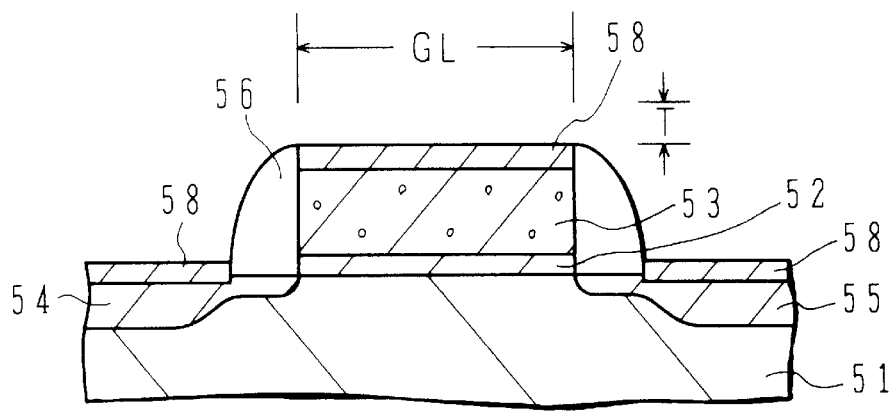
FIGS. 7A and 7B are a cross sectional view showing the structure of samples used for preparatory experiments and a table explaining manufacturing process conditions.

Next, preliminary experiments made by the present inventors will be described. FIGS. 7A shows the structure of samples used by the preliminary experiments, and FIG. 7B is a table of silicidation conditions.

FIG. 7A is a schematic diagram showing the main part of the structure of samples used by the preliminary experiments. A gate oxide film 52 was formed on the surface of a silicon substrate 51 by thermal oxidation, and an amorphous silicon layer 53 was formed on the gate oxide film 52 by CVD. The amorphous silicon layer 53 and underlying gate oxide film 52 were patterned to have a gate length of GL.

The insulated gate structure formed in the above processes was then covered with a silicon nitride layer by CVD. The silicon nitride layer was etched to form side wall insulating regions 56 by reactive ion etching (RIE).

Thereafter, for example, arsenic ions were implanted from the surface of the device to make the amorphous silicon layer 53 conductive to form a gate electrode and to form source/drain regions 54 and 55. An LDD (lightly doped drain) structure was formed by light ion implantation prior to forming the side wall insulating regions.

Thereafter, a predetermined metal layer was deposited on the device surface to a thickness of T by sputtering. The metal layer is silicidated with underlying silicon to form silicide electrode 58. This silicidation reaction progresses only at the region where underlying silicon is exposed. Therefore, this reaction is a self-aligned salicide process. Thereafter, the unreacted metal layer was removed.

Three metals including Ti, Pt, and Co shown in FIG. 7B were used for salicide reaction. The thickness T of the metal layer was set to 30 nm for Ti, 10 to 30 nm for Pt, and 18 nm for Co. The Ti salicide reaction was performed by a two-stage anneal including a first anneal for silicide reaction and a second anneal for phase transition. The first anneal was performed for 30 seconds at 675° C., and the second anneal was performed for 30 seconds at 800° C.

Wash-out was performed between the first and second anneal processes in order to remove the unreacted metal layer. To remove the unreacted Ti, the sample was immersed in mixed solution of $NH_4OH:H_2O_2:H_2O$ (1:1:2) for 90 seconds at 65° C.

For a Pt salicide reaction, anneal was performed only once for 30 seconds at 600° C. After this first anneal, the residual metal layer was removed by using $HNO_3+HCl$ for 60 seconds at 80° C.

For a Co salicide reaction, anneal was performed only once for 30 seconds at 700 to 750° C. After this first anneal, the unreacted metal was removed by immersing it in solution of HCl:H$_2$O$_2$=3:1 for about 3 minutes at a room temperature.

Samples formed in the above manner were used to measure the characteristics of salicide gate electrodes having different gate lengths.

Figure 8:
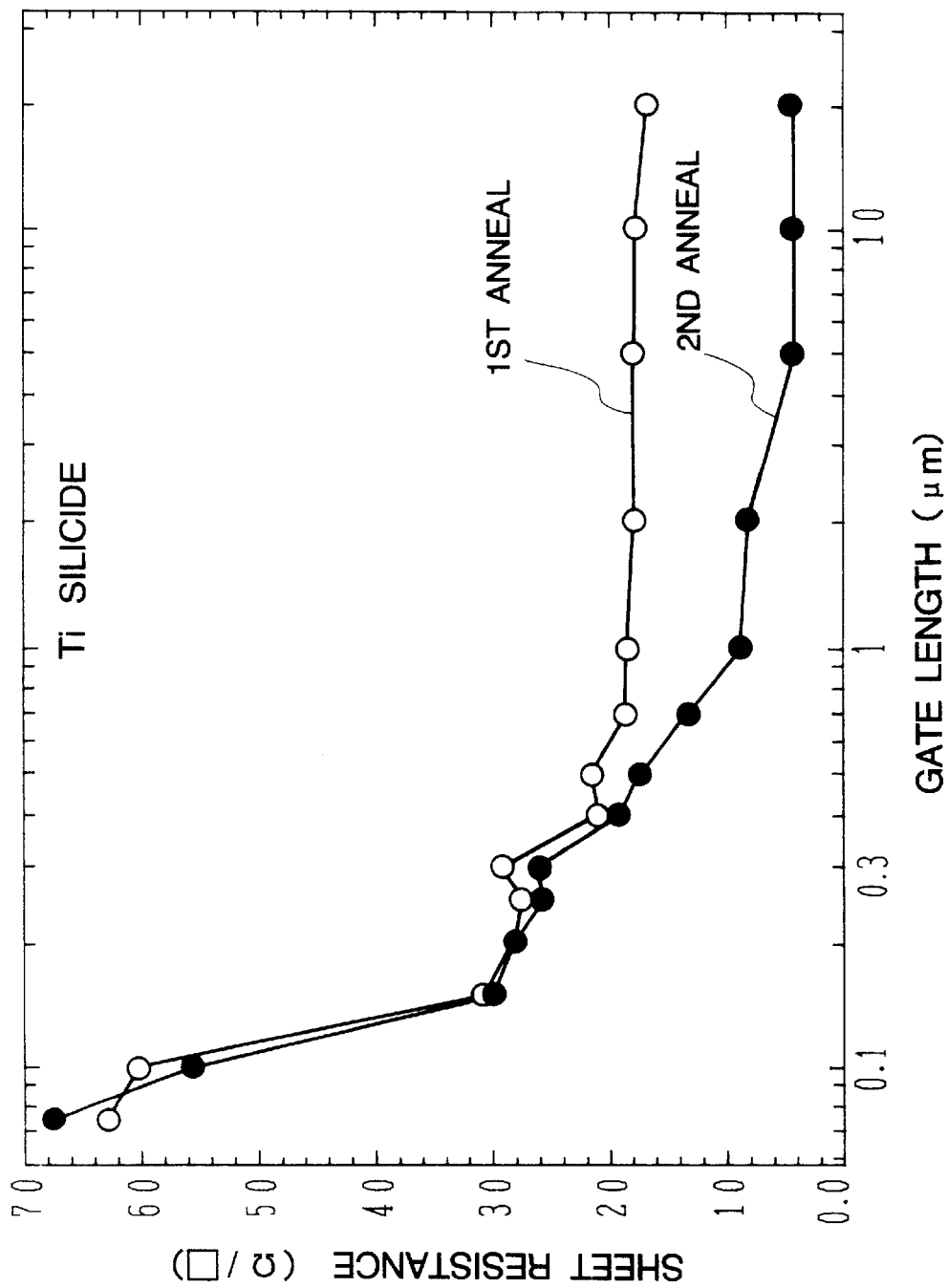
FIG. 8 is a graph showing the experiment results of samples formed by preparatory experiments.

FIG. 8 shows a gate length dependency of a sheet resistance of a Ti silicide gate electrode. In the range of a gate electrode length of about 2 μm or longer, the sheet resistance after the first anneal was about 20 Ω/□, and lowered after the second anneal to about 5 Ω/□. It is supposed that the first anneal forms silicide of C$_{49}$ phase and the second anneal changes C$_{49}$ phase to low resistance C$_{54}$ phase.

As the gate length is shortened from about 2 μm to about 0.4 μm, the sheet resistance after the second anneal no longer is reduced much although the sheet resistance after the first anneal did not increased not so much. It is supposed that as the gate length is shortened, the phase transition from C$_{49}$ to C$_{54}$ does not proceed sufficiently.

As the gate length is further shortened to 0.4 μm or less, particularly about 0.2 μm or less, the sheet resistance after the second anneal hardly changed from that after the first anneal. It is suggested that in the range of a gate length of 0.4 μm or less, particularly about 0.2 μm or less, the phase transition hardly advances.

The sheet resistance of samples having a gate length of 0.1 μm or less abruptly increased. This phenomenon can be supposed that grains of Ti silicide become separate and some electrical disconnection starts occurring.

Therefore, Ti silicide electrodes having a short gate length, particularly, a gate length shortened to 0.4 μm or less and further to about 0.1 μm are not suitable for gate electrodes requiring a low resistance.

FIG. 9 shows a sheet resistance of Pt silicide as a function of a gate length. The thicknesses of Pt layer were changed from 10 nm, 15 nm, 20 nm, and to 30 nm, and the sheet resistances of salicide gate electrodes were measured.

The sheet resistance of a Pt silicide electrode did not increase even down to a gate length of 0.1 μm or less, and realized a relatively low sheet resistance of 10 Ω/□. Pt silicide has an ample possibility of providing a sufficiently low resistance gate electrode even if it has a short gate length.

However, with the structure shown in FIG. 7A, silicide electrodes at source/drain regions are formed at the same time when the silicide layer of the gate electrode is formed. Accordingly, if Pt silicide is used, there occurs a problem of a large junction leak current at the source/drain regions.

Figure 10A:
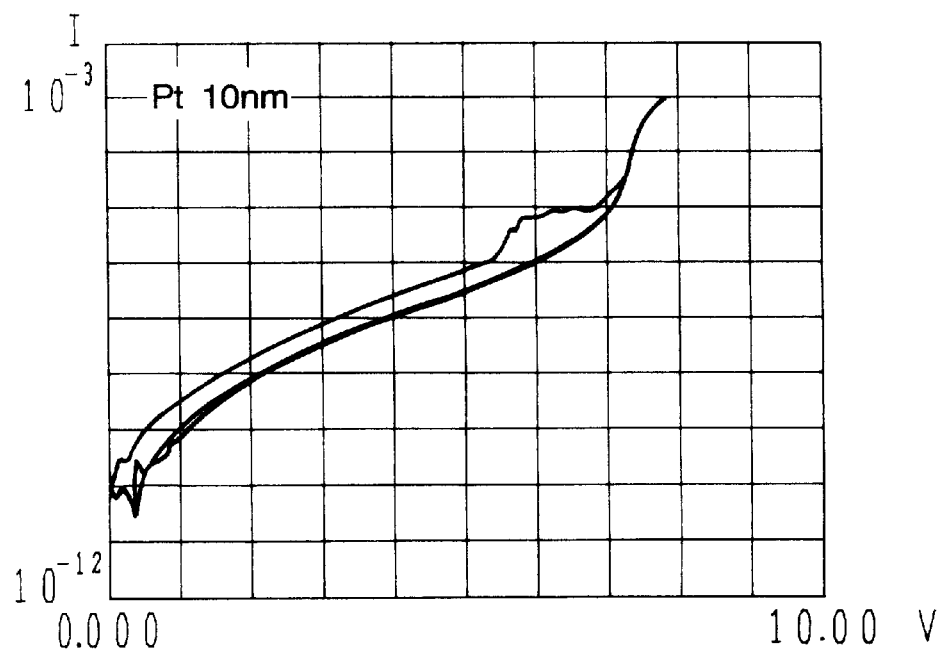
FIGS. 10A and 10B are graphs showing the experiment results of other samples formed by preparatory experiments.
Figure 10B:
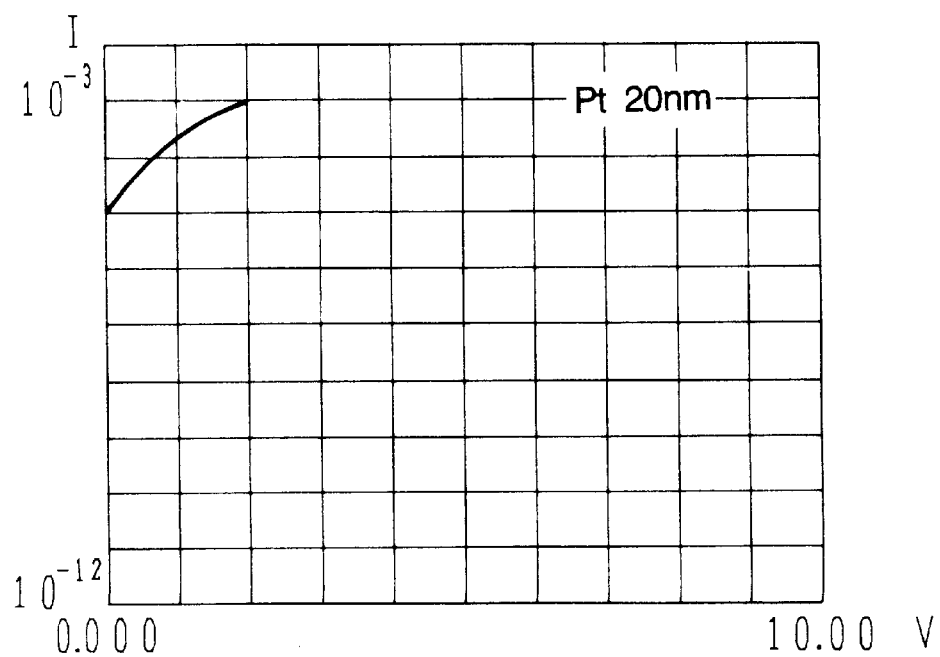

FIGS. 10A and 10B are graphs showing leak currents when Pt silicide is used. The source/drain regions were formed by implanting As ions at an acceleration voltage of 30 keV and a dose of 5×10$^{15}$ and annealing the samples for 10 minutes at 850° C. FIG. 10A shows a leak current when a Pt layer of 10 nm is deposited, and FIG. 10B shows a leak current when a Pt layer of 20 nm is deposited. As shown in FIG. 9, the sheet resistance lowers as the Pt layer becomes thick.

From the comparison between the graphs of FIGS. 10A and 10B, the leak current increased by five digits as the thickness of the Pt layer was changed from 10 nm to 20 nm. As the Pt layer is thickened to reduce a sheet resistance, the leak currents at the source/drain regions become large. It is therefore difficult to allow a practical use of Pt silicide electrodes.

This is because a Pt silicide resistivity of 28 to 35 μΩ·cm is larger than a Ti or Co silicide resistivity of 13 to 16 μΩ·cm and it becomes necessary to thicken a Pt silicide film in order to reduce its sheet resistance.

FIG. 11 shows a gate length dependency of a sheet resistance when Co silicide is used. A heat treatment for silicidation was performed for 30 minutes in an Ar atmosphere at 700° C. and 750° C. As the gate length shortened to 2 μm or less, the sheet resistance was abruptly increased, and in the range of a gate length of 0.3 μm or less, it took an extremely high value. It is difficult to realize a high performance, short channel transistor by a gate electrode having such a high sheet resistance.

The present inventors have checked the above experimental results and rigorously studied in order to realize a gate structure of Ti silicide which is most expected to become suitable material. However, a sheet resistance of 10 Ω/□ or lower was not obtained when the gate length of 0.25 μm or shorter was used for the Ti silicide gate electrode.

FIGS. 1A to 1F are schematic cross sectional views explaining a method of manufacturing a semiconductor device according to an embodiment of the invention.

Figure 1A:
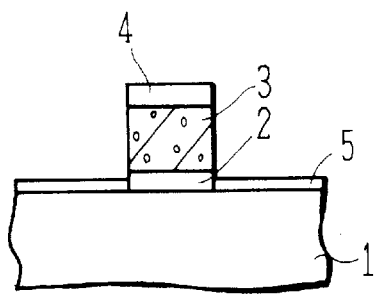
FIGS. 1A to 1F are cross sectional views explaining a method of manufacturing a semiconductor device according to an embodiment of the invention.

As shown in FIG. 1A, a gate oxide film 2 is formed on a silicon substrate 1 to a thickness of about 5 nm by thermal oxidation. An amorphous silicon layer 3 is deposited on the gate oxide film 2 to a thickness of about 160 nm by CVD. Preferably, BF$_2$ ions are implanted in the amorphous silicon layer 3 for a p-channel MOSFET or P ions are implanted for an n-channel MOSFET. A cap oxide film 4 is deposited to a thickness of about 50 nm on the amorphous silicon layer 3.

Thereafter, a photoresist mask is formed on the cap oxide film 4. By using this mask, the device is subjected to RIE to obtain a patterned structure of the gate oxide film 2, amorphous silicon layer 3, and cap oxide film 4 as shown in FIG. 1A. Thereafter, the surface of the silicon substrate 1 is lightly oxidated to form an oxide film 5 having a thickness of about 5 nm.

If an n-channel MOS transistor is to be formed, p-type silicon regions are preliminarily formed in the substrate, and As ions are implanted at an acceleration voltage of 10 keV and at a dose of 4×10$^{19}$ cm$^{-2}$. If a p-type MOS transistor is to be formed, n-type silicon regions are preliminarily formed and BF$_2$ ions are implanted at an acceleration voltage of 10 keV and at a dose of 1×10$^{14}$ cm$^{-2}$. In the case of a CMOS circuit, during the ion implantation, the regions of transistors of the opposite type conductivity are covered with a resist mask.

Thereafter, a silicon nitride film is deposited on the device surface to a thickness of about 70 nm by CVD. The device is anisotropically etched by RIE to form side wall insulating regions 6 as shown in FIG. 1B. Thereafter, the oxide film 5 left on the silicon surface is etched and a new oxide film 5 is formed.

If an n-channel MOS transistor is to be formed, As ions are implanted at an acceleration voltage of 30 keV and at a dose of 3×10$^{15}$ cm$^{-2}$. If a p-type MOS transistor is to be formed, BF$_2$ ions are implanted at an acceleration voltage of 20 keV and at a dose of 5×10$^{15}$ cm$^{-2}$.

Thereafter, the device is annealed for 20 minutes at 850° C. under an N$_2$ atmosphere to activate doped impurity ions. This process changes the amorphous silicon layer 3 to a conductive gate electrode 3 and forms source/drain regions 7 and 8 on opposite sides of the gate electrode.

Figure 1D:
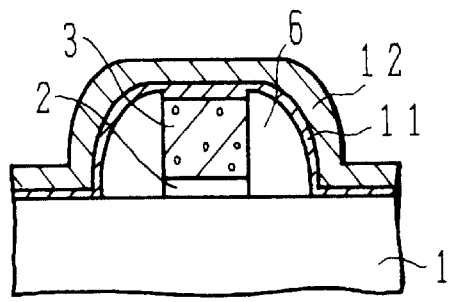
Figure 1B:
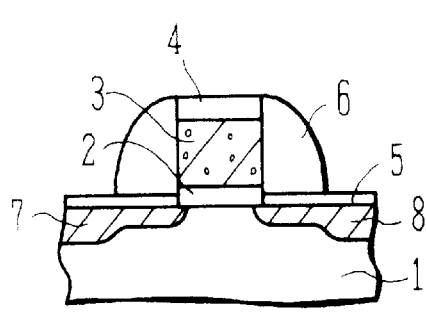
Figure 1E:
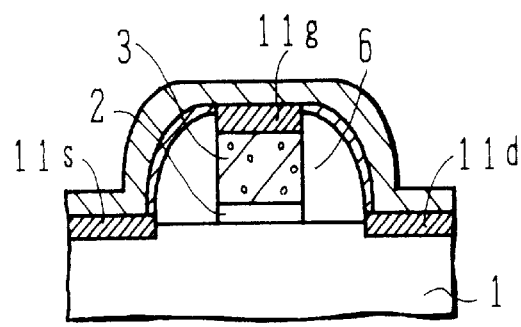
Figure 1C:
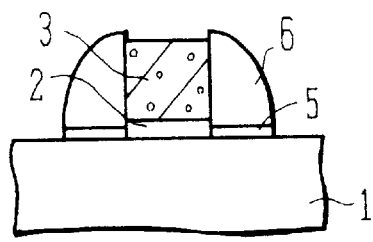

Next, as shown in FIG. 1C, the semiconductor substrate is immersed in dilute HF aqueous solution to remove the cap oxide film 4 and the oxide film 5 on the surface of the silicon substrate.

As shown in FIG. 1D, a Co film 11 is deposited on the surface of the silicon substrate to a thickness of about 10 nm by sputtering, and a TiN film 12 is deposited on the Co film 11 to a thickness of about 20 nm.

Next, as shown in FIG. 1E, the device is subjected to the first anneal for about 30 minutes at 450° C. under an Ar atmosphere to perform a silicidation reaction which advances only at the region where Co contacts with silicon. Therefore, this reaction is a self-aligned silicidation reaction. In the above manner, a salicide electrode 11g is formed on the gate electrode 3, and salicide electrodes 11s and 11d are formed on the source/drain regions 7 and 8.

Figure 1F:
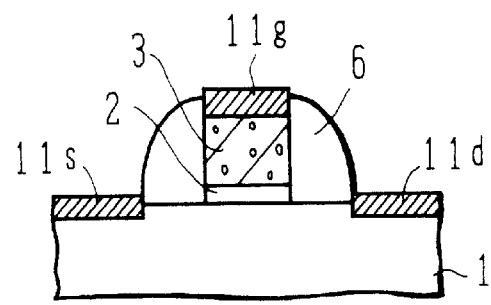

As shown in FIG. 1F, the residual TiN film 12 is removed by immersing the device in solution of $NH_4OH:H_2O_2:H_2O=$ 1:1:2 for 90 seconds at 65° C. Next, the device is immersed in solution of $HCl:H_2O_2=3:1$ for 3 minutes at 750° C. to remove the unreacted Co film 11 to obtain the structure shown in FIG. 1F. Thereafter, the second anneal is performed for 30 seconds at 750° C. in an Ar atmosphere to lower the resistance of the Co silicide.

In the above manner, a MOS transistor with low resistance salicide electrodes can be formed.

Samples having different gate lengths were formed by the above processes, and the sheet resistance of each gate electrode was measured. FIG. 2 is a graph showing the measurement results of sheet resistances. The abscissa represents a gate length in unit of $\mu$m, and the ordinate represents a sheet resistance in unit of $\Omega/\square$. The solid line shows the measurement results of the gate electrodes of n-channel MOS transistors, and the broken line shows the measurement results of the gate electrodes of p-channel MOS transistors.

In the case of p-channel MOS transistors, a low sheet resistance in the order of 5 to 6 $\Omega/\square$ was obtained down to a gate length of 0.1 $\mu$m or shorter. In the case of n-channel MOS transistors, the sheet resistance gradually increased as the gate length shortened to 1 $\mu$m or less. This is supposed that the finished dimension of each gate electrode becomes narrower than the designed value. The measured sheet resistance of 9 $\Omega/\square$ is supposed to be actually 5 $\Omega/\square$ similar to the n-channel. The sheet resistance of 9 $\Omega/\square$ at the gate length of 0.1 $\mu$m is a value practically usable.

From the comparison of the measurement results shown in FIG. 11, it can be understood that this embodiment provides quite an excellent sheet resistance of a gate electrode for a short channel MOS transistor. In order to trace this cause, SIMS (secondary ion mass spectroscopy) was performed.

Figure 3B:
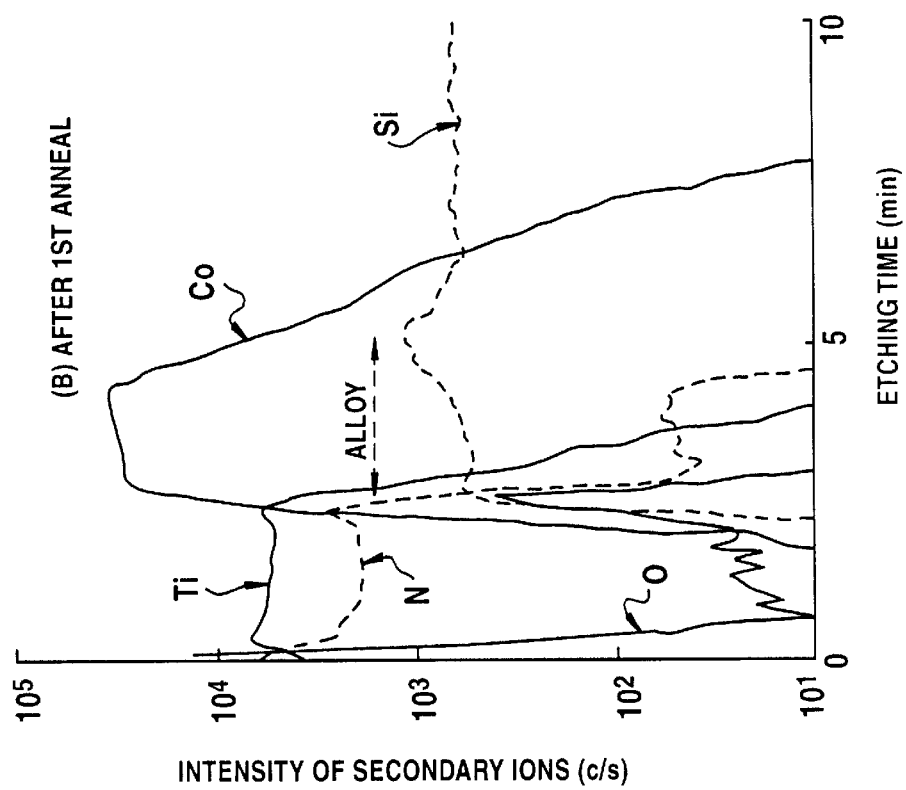
FIG. 3 is a graph showing the results of SIMS of a semiconductor device manufactured by the method explained with FIGS. 1A to 1F.
Figure 3A:
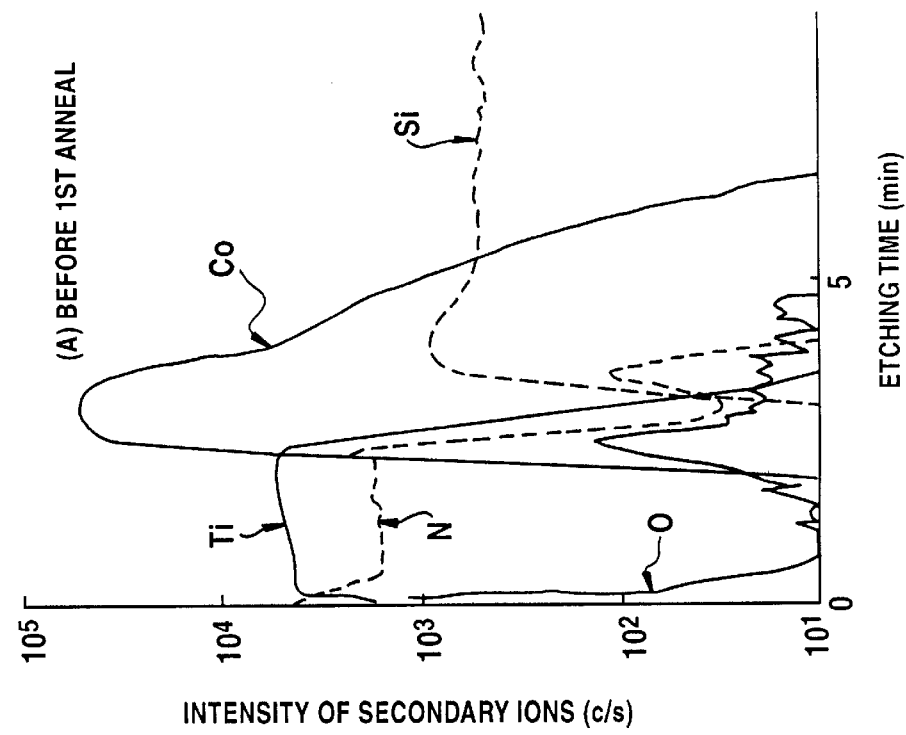

FIG. 3 is a graph showing SIMS results of a sample manufactured by the embodiment method. In FIG. 3, the abscissa represents an etching time corresponding to a depth in unit of minute, and the ordinate represents a secondary ion intensity in unit of count/sec. The left graph (A) of FIG. 3 stands for a sample state before the first anneal, and the right graph (B) of FIG. 3 stands for the sample after the first anneal.

At the first anneal, it can be seen that a reaction between Co and Si advances and Co silicide is formed. An element O is not intentionally introduced, but it distributes near on the substrate surface.

Figure 4B:
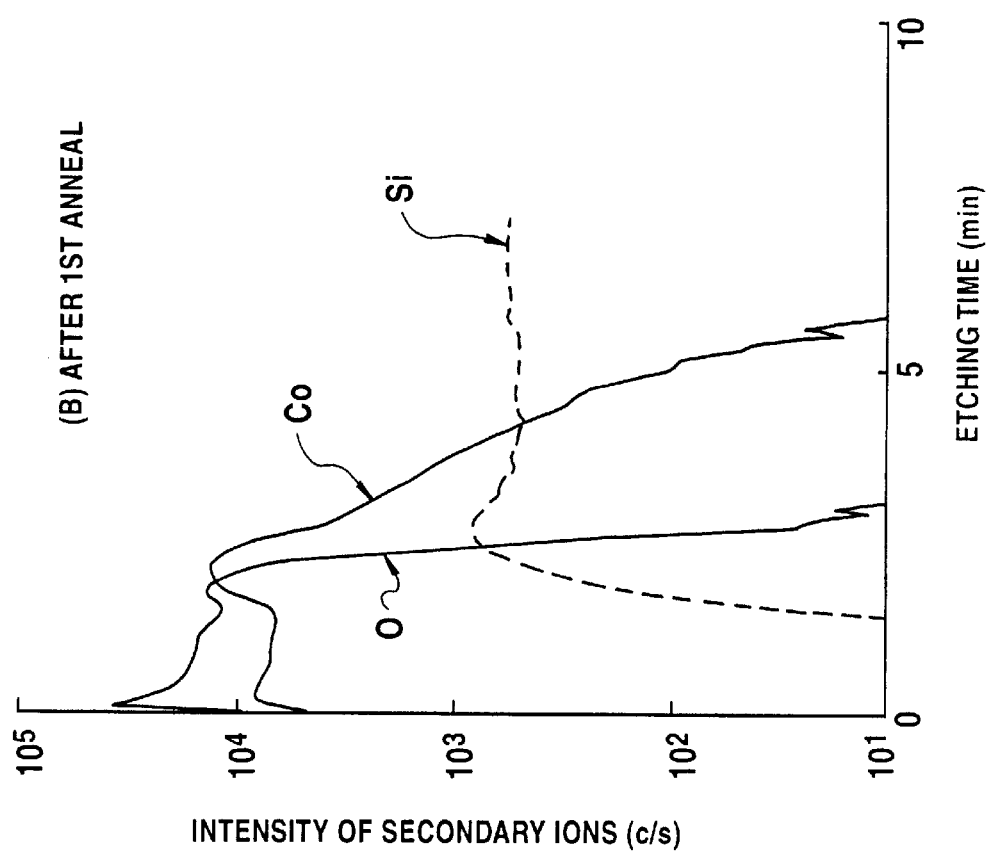
FIG. 4 is a graph showing the results of SIMS of a comparison sample of a semiconductor device.
Figure 4A:
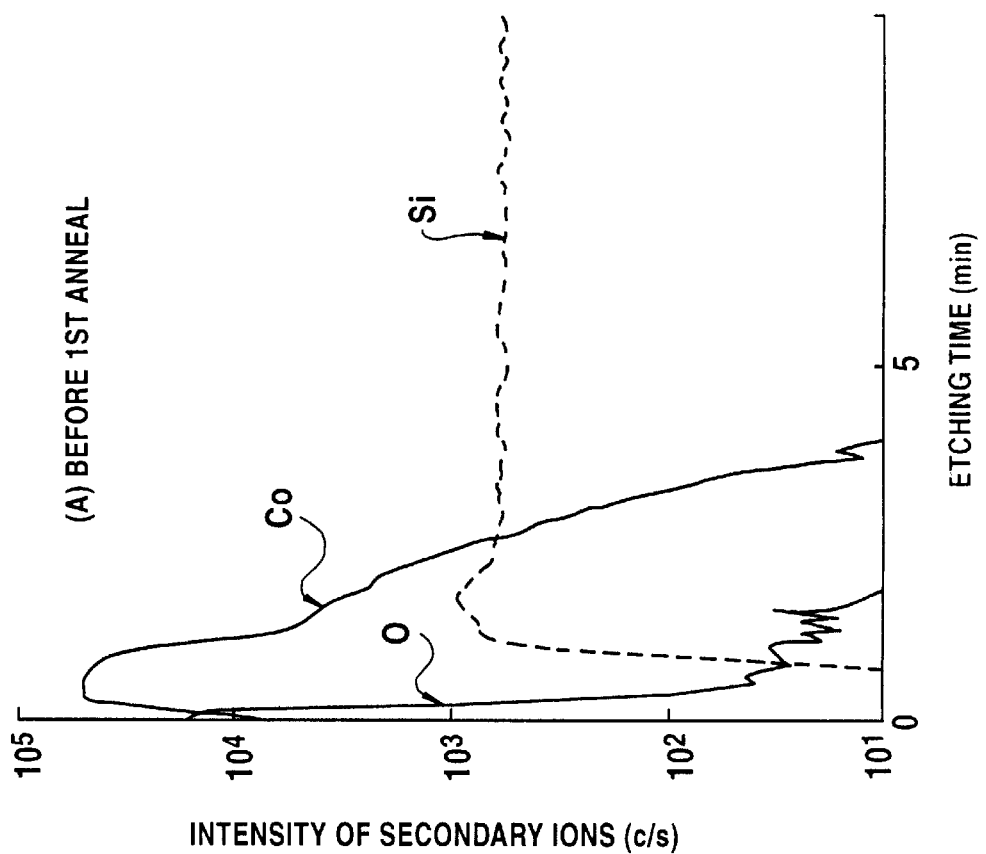

FIG. 4 shows the results of SIMS of the reference samples whose sheet resistances are shown in FIG. 11. Similar to FIG. 3, the abscissa represents an etching time in unit of minute, and the ordinate represents a secondary ion intensity in unit of count/sec. The left graph (A) of FIG. 4 stands for a sample before the first anneal, and the right graph (B) of FIG. 4 stands for a sample after the first anneal.

As distinctively shown in FIG. 4, O is locally distributed only near at the device surface before the first anneal, and after the first anneal it enters deep into the device. It is supposed that invasion of O is a cause of lowering a sheet resistance.

It has been found that a low sheet resistance can be realized by performing a salicide reaction after covering the upper surface of a Co layer with a TiN layer.

A phenomenon has been found in which if a doped amount of As ions is increased in order to lower the contact resistance of source/drain regions of n-channel MOS transistor, the sheet resistance does not lower but increases and the silicide film is peeled off like a sheet of paper.

FIG. 5 is a table showing an As ion doping dependency of a sheet resistance under various first anneal conditions. In this table, the first anneal conditions are changed in the row direction, and the As ion doping levels are changed in the column direction. An acceleration voltage of As ions was set to 30 keV.

A sheet resistance was measured after the first anneal was performed and the residual metal was washed out. The value of each sheet resistance is shown at the upper right of each cell. After the wash out, the second anneal was performed for 30 seconds at 750° C. The value of each sheet resistance after the second anneal is shown at the lower right of each cell.

In the table, a circle symbol indicates that a good electrode with a sufficiently low resistance was obtained, and a triangle symbol indicates that although a sheet resistance was low, the sample has a whitish surface after the wash-out. A cross symbol indicates either a high sheet resistance or a peel-off of a salicide film. It is supposed that although CoSi and $CoSi_2$ are essentially insoluble in $HCl+H_2O_2$, they changed their properties from some unknown reasons.

It can be understood from this table that a relatively low temperature of about 450° C. is more preferable than a relatively high temperature of 600 to 750° C. at the first anneal. It can also be understood that at the As ion dose of $5\times10^{15}$ or higher, a good silicide electrode cannot be obtained both at relatively high and low temperatures at the first anneal.

It is necessary therefore to perform As ion implantation for the source/drain regions of n-channel MOS transistors at a dose less than $5\times10^{15}$ cm$^{-2}$.

As the gate length is shortened to about 0.3 $\mu$m or less, the depths of source/drain regions become about 100 nm or shallower. If a Co film is deposited on such shallow source/drain regions to a thickness in excess of 15 nm, there is a possibility of destruction of junctions at the salicide process.

Figure 6A:
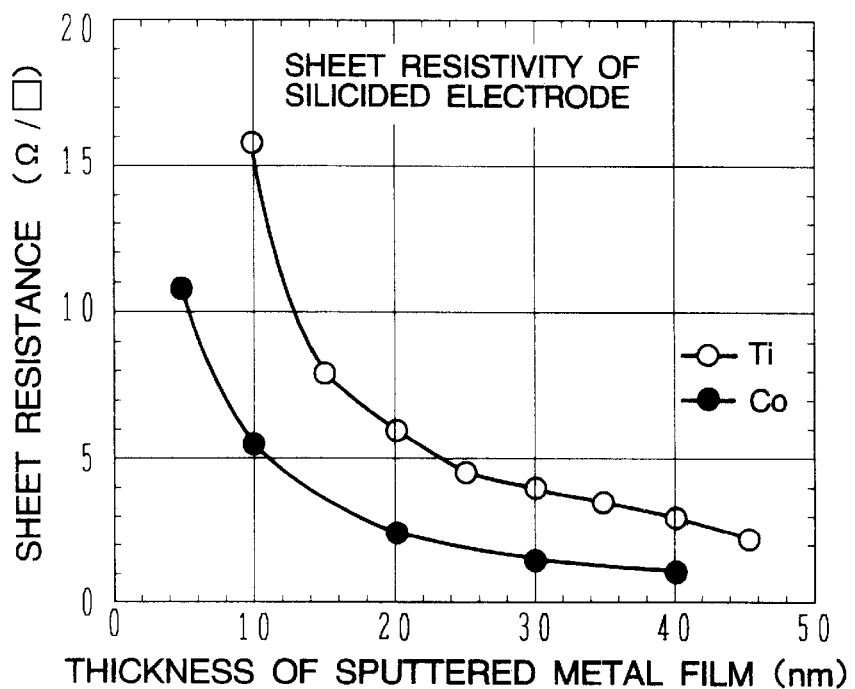
FIGS. 6A and 6B are a graph showing a change in a sheet resistance relative to a sputtered Co film thickness and a change in a sheet resistance relative to a comparison sample, and a graph showing a delay time of a ring oscillator made of CMOS transistors manufactured by the method explained with FIGS. 1A to 1F and a delay time of a ring oscillator made of comparison sample CMOS transistors.

FIG. 6A shows a relationship between a thickness (abscissa) of a sputtered film and a sheet resistance after silicidation. Sheet resistances are of the samples formed by depositing a Co film to a predetermined thickness and by rapid thermal anneal (RTA) for 30 seconds at about 700° C. under an Ar atmosphere. For the comparison purpose, a change in a sheet resistance with a thickness of a Ti film was also checked.

A Ti film of a predetermined thickness was deposited by sputtering, the first anneal was performed by RTA at about 675° C. under an atmosphere of $Ar+N_2$, and after the wash-out, the second anneal was performed by RTA at about 800° C. in an Ar atmosphere. The measured sheet resistances of the Co silicide film were as a whole lower than those of the Ti silicide film.

As seen from FIG. 6A, as the thickness of a Co film became less than 5 nm, the sheet resistance increased. It is therefore preferable to set the thickness of a deposited Co film to a range of 5 to 15 nm. The final thickness of the Co salicide electrode was about 3.5 times the thickness of the deposited Co film.

Also as the gate length was shortened to 0.5 µm or less, similar phenomena were observed. In this case, it is preferable to set the thickness of the Co film to a range of 5 to 20 nm.

Even if the TiN film covers the Co film and oxygen entering from the device surface is intercepted, there are oxygen atoms originally attached to the Si surface in some cases. If the Si surface is contaminated by oxygen, it becomes difficult in some cases to form a good Co salicide electrode.

In order to deal with such situation, it is preferable to form a thin Ti film before the deposition of a Co film. Specifically, a three-layer lamination of Ti/Co/TiN is formed on the Si surface and subjected to silicidation.

The Ti film under the Co film reduces an oxide film, if any, on the Si surface, so that silicidation advances properly. In addition, the Co salicide on the Ti film grows epitaxially and the surface is flattened, reducing a junction leak.

Figure 6B:
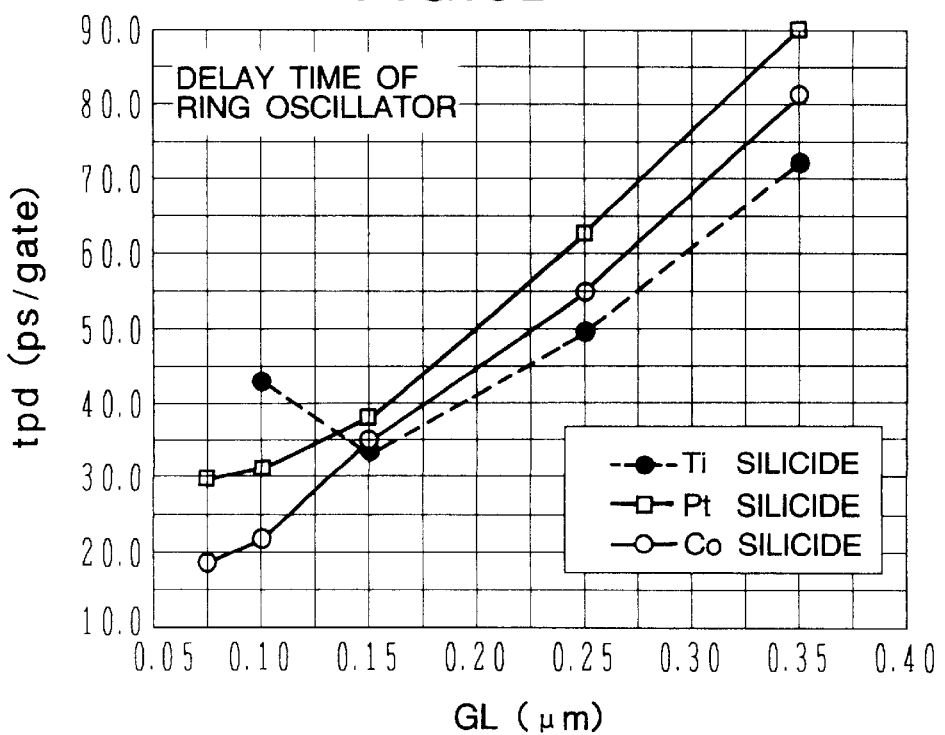

FIG. 6B shows the measurement results of delay times of CMOS ring oscillators using Ti salicide, Pt salicide, and Co salicide made from a Co film covered with a TiN layer. The abscissa represent a gate length GL in unit of µm, and the ordinate represents a delay time tpd per gate in unit of pico-second.

In the case of a ring oscillator with Ti salicide, the gate resistance abnormally increased to 40 Ω/□ as the gate length was shortened to 0.1 µm or less (refer to FIG. 8). Therefore, the speed of CMOS operation was abruptly lowered.

In the case of a ring oscillator with Pt salicide, the thickness of a Pt film was thinned so as to avoid leak at the junction, the gate resistance was as a whole about 40 Ω/□, and the CMOS operation speed was lowered.

In the case of a ring oscillator with TiN capped Co salicide, the gate resistance was as low as about 5 Ω/□ irrespective of the gate length and could be maintained generally constant, and the CMOS operation speed rose monotonously as the gate length was shortened. A delay time per gate was 21 pico-seconds at the gate length of 0.1 µm, and 18 pico-seconds at the gate length of 0.75 µm.

A whitish silicide film or its peel-off occurring when As is doped greatly has been described in connection with the table shown in FIG. 5. The present inventors have studied and made experiments in order to clarify this phenomenon.

As ions were implanted over the whole surface of an Si wafer at a dose of $5 \times 10^{15}$ cm$^{-2}$ and at an acceleration energy of 30 keV. A Co film having a thickness of about 10 nm and a TiN film having a thickness of about 20 nm were deposited on the silicon wafer by sputtering. The wafer was annealed for 30 seconds at about 650° C. by RTA with lamp heating. Thereafter, the TiN film was removed by $NH_4OH+H_2O_2+H_2O$, and the residual Co film was removed by $HCl+H_2O_2$.

Figure 12:
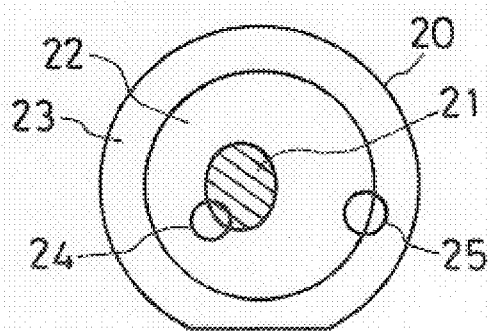
FIG. 12 is a schematic plan view of an Si wafer used for experiments.

FIG. 12 is a schematic diagram showing the surface of a sample wafer formed in the manner described above. At the central area 21 of the Si wafer 20, the silicide film was peeled off, and the Si surface was exposed. At the outer area around the central area 21, there is a whitish silicide film region 22. At the peripheral area of the wafer 20, there is a normal silicide film 23 without a thickened whitish film. Electron microscopic photographs of a boundary region between the central Si substrate exposed area 21 and thick whitish silicide area 22 and a boundary region between the thick whitish area 22 and normal area 23 will be explained.

Figure 13:
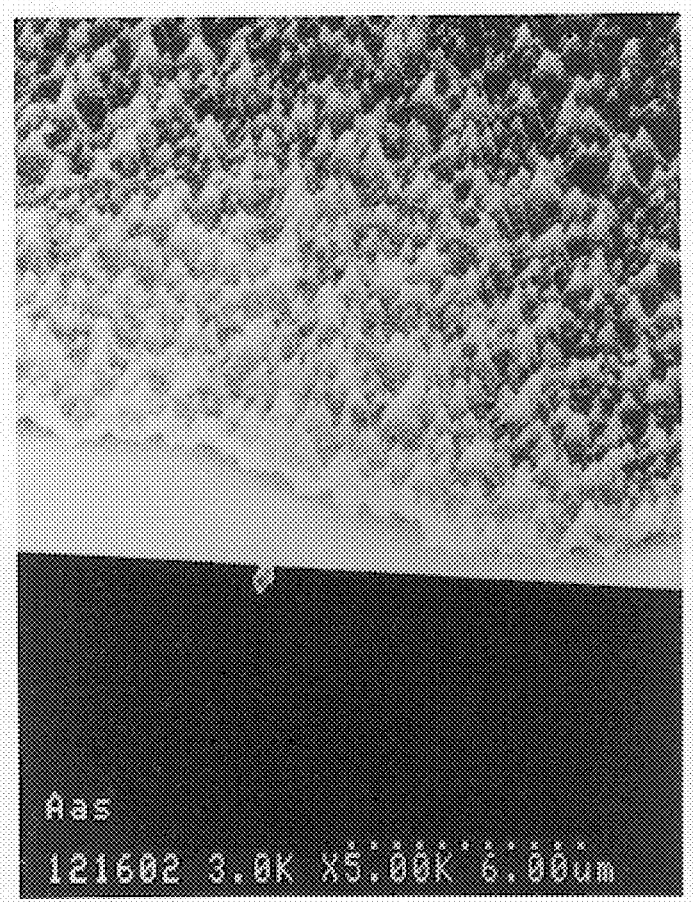
FIG. 13 is an electron microscopic photograph showing the structure of a sample surface.

FIG. 13 is a photograph of the inner boundary region 24 magnified by 5000.

Figure 14:
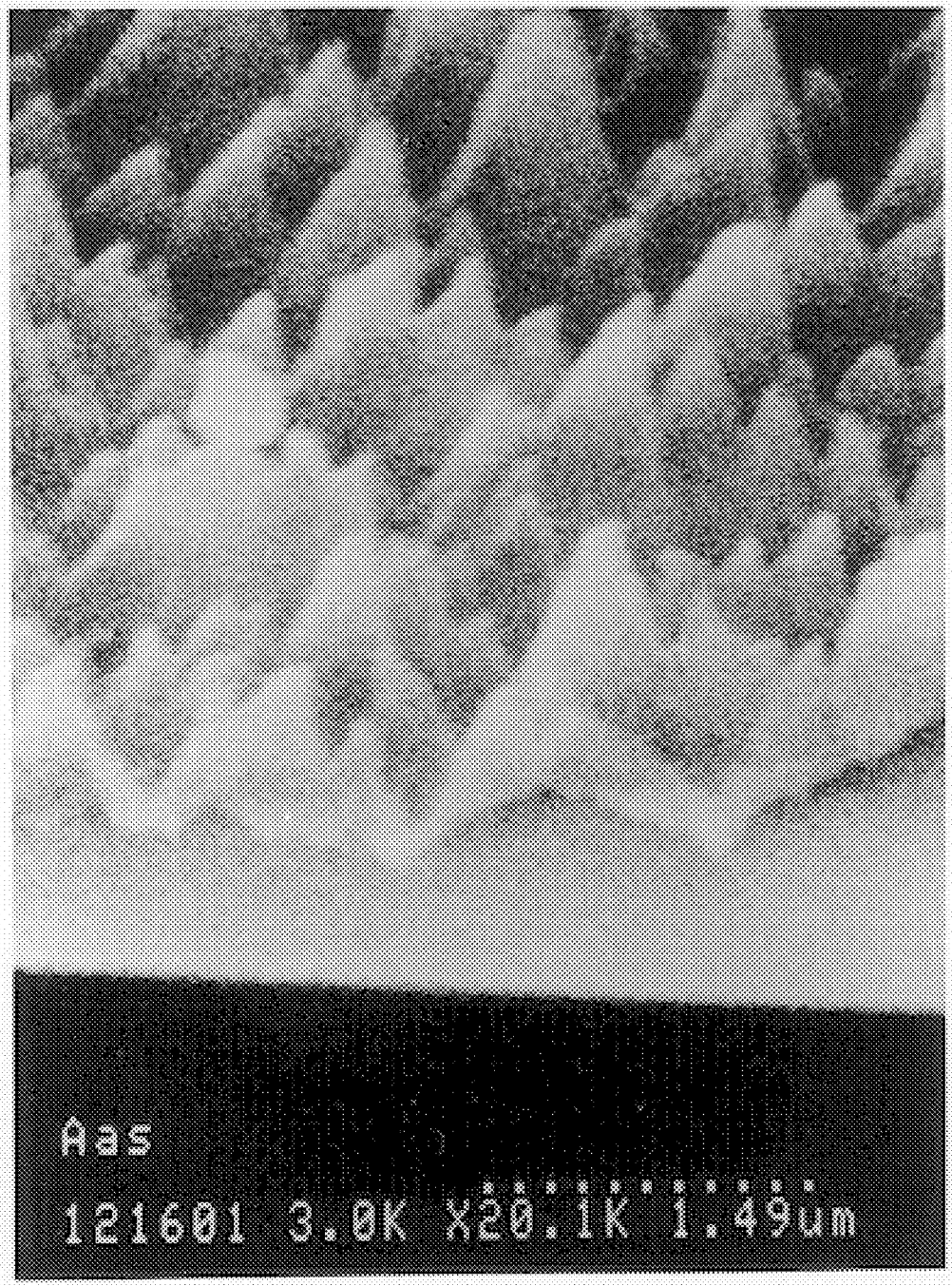
FIG. 14 is an electron microscopic photograph showing the structure of another sample surface.

FIG. 14 is a photograph of the same region 24 with a magnification factor of 20000.

As seen from these photographs, a number of projections of generally a cone shape are formed in the thick whitish area at a high density. The area without no observed projection at the lower portion of the photograph is a Si substrate surface with the silicide film being peeled off.

Figure 15:
FIG. 15 is an electron microscopic photograph showing the structure of another sample surface.

FIG. 15 is a scanning electron microscopic photograph of the boundary region 25 between the thick whitish area and normal area at a magnification factor of 5000.

Figure 16:
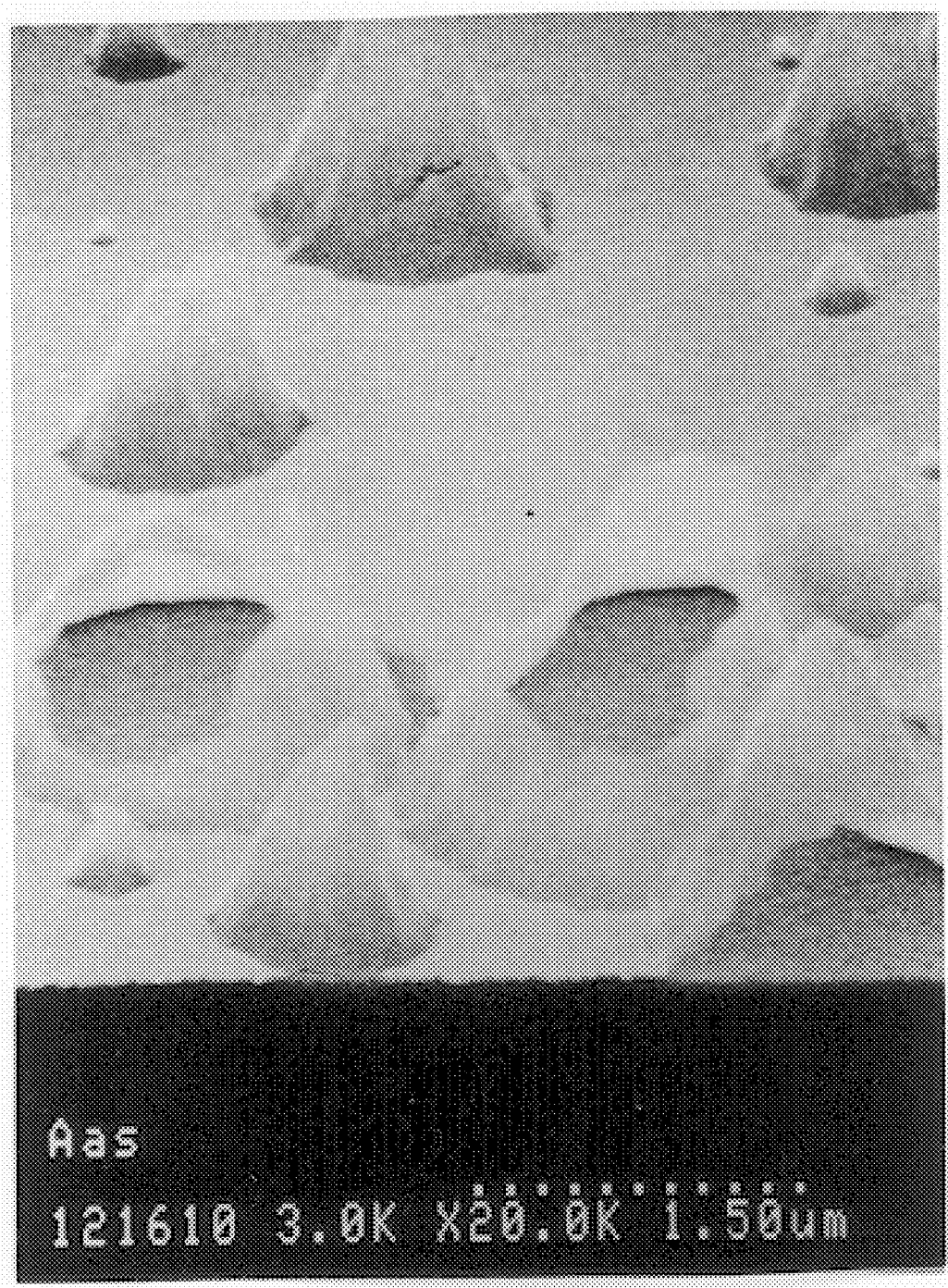
FIG. 16 is an electron microscopic photograph showing the structure of another sample surface.

FIG. 16 is a photograph of the same region magnified by 20000.

At this boundary, the projections are formed on the substrate surface, but not at a high density, and they are formed at random. Some projections have broken apexes and the inside thereof can be observed. From these photographs, it appears that the projection is formed by a film and the inside is hollow.

Figure 17:
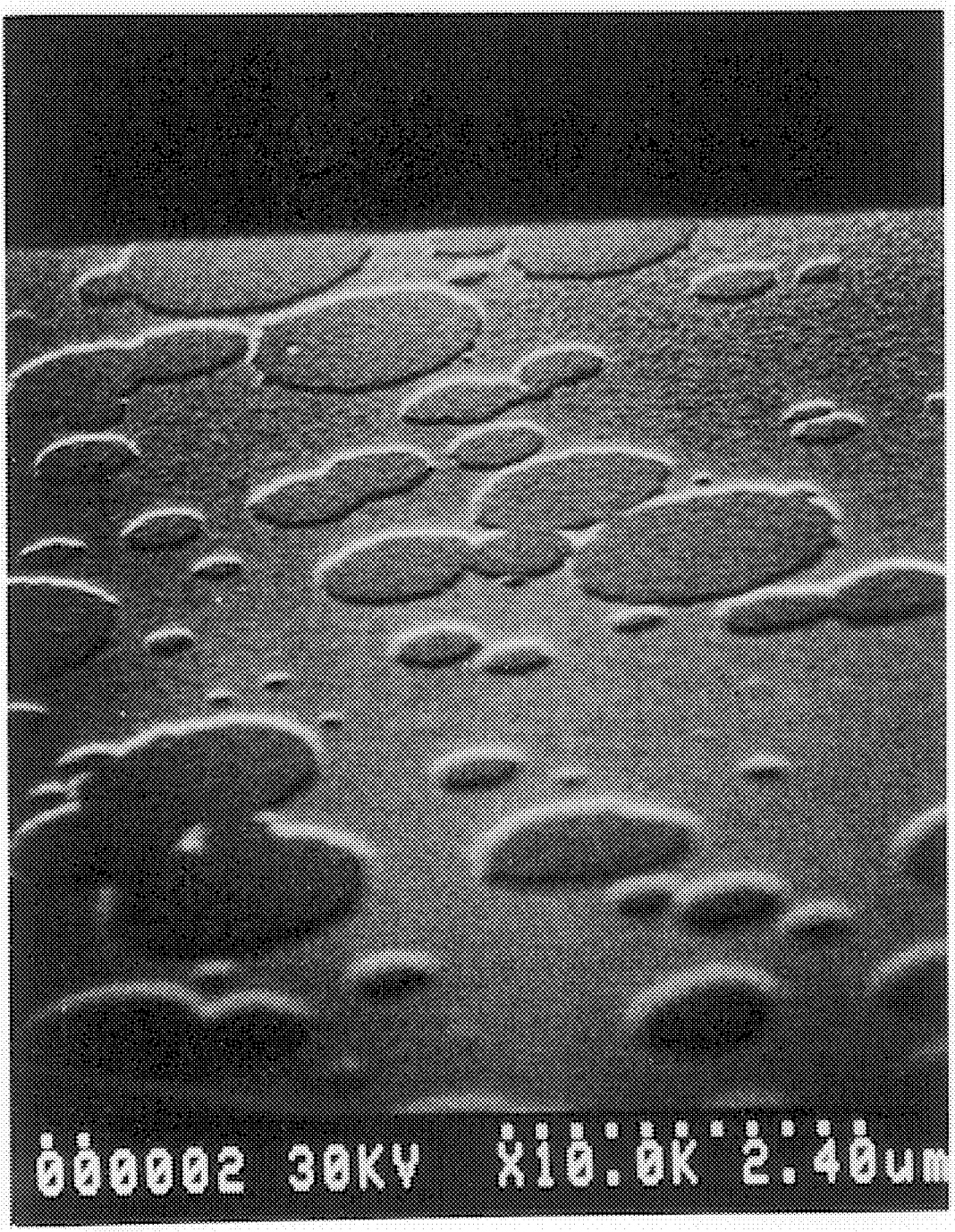
FIG. 17 is an electron microscopic photograph showing the structure of another sample surface.

FIG. 17 is a scanning electron microscopic photograph of the surface of a wafer after it was immersed in 1.5% dilute hydrofluoric acid aqueous solution made by mixing water and 50% HF aqueous solution by a ratio of $H_2O:HF=100:3$. The observed area was the outer boundary region 25, and the magnification factor was 10000. There is no projection on the wafer surface processed by hydrofluoric acid, and only the signs of projections can be observed. It is supposed that the projections have been dissolved by dilute hydrofluoric acid aqueous solution.

From these observation results and from the results of secondary ion mass spectroscopy (SIMS) and electron spectroscopy for chemical analysis (ESCA) using X-rays to be described later, it can be considered that conical projections are formed by a silicon oxide film, and that the silicon oxide film is dissolved by HF and the Si surface is exposed. The outside of the exposed area is supposed to be $CoSi_2$.

It is known that As as an n-type impurity of Si has a large diffusion coefficient in silicide. The causes of forming projections, possibly silicon oxide, on a highly As doped silicide film on an Si surface have been studied and traced in the following manner.

The influence of the first anneal temperature after the deposition of a Co film and a TiN film was checked. First, As ions were implanted on an Si wafer at an acceleration energy of 30 keV and a dose of $5 \times 10^{15}$ cm$^{-2}$. The Si wafer was activated by a heat treatment for about 5 minutes at about 850° C. in a nitrogen ($N_2$) atmosphere. The Si wafer surface was processed by 1.5% HF aqueous solution to remove a surface oxide film. Thereafter, a Co film having a thickness of about 10 nm was deposited by sputtering without heating, and then a TiN film having a thickness of about 20 nm was deposited by sputtering at a substrate temperature of about 300° C. Next, the first anneal was performed in an Ar atmosphere for 30 seconds. The anneal temperature was changed in the range of 600 to 750° C. After the first anneal, the TiN film was washed out for 90 seconds at about 65° C. by aqueous solution of ammonium, hydrogen peroxide, and water. Next, the Co film was washed out for about 3 minutes at a room temperature by solution of HCl and hydrogen peroxide. Lastly, the wafer was subjected to the second anneal for 30 seconds at about 750° C. in an Ar atmosphere.

FIG. 18 shows the result of this experiment. A circle symbol indicates a sample which showed that silicidation progressed properly and the resistance lowered. A cross symbol indicates a sample which showed that a whitish area was formed and the resistance was high. From the experiment results shown in FIG. 18, it can be understood that the phenomenon of the whitish area does not depend much on the first anneal temperature, but it depends strongly on the As concentration. That is to say, it can be understood that as the As concentration becomes 3 to $4 \times 10^{15}/cm^2$, the whitish area is formed.

Next, how the whitish silicide film is affected by the first anneal temperature was checked. An As dose was fixed to $5 \times 10^{12}$ $cm^{-2}$, and silicidation was performed in an RTA system at the first anneal temperatures of 450° C. and 650° C. for the anneal times of 30 seconds, 5 minutes, and 10 minutes. Thereafter, the wafer was immersed for 90 seconds in solution of ammonium, hydrogen peroxide, and water maintained at a temperature of 65° C. to wash out the TiN film.

Next, the wafer was immersed for 3 minutes in solution of HCl+hydrogen peroxide maintained at a room temperature to wash out the unreacted Co film. Thereafter, the second anneal was performed for 30 seconds at 750° C. in an Ar atmosphere. The sheet resistance of each sample was measured at the end of each process.

FIG. 19 is a table showing the experimental results. At the first anneal for 30 seconds at 650° C. corresponding to a conventional method, the sheet resistance after the TiN wash-out was 27. 6 $\Omega/\square$ and a whitish area was not observed. It is considered that the silicide film is CoSi. After the unreacted Co film of this sample was washed out by HCl+hydrogen peroxide, the surface of the sample became whitish and the sheet resistance became high. The sheet resistance remained high after the second anneal for 30 seconds at 750° C. was performed by RTA.

From these experimental results, it has been found that the whitish area is formed in the removal process of the unreacted Co film, i.e., a process using HCl+hydrogen peroxide. In the case of the longer anneal times of 5 minutes and 10 minutes at a substrate temperature of 650° C., the sheet resistance after the TiN wash-out process using ammonium solution was changed as low as 2.7 to 2.8 $\Omega/\square$. It is considered that the silicide film had changed to $CoSi_2$. However, after the Co wash-out process using HCl+hydrogen peroxide, the silicide films of these samples became whitish, and the samples had a high resistance. It has been found that the surface of the silicide has a high resistance after the $HCl+H_2O_2$ process if the silicidation temperature is high.

In the case of the first anneal for 10 minutes at 450° C., the silicide film did not become whitish even after the hydrochloric acid+hydrogen peroxide process, and a good silicide film was observed. After the second anneal, the sheet resistance of this sample reduced to 2.7 $\Omega/\square$. It is considered that CoSi formed by the first anneal changes to $CoSi_2$ at the second anneal.

In the case of the first anneal for 30 seconds at 450° C., the sheet resistance after the TiN film wash-out was 47 $\Omega/\square$ which is generally similar to the first anneal for 10 minutes. However, after the Co film is removed by the hydrochloric acid+hydrogen peroxide wash-out process, the Si substrate was exposed. The sheet resistance was 90 $\Omega/\square$ which is equal to that of the Si substrate. It is considered that there is an area where silicidation advances only to the $Co_2Si$ stage because of the short anneal time, Co as well as $Co_2Si$ is removed by hydrochloric acid+hydrogen peroxide, and the silicide film disappears.

In the case of the first anneal for 5 minutes at 450° C., the silicide film remained also after the Co wash-out process, and the sheet resistance after the second anneal was 5.4 $\Omega/\square$. From this value, it can be seen that although there occurred silicidation for the formation of $CoSi_2$, the sheet resistance lowers insufficiently. It is considered that insufficient advance of silicidation results from an insufficient anneal time.

It has been found from the experimental results that Co can be silicidated if the first anneal is performed at a low temperature for a sufficient time, even if As is implanted into a substrate at a high concentration. For example, if the first anneal is performed at 450° C. at least for 5 minutes, preferably for 10 minutes or longer, silicidation of a Co film can advance. However, if the temperature is too low or the reaction time is insufficient, wafers are not resistant against the $HCl+H_2O_2$ process.

Next, the composition distribution of a substrate after the first anneal was measured by SIMS and ESCA.

Figure 20A:
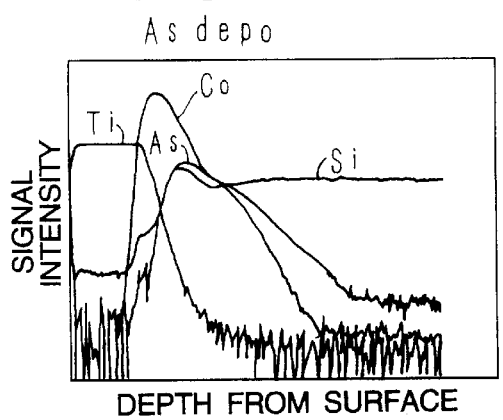
FIGS. 20A to 20E are graphs showing As distribution changes with anneal conditions.

FIGS. 20A to 20E are graphs of the measurement results by SIMS. FIG. 20A shows a distribution of constituent elements before the first anneal and after the deposition of a Co film and a TiN film. The Co film was deposited by sputtering without heating, and the TiN film was deposited by sputtering at a substrate temperature of 300° C. for 20 minutes. Substantially pure Co and TiN films formed on the Si substrate were observed.

Figure 20B:
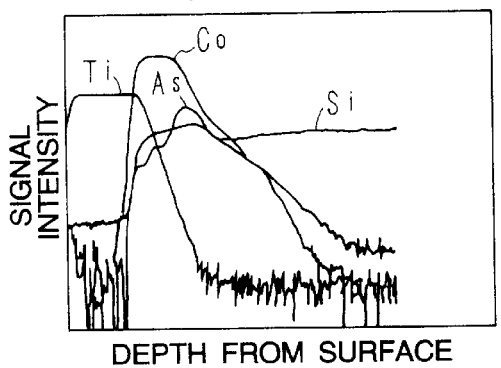

FIG. 20B shows a distribution of constituent elements after the first anneal for 30 seconds at 450° C. It can be seen that the distributions of Si and Co are overlapped and Co silicide is formed. The distribution of As doped as impurities has a peak in the Si substrate, and its concentration is considerably lowered near at the surface of the Si substrate.

Figure 20D:
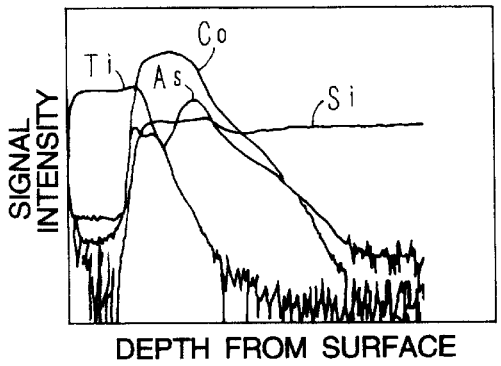
Figure 20C:
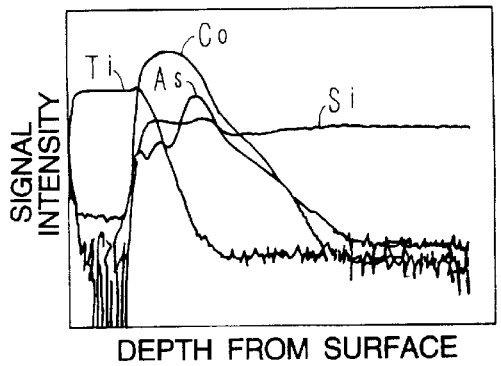

FIG. 20C shows a distribution after the first anneal at 450° C. for 10 minutes. Although the distribution of As is generally similar to that shown in FIG. 20B, it appears that a low concentration region reaches the surface of the Co film. It can be seen that As implanted into the Si substrate diffuses not so much by the heat treatment at 450° C.

Figure 20E:
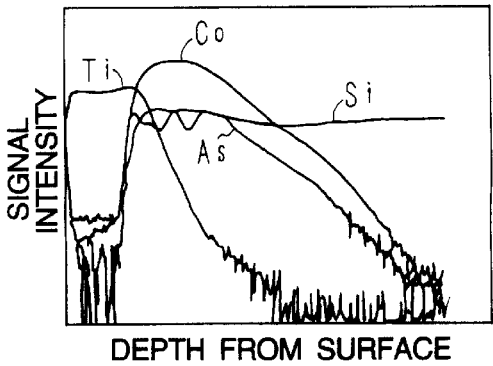

FIGS. 20D and 20E show distributions after the first anneal at 650° C. FIG. 20D shows a distribution after the first anneal for 30 seconds, and FIG. 20E shows a distribution after the first anneal for 10 minutes. It can be seen from FIG. 20D that an As concentration near at the Si surface is fairly high although it is lower than the peak concentration and As reaches the surface of the Co film. It can be seen from FIG. 20E that the As peak concentration lowers in the Si substrate and an As concentration in the peak area of the Co concentration distribution shows generally constant high values. The first anneal at 650° C. causes As to distribute in Co silicide at a high concentration and reach the surface of the Co film.

Distributions of Ti, Co, and Si do not change so much between the first anneal at 450° C. and the first anneal at 650° C. It is considered that the thick whitish phenomenon is greatly affected by the As distribution.

FIG. 21 shows the ESCA results of atomic composition on the surfaces of a sample subjected to the first anneal for 10 minutes at 450° C. and a sample subjected to the first anneal for 30 seconds at 650° C., both in the state after the wash-out process. ESCA was performed after the TiN film wash-out process by ammonium solution and the Co film wash-out process by solution of hydrochloric acid +hydrogen peroxide. For the sample subjected to the first anneal for 30 seconds at 650° C., ESCA was performed at two surface areas including an area (b) where the Si substrate was exposed and a whitish area (a).

In the case of a sample subjected to the first anneal for 10 minutes at 450° C., the compositions had changed not so much between after the TiN film removal and after the Co film removal. The compositions were Si (24 to 25%), Co (8 to 9%), As (0.6%), and O (46–53%). This corresponds to generally the same sheet resistance of the sample subjected to the first anneal for 10 minutes at 450° C. shown in FIG. 19, both after the TiN film removal and after the Co film removal. It is supposed that a large quantity of O results from the oxidation of the surface of silicide at the acid treatment.

In the case of the sample objected to the first anneal for 30 seconds at 650° C., the compositions of Si, Co, and O after the TiN film removal showed generally the same values as the sample subjected to the first anneal for 10 minutes at 450° C. However, the composition of As was 1.15% which is about twice as large as the sample subjected to the first anneal for 10 minutes at 450° C. This corresponds to a small As distribution at the substrate surface of the sample subjected to the first anneal for 10 minutes at 450° C. shown in FIG. 20 and an As distribution at a fairly high concentration at the substrate surface of the sample subjected to the first anneal for 30 seconds at 650° C. shown in FIG. 20. It is considered that As diffuses extensively in silicide because of a high anneal temperature.

It can be understood that the sample with a whitish surface area has silicon oxide formed on the surface area because only Si and O exist and Co and As do not exist on the surface after the Co film removal.

It can also be understood that Co and Co silicide have been removed from the sample with a peeled-off film area because no Co is detected.

It can be seen from the results shown in FIG. 21 that a whitish film or a peeled-off film is formed if an As concentration at the Si substrate surface exceeds about 1% at a high temperature. The As surface concentration is preferably less than 1.15%, and more preferably 1% or less.

It is supposed from the above-described results that if an Si substrate highly doped with As having a Co film and a TiN film sputtered thereon is subjected to the first anneal at a too high anneal temperature, As diffuses extensively and a large quantity of As diffuses in a silicide film, Co and As are removed at the Co film removal process by hydrochloric acid+hydrogen peroxide, and silicon oxide is formed on the Si substrate surface.

Figure 22:
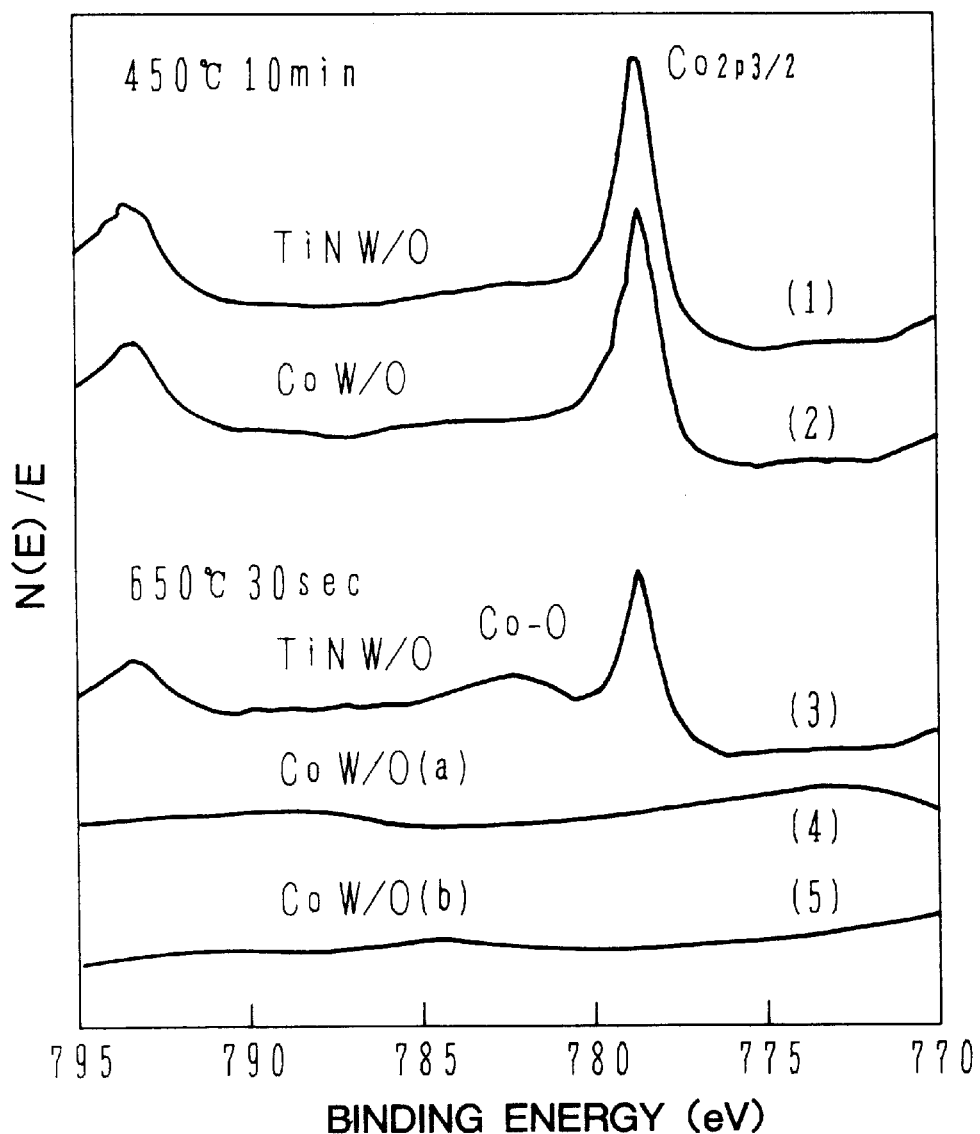
FIG. 22 is a graph showing spectra of the results of ESCA as a function of a binding energy.

FIG. 22 shows spectra of ESCA detection signals as a function of binding energy. Two spectra are shown for a sample after the TiN film removal and after the Co film removal, which sample underwent the first anneal for 10 minutes at 450° C. Both the spectra generally show the same distribution, which indicates a presence of Co on the substrate surface.

A spectrum of a sample which underwent the first anneal for 30 seconds at 650° C. shows Co—O binding after the TIN film removal, which indicates the oxidation of the surface of the Co film. That is to say, a Co film having a large quantity of As on the surface of a Si substrate is likely to be oxidized by the process of $NH_4OH+H_2O_2+H_2O$.

Spectra after the Co film removal have no Co peak both in the whitish area (a) and peeled-off area (b). There is no Co on the substrate surface after the Co film removal. It is considered that the surface of the whitish area is $SiO_2$ and the surface of the peeled-off area is Si.

From the above-described results, it is considered that the first anneal at a high temperature of 650° C. causes a large quantity of As to be doped in silicide, a resistance against acid is lowered, oxidation progresses even at the ammonium process, and As and Co dissolve at the hydrochloric acid treatment.

From the above experimental results, a model shown in FIGS. 23A to 23D can be hypothesized.

As ions are implanted on the surface of a Si substrate 31 at an acceleration energy of 30 keV and at a dose of $5\times10^{15}$, and thereafter a heat treatment is performed in a nitrogen atmosphere for 5 minutes at 850° C. By this heat treatment, the surface of the Si substrate is doped with As. After the surface treatment by dilute HF aqueous solution, a Co film having a thickness of about 10 nm and a TiN film having a thickness of about 20 nm are deposited by sputtering, and the first anneal is performed at 650° C. The Co film is supposedly changed to $CoSi_2$.

Figure 23A:
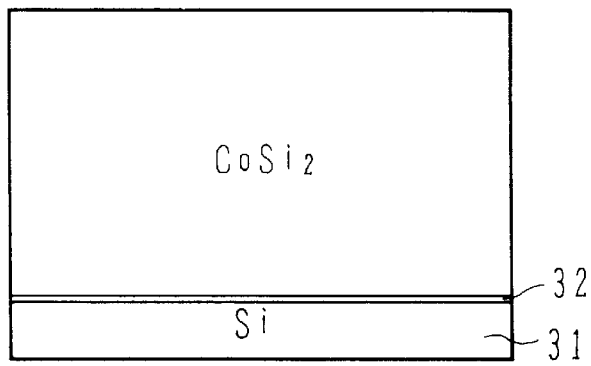
FIGS. 23A to 23D are brief perspective views explaining a model of a mechanism of generating conical projections on a substrate surface.

As shown in FIG. 23A, a process by ammonium+hydrogen peroxide+water is performed for 90 seconds at 65° C. to remove the TiN film so that a $CoSi_2$ film is exposed on the substrate surface. The unreacted Co film is removed by a process of hydrochloric acid+hydrogen peroxide for 3 minutes at a room temperature. During this hydrochloric acid treatment, Co—As in the $CoSi_2$ film 32 highly doped with As is dissolved in hydrochloric acid. Si is left on the substrate surface and oxidated by hydrochloric acid and changed to $SiO_2$.

Figure 23B:
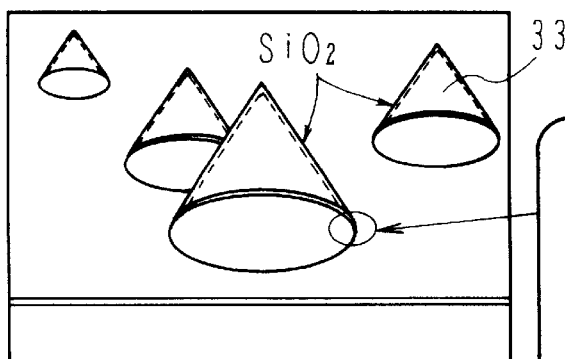
Figure 23C:
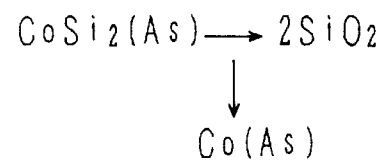
Figure 23D:
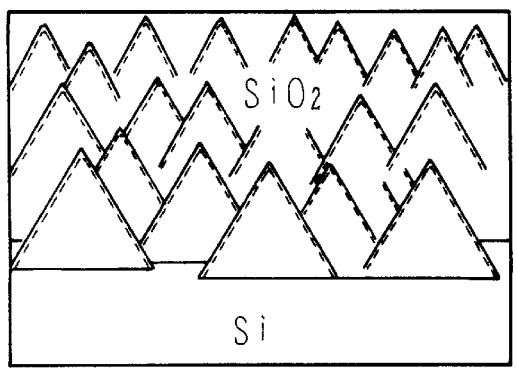

In this case, it is supposed that since the volume of $SiO_2$ is greater than that of $CoSi_2$, $SiO_2$ bulges upward as shown in FIG. 23B to form conical projections 33. This reaction is shown in FIG. 23C. It is therefore considered as shown in FIG. 23D that after the process by $HCl+H_2O_2$, a number of conical projections 33 of silicide oxide are formed on the Si substrate.

The observation of Si, As, and O at the peeled-off film area of the sample which underwent the first anneal for 30 seconds at 650° C. shown in FIG. 21 is supposed to be an observation of an oxide film like a native oxide film formed by light oxidation of the exposed Si substrate surface after the whitish silicide film was peeled off.

The above experiment results imply that if the first anneal is performed at a relatively low temperature, the above phenomena do not occur, As diffusion can be suppressed, and silicon oxide formation can be avoided. In order to check a proper first anneal temperature, a sheet resistance was measured after each process by setting the first anneal time to 10 minutes and setting the temperature to various points in the range from 350° C. to 650° C.

FIG. 24 shows the measurement results of sheet resistances in unit of $\Omega/\square$. The processes up to the TiN sputtering are the same as those used for the samples described previously, and the first anneal was performed for 10 minutes at each temperature in an Ar atmosphere. Thereafter, the TiN film was removed by a process of ammonium+hydrogen peroxide+water for 90 seconds at 65° C., and the Co film was removed by a process of HCl+hydrogen peroxide for 3 minutes at a room temperature. Thereafter, the second anneal was performed for 30 seconds at 750° C. in an Ar atmosphere. The table shown in FIG. 24 shows sheet resistances measured respectively after the TiN film removal, after the Co film removal, and after the second anneal.

The sheet resistance of a sample after the TiN film removal which sample underwent the first anneal at 350° C. was 63 $\Omega/\square$, and the sheet resistances after the Co film removal and after the second anneal were infinite. It is considered that the Co film and a silicide film if any are completely removed by the acid treatment, and the Si substrate surface is oxidated. The sheet resistance of a sample which underwent the first anneal at 400° C. could be measured both after the Co film removal and after the second anneal. It was found that a silicide film was formed on the Si substrate surface and no oxide film was formed on the Si substrate surface by the acid treatment. However, the sheet resistance of a sample which underwent the first anneal at 400° C. was high. Silicidation by the first anneal is supposedly insufficient. A final sheet resistance is possibly lowered if the reaction time is prolonged.

The sheet resistance of a sample which underwent the first anneal at 450° C. was as relatively high as 80 to 86 $\Omega/\square$ both after the TiN film removal and after the Co film removal, which indicates that the silicide film after the first anneal is rich in Co. However, the sheet resistance after the second anneal became as sufficiently small as 3.9 $\Omega/\square$, which supposedly indicates the formation of a good $CoSi_2$.

The sheet resistance of a sample which underwent the first anneal at 500° C. was relatively high, but showed a similar tendency to the first anneal at 450° C.

The sheet resistance of a sample which underwent the first anneal at 650° C. was as low as 3.1 $\Omega/\square$ even after the TiN film removal. It is considered that $CoSi_2$ has already been formed by this time. However, it was found that after the acid treatment, the surface resistance became infinite and silicon oxide was formed by As diffused in the silicide film.

From the experimental results shown in FIG. 24, it can be understood that the first anneal temperature is preferably 400 to 525° C. Silicidation does not proceed sufficiently at a temperature lower than this temperature range, and the silicide film is unable to be resistant against the acid treatment. As diffusion becomes extensive at a temperature in excess of this temperature range. The first anneal temperature is more preferably 425 to 500° C.

The experiments were performed by using a single crystal wafer doped with As. Similar phenomena may occur on an Si substrate surface with a field oxide and an insulated gate electrode, or on a polycrystalline silicon surface.

In forming a silicide electrode on a small silicon surface area defined by a field oxide film, a creep-up of the silicide electrode along the field oxide film may occur.

FIGS. 26A, 26B, 27A, and 27B are electron microscopic photographs of silicon substrate surfaces which underwent the anneal on different conditions. On an Si substrate having a plurality of active regions A2 shown in FIG. 35B and defined by an element isolation region formed by LOCOS (local oxidation of silicon), a laminated layer of a Co film having a thickness of about 10 nm and a TiN film having a thickness of about 20 nm was formed, and an RTA (rapid thermal anneal) process was performed for 30 seconds in an Ar atmosphere at 500 Torr by lamp heating. The photographs show the substrate surfaces after these processes.

An Si surface for a contact area is exposed on the sample surface at the central area thereof. A LOCOS silicon oxide film surrounds the exposed Si surface. An Si active region A2 surrounds the LOCOS silicon oxide film. The LOCOS silicon oxide film further surrounds the active region A2.

Figure 26A:
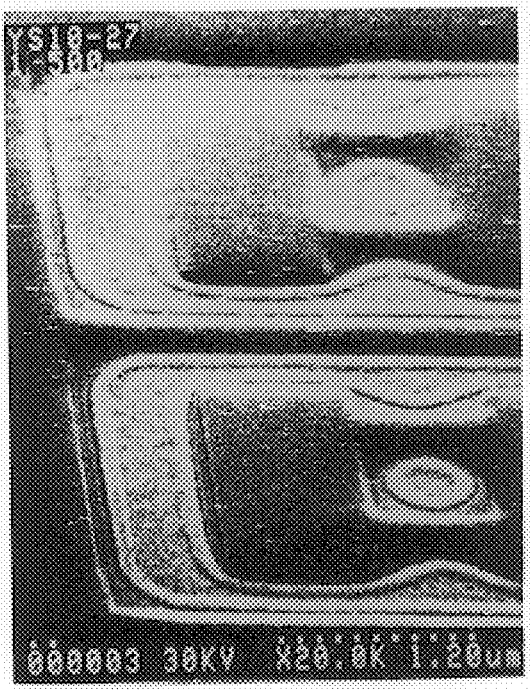
FIGS. 26A and 26B are microscopic photographs showing fine patterns formed on a sample substrate underwent a first silicidation heat treatment at a relatively low temperature.
Figure 26B:

FIGS. 26A and 26B show the sample surfaces, which samples underwent the RTA process at 500° C. and at 550° C. These samples are formed with a silicide film only on the exposed Si surface.

Figure 27A:
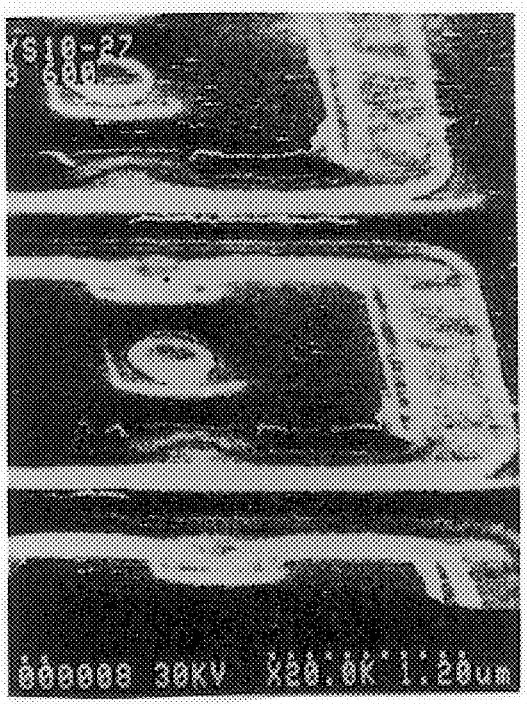
FIGS. 27A and 27B are microscopic photographs showing fine patterns formed on a sample substrate underwent the first silicidation heat treatment at a relatively high low temperature.
Figure 27B:

FIGS. 27A and 27B show the sample surfaces, which samples underwent the RTA process at 600° C. and at 650° C. These samples are formed with a silicide film on the Si surface creeping up along the field oxide film. The sample which underwent the RTA process at 650° C. has a distinctive creep-up, and short-circuit is formed partially at the region where elements should be isolated.

The cause of such creep-up of a Co silicide film has been studied.

FIGS. 28A to 28D are schematic cross sectional views explaining a sample history.

Figure 28A:
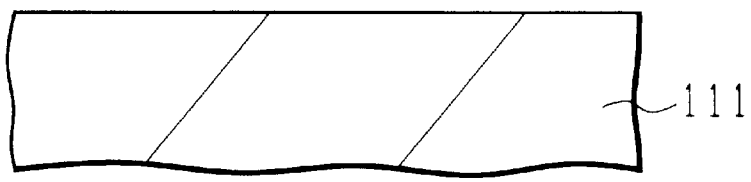
FIGS. 28A to 28D are cross sectional views explaining a cause of creep-up of a silicide film along a field oxide film.

As shown in FIG. 28A, an Si substrate 111 was first prepared.

Figure 28B:
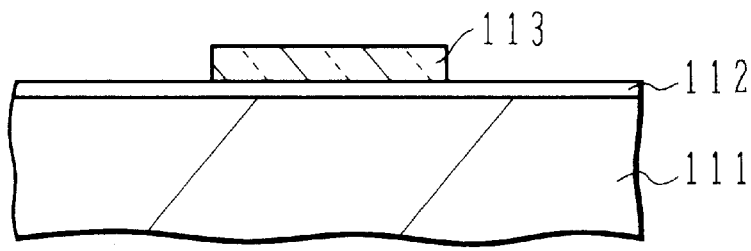

Next, as shown in FIG. 28B, a silicon nitride film 113 was patterned on the Si substrate 111, with a buffer oxide film 112 being interposed therebetween. This silicon nitride film 113 was used as a LOCOS mask.

Figure 28C:
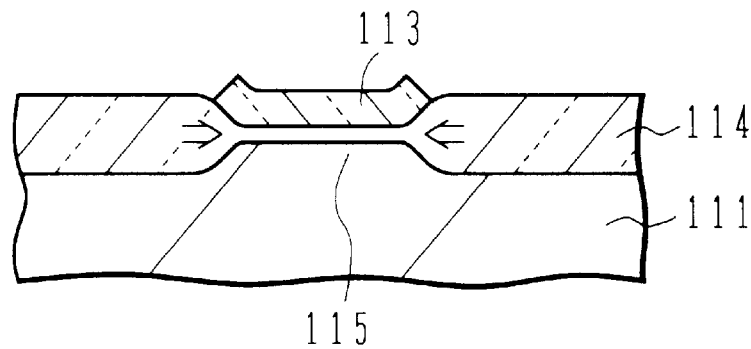

As shown in FIG. 28C, by using the silicon nitride film 113 as a mask, a LOCOS process was performed to form a thick field oxide film 114 on the surface of the Si substrate 111 not covered with the silicon nitride film 113.

During the process of forming the field oxide film 114, Si is converted into $SiO_2$ so that the volume is expanded. As a result, the field oxide film 114 is bulged toward the Si substrate 111 surface and a compression stress is applied laterally to an active region 115 surrounded by the field oxide film 114.

Figure 28D:
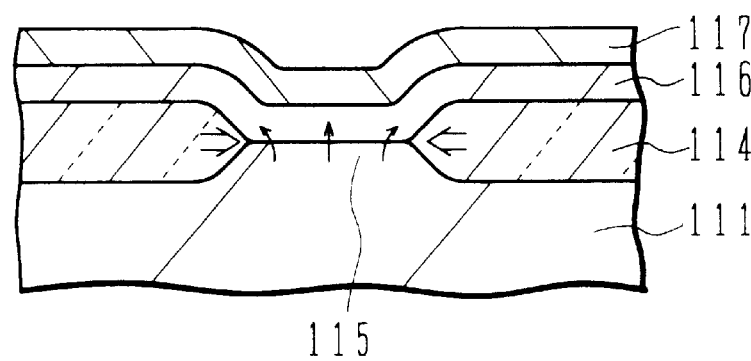

Thereafter, as shown in FIG. 28D, the silicon nitride film 113 pattern and the underlying buffer oxide film were removed, and a laminated layer of a Co film 116 and a TiN film 117 was formed. The Si substrate was heated to react the Co film with Si in the active region 115 and form Co silicide.

In this case, as described above, the compression stress is being applied from the field oxide film 114 to the active region 115. With the compression stress being applied, the Si substrate is heated to advance a silicidation reaction. It is conceivable that under some conditions, Si atoms in the Si substrate 111 diffuse into the Co film 116 and creep up from the active region 115 to the field oxide film 114.

What stress is generated on the wafer surface region with a field oxide film was checked by simulation.

Figure 36:
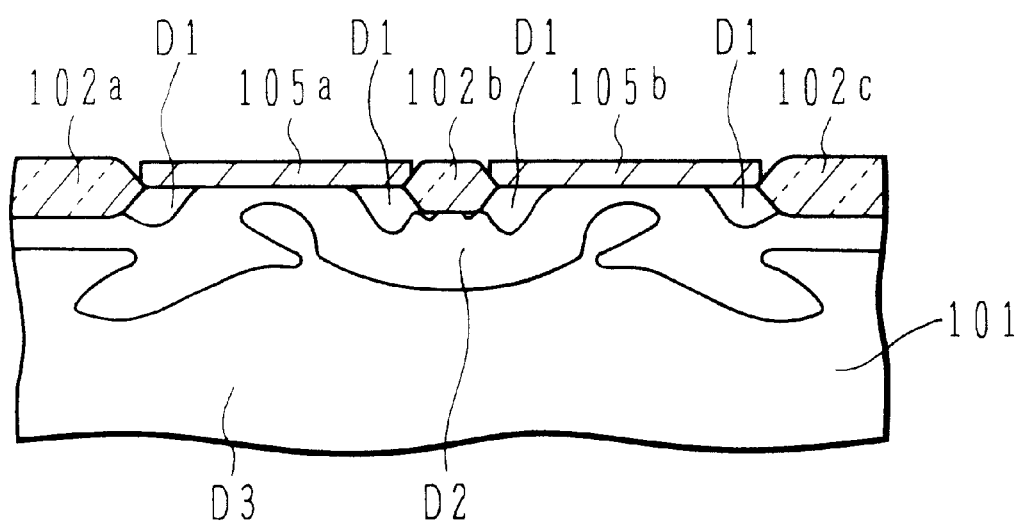
FIG. 36 is a cross sectional view showing an example of a distortion distribution obtained through simulation calculation, in an Si active region defined by a field oxide film.

FIG. 36 is a schematic cross sectional view showing a stress distribution obtained by simulation. A field oxide film 102 is being formed on the surface of an Si substrate 101, and a suicide electrode 105 is being formed on the active region defined by the field oxide film 102. A stress distribution generated on the surface region of Si substrate of this structure was obtained through simulation. A large stress is generated at a region D1, a middle stress is generated at a region D2, and almost no stress is generated or a very small stress is generated at the remaining region D3.

Consider for example the Si region under the silicide electrode 105a. The region D1 with a large stress is formed at regions adjacent to the field oxide films 102a and 102b. Similarly, in the case of the Si region under the silicide electrode 105b, the region D1 with a large stress is formed at regions adjacent to the field oxide films 102b and 102c.

If such active regions are used for source/drain regions and source/drain electrodes are contacted via central contact holes formed in a gate oxide film or another insulating film formed on the Si surface, it is possible to cover the large stress regions D1 with the gate oxide film or another insulating film and form the contact region only at the middle stress region D2.

However, in order to effectively use the active source/drain regions defined by the field oxide film 120, it is required to use also the large stress regions D1 adjacent to the field oxide film 102 as the contact region. In such a case, a creep-up of the silicide electrode along the field oxide film as shown in FIGS. 27A and 27B becomes fatal to the properties of manufactured semiconductor device.

In order to verify the above study, the present inventors formed Co films on Si substrates and measured X-ray diffraction of Co silicide films formed by an RTA process at different temperatures.

Figure 29:
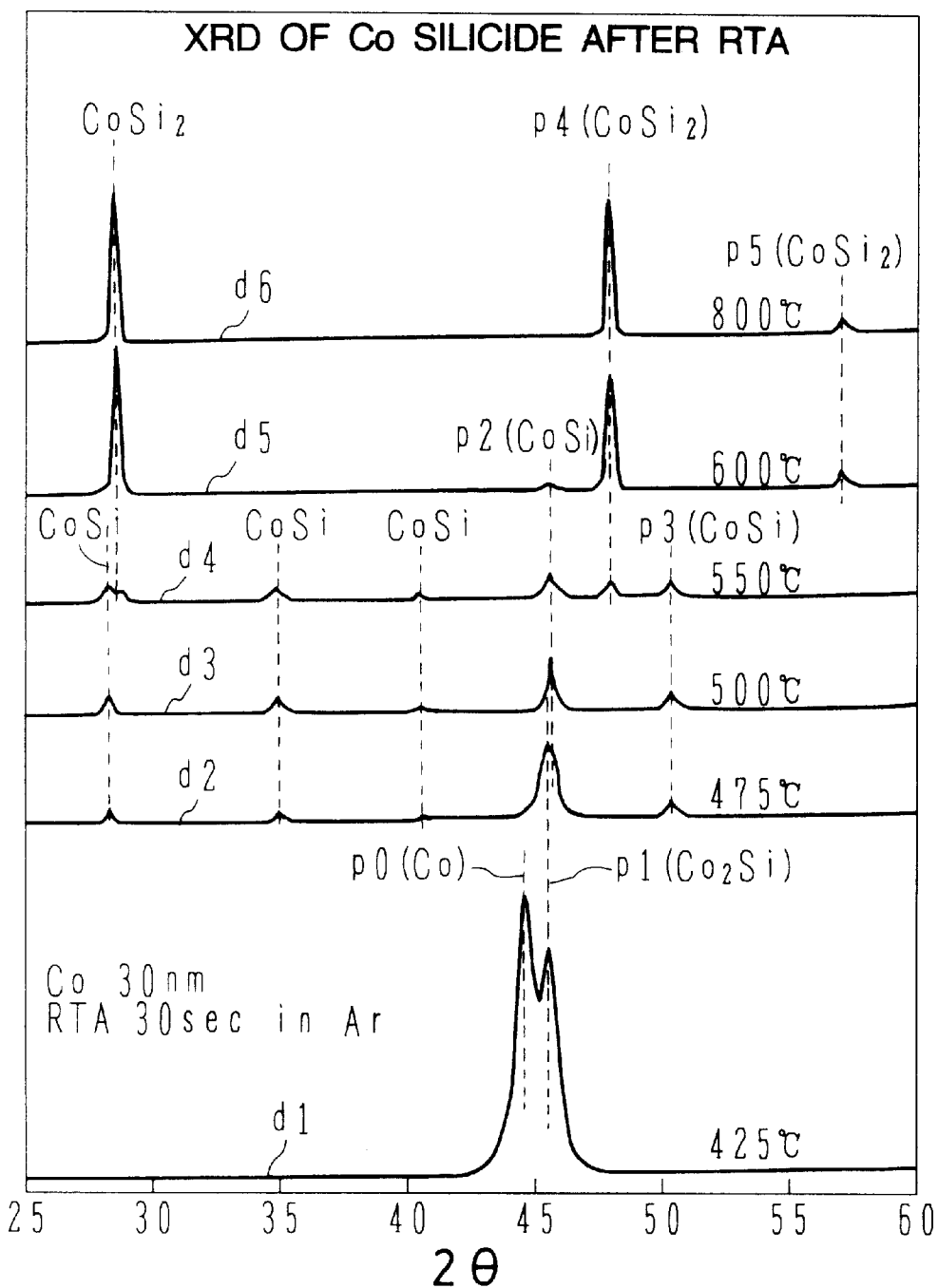
FIG. 29 is a graph showing the results of x-ray diffraction analysis of samples at different first heat treatment temperatures.

FIG. 29 shows the measurement results of X-ray diffraction. Each sample was formed by depositing a Co film having a thickness of 30 nm on an Si substrate and performing an RTA process for about 30 seconds in an Ar atmosphere.

A Co peak P0 and an Si peak P1 were observed on a diffraction curve d1 of a sample which underwent the RTA process at 475° C.

A Co peak P0 disappeared almost all and a Co2Si peak P1 and CoSi peaks P2, P3, and the like were observed on a diffraction curve d2 of a sample which underwent the RTA process at a further raised temperature of 475° C. Although the $Co_2Si$ peak P1 and CoSi peak P2 are very close, two peaks can be confirmed from the peak shape.

The $Co_2Si$ peak P0 disappeared and the CoSi peaks P2, P3, and the like were observed on a diffraction curve d3 of a sample which underwent the RTA process at 500° C.

By the RTA process at a further raised temperature of 550° C., in addition to the CoSi peaks P2, P3, and the like, a $CoSi_2$ peak P4 and the like were observed. However, the $CoSi_2$ peak is still much smaller than other peaks.

Although the CoSi peak P2 was still observed, the peak P3 was hardly observed and only the $CoSi_2$ peaks P4, P5, and the like were strongly observed on a diffraction curve d5 of a sample which underwent the RTA process at a further raised temperature of 600° C.

The CoSi peak was not observed at all and only the $CoSi_2$ peaks P4, P5, and the like were observed on a diffraction curve d6 of a sample which underwent the RTA process at a further raised temperature of 800° C.

The experimental results shown in FIG. 29 will be compared with the experimental results shown in FIGS. 26A, 26B, 27A, and 27B. As shown in FIGS. 26A and 26B, the RTA processes at 500° C. and 550° C. do not generate a creep-up of the Co silicide film. As shown in FIG. 29, at these temperatures the Co silicide is mainly made of CoSi. Although the formation of $CoSi_2$ is slightly observed at 550° C., its quantity is very small.

As shown in FIGS. 27A and 27B, the RTA processes at 600° C. and 650° C. generate a distinctive creep-up of the Co silicide film along the field oxide film. As seen from the curve d5 at 600° C. shown in FIG. 29, the Co silicide is mainly made of $CoSi_2$. Although CoSi is contained at 600° C., its quantity is very small. At a further raised temperature, the quantity of CoSi reduces correspondingly.

From the study of these comparison results, it is conceivable that a Co silicide film creeps up from the Si surface to the field oxide film surface under the condition that the Co film on the Si substrate is allowed to form $CoSi_2$.

For a silicidation process, it is necessary to remove an unreacted metal film after silicidation. An unreacted Co film is generally removed by $HCl+H_2O_2$. The samples shown in FIG. 29 have three phases of $Co_2Si$, CoSi, and $CoSi_2$. Of these phases, $Co_2Si$ is dissolved in $HCl+H_2O_2$.

The present inventors have experimentally confirmed that As is likely to be diffused in a Co film during silicidation of the Co film on an Si substrate doped with a large quantity of As as described above. It has also been confirmed that if As is present on the surface of the Co silicide film at a concentration higher than a predetermined value, the process of $HCl+H_2O_2$ forms $SiO_2$ on the substrate surface and makes it an insulating surface. A formation of $SiO_2$ has also been confirmed in the case of CoSi and $CoSi_2$ which are ordinarily not dissolved in $HCl+H_2O_2$.

In contrast with the above, if an unreacted Co film is removed by $H_2SO_4+H_2O_2$, $SiO_2$ is not formed even an As dose is $3\times10^{15}$ cm$^{-2}$ or higher, and the sample surface is maintained conductive.

Of the samples shown in FIG. 29, the samples which underwent the RTA processes at 425° C., 475° C., and 500° C. were subjected to X-ray diffraction after the unreacted film was removed by $HCl+H_2O_2$ or $H_2SO_4+H_2O_2$.

Figure 30:
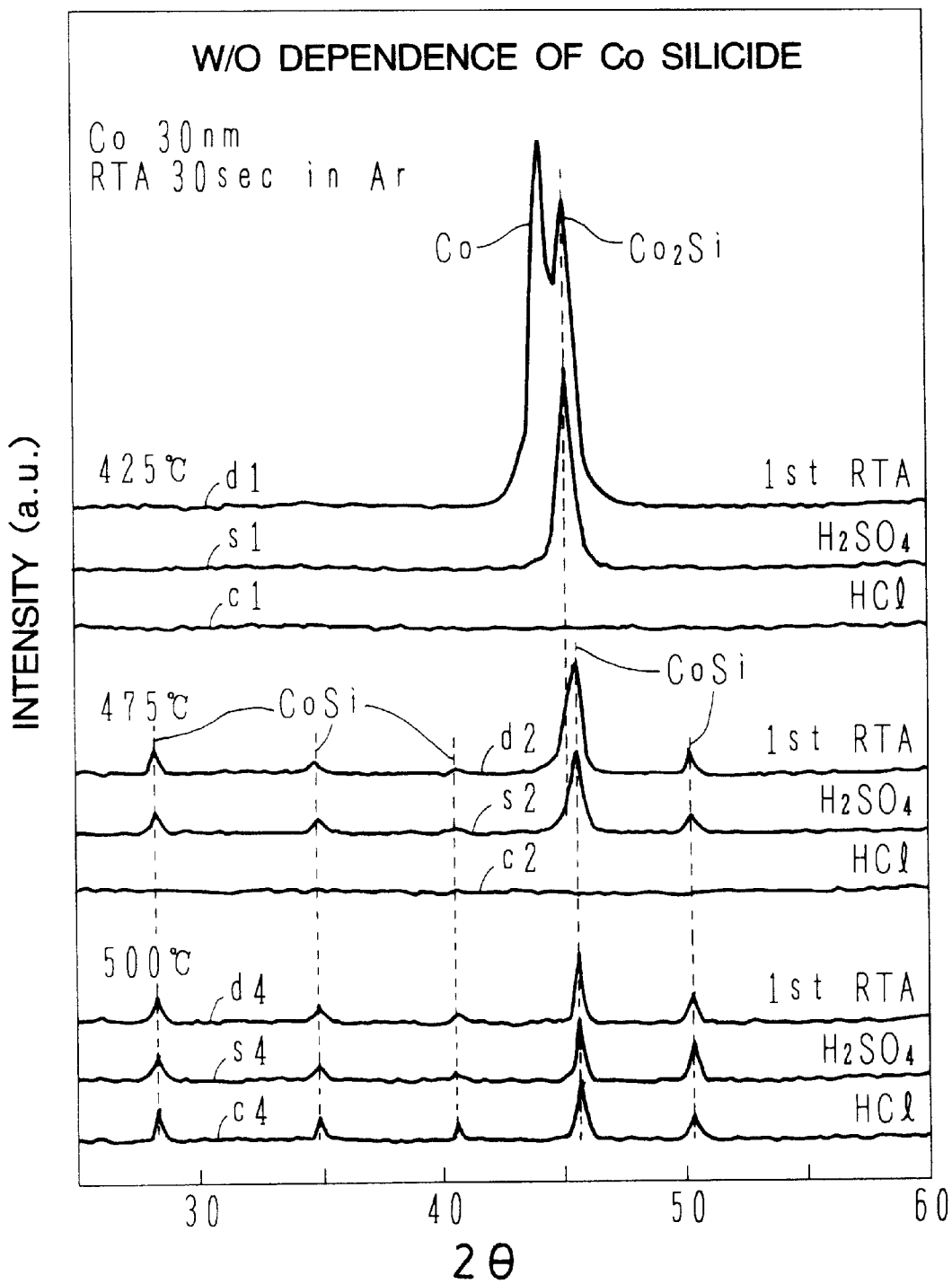
FIG. 30 is a graph showing the results of x-ray diffraction analysis of the samples underwent wash-out.

FIG. 30 shows the X-ray diffraction results of the samples whose unreacted Co films were removed by the acid treatment.

An sample which underwent the RTA process at 425° C. showed before the unreacted Co film removal a diffraction shown in a curve d1 which contains Co and $Co_2Si$ peaks. The diffraction results s1 of this sample after the process of $H_2SO_4+H_2O_2$ showed that the Co peak disappeared and only the $Co_2Si$ peak remained. However, both the Co peak and the $Co_2Si$ peak were not observed on a diffraction curve c1 of the same sample processed by $HCl+H_2O_2$.

Specifically, the Co silicide film of the sample processed at 425° C. contained only $Co_2Si$ and Co which were dissolved in $HCl+H_2O_2$. It is therefore conceivable that no Co silicide remains on the Si surface and the latter is exposed.

The sample which underwent the RTA process at 475° C. had a diffraction curve d2 on which a CoSi peak and some $Co_2Si$ peaks were observed before the acid treatment. The diffraction curve s2 of this sample processed by $H_2SO_4$ had generally the same characteristics as the curve d2.

The same sample processed by $HCl+H_2O_2$ had a curve c2 on which all peaks disappeared. It is therefore conceivable that if the RTA process is performed for 30 seconds at 475° C., although most of the Co silicide film changes to CoSi, $Co_2Si$ still remains so that the Co silicide film is dissolved in $HCl+H_2O_2$.

Only the CoSi peak was observed and the $Co_2Si$ peak was hardly observed on a diffraction curve d4 of the sample which underwent the RTA process at 500° C. The diffraction curve s4 of the same sample processed by $H_2SO_4+H_2O_2$ was generally the same as the diffraction curve d4 before this process. The diffraction curve c4 of the same sample processed by $HCl+H_2O_2$ was also generally the same as the diffraction curve d4 before this process.

It is therefore conceivable that the RTA process for 30 seconds at 500° C. changes the Co film to CoSi, and most of Co and $Co_2Si$ is not left.

CoSi ($Co_2Si$) has a relatively high resistance, and it is not used as a contact metal. However, if a second heat treatment is performed after an unreacted Co film is removed, CoSi ($Co_2Si$) can be changed to $CoSi_2$. At the heat treatment after an unreacted Co film is removed, no creep-up of the Co silicide film occurs because unnecessary Co has been removed.

It is conceivable that in order to prevent a creep-up of a Co silicide film, it is important not to form $CoSi_2$ more than a certain amount at the first heat treatment.

Figure 31:
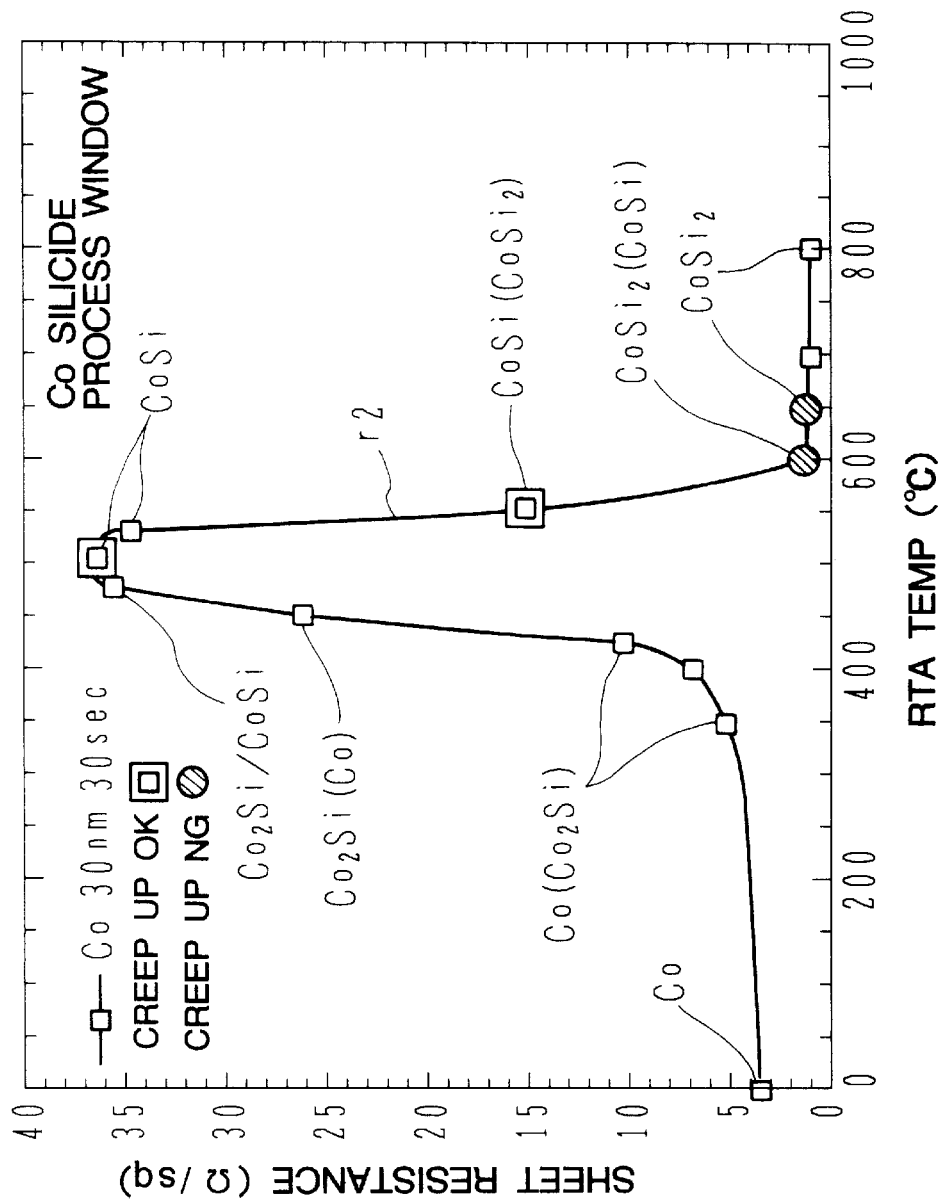
FIG. 31 is a graph showing a relationship between a first heat treatment and a sheet resistance.

FIG. 31 is a graph showing a relationship between a temperature at the first heat treatment and a sheet resistance of a Co silicide film after the first heat treatment. The ordinate represent a first heat treatment temperature in unit of ° C., and the abscissa represents a sheet resistance of a sample in unit of Ω/□. The thickness of a Co film was set to 30 nm, and the RTA process time was set to 30 seconds.

The RTA process at a low temperature of 400° C. or lower maintained the sheet resistance low. It is conceivable that Co is not reacted (silicidated) with Si yet and it remains still as metal Co. The RTA process at a temperature in excess of 400° C. increased the sheet resistance, showed a sheet resistance peak near at 500° C., thereafter rapidly lowered the sheet resistance, and showed a very small sheet resistance at 600° C.

The reason of a very low sheet resistance at a high temperature of 600° C. or higher is supposed to be a generation of $CoSi_2$. A creep-up of a Co suicide film occurs in a sample with $CoSi_2$ having a low sheet resistance.

A creep-up of a Co silicide film does not occur in a sample having a high sheet resistance. It is therefore preferable to perform the first RTA process at a temperature zone between temperatures whereat the sheet resistance lowers greatly or at a temperature zone where $CoSi_2$ is not formed.

However, if a Co film at the region contacting with Si remains as Co itself, the Co film is removed at the wash-out process for removing an unreacted Co film. Therefore, another condition is to form silicide which is not removed by the acid treatment.

$Co_2Si$ is dissolved in $HCl+H_2O_2$, but not dissolved in $H_2SO_4+H_2O_2$. Therefore, the condition on the lower temperature side slightly changes depending upon the type of acid to be used in the wash-out process for removing an unreacted Co film. This change occurs in a relatively narrow temperature zone so that generally the same condition can be assumed.

Even at the same RTA process temperature, silicidation advances as the process time is prolonged.

Figure 32:
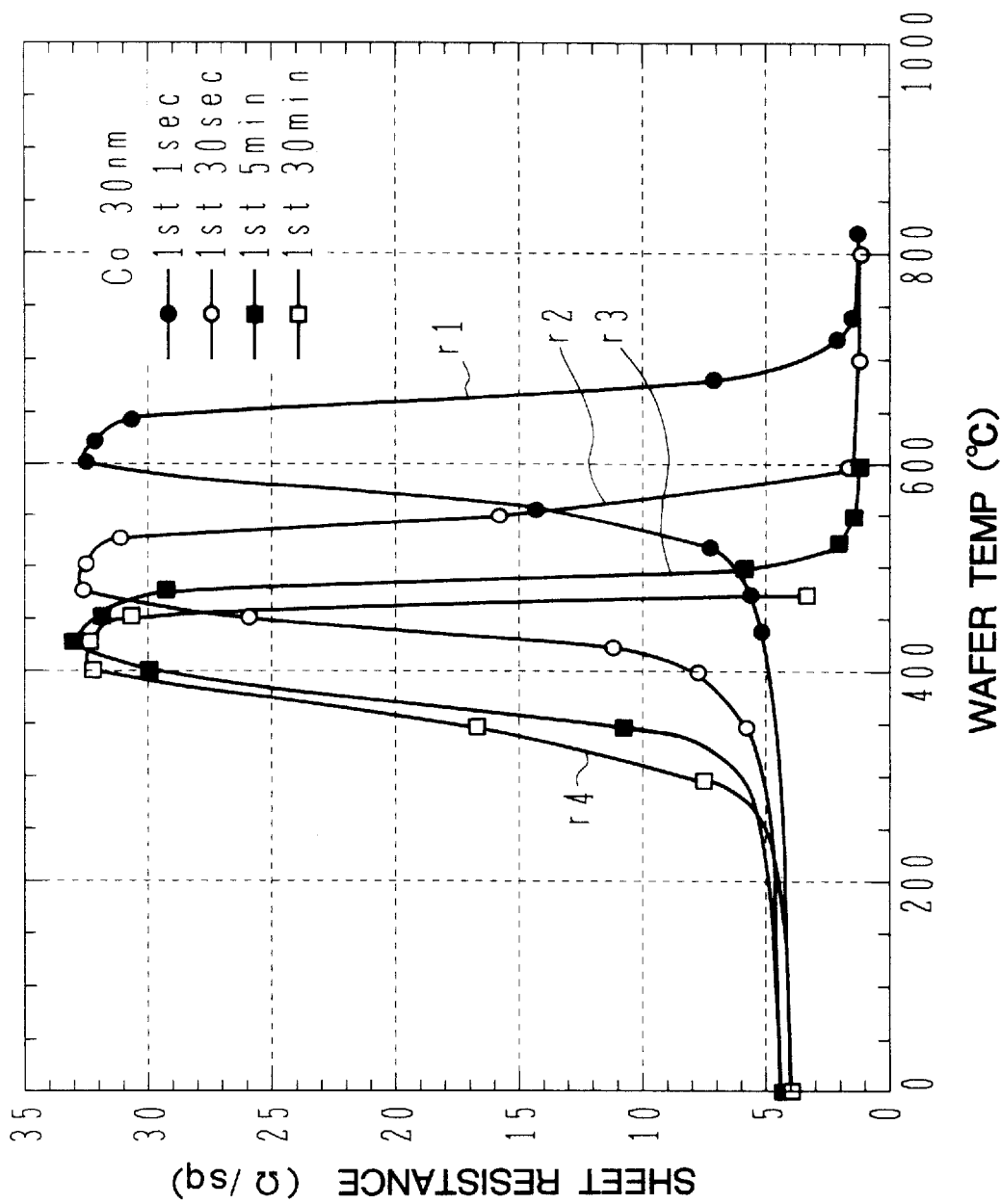
FIG. 32 is a graph showing a relationship between a first heat treatment and a sheet resistance at different first heat treatment times.

FIG. 32 is a graph showing a relationship between a sheet resistance and a process temperature using a silicidation reaction time as a parameter. The abscissa represents a process temperature in unit of ° C., and the ordinate represents a sheet resistance in unit of $\Omega/\square$. Similar to the former experiments, the thickness of a Co film was set to 30 nm, and the RTA process was performed in an Ar atmosphere. The RTA process time was changed from 1 second, 30 seconds, 5 minutes, and to 30 minutes, and the sheet resistance of each sample was measured.

A curve r1 stands for a process time of 1 second, a curve r2 (same as the curve shown in FIG. 7) stands for a process time of 30 seconds, a curve r3 stands for a process time of 5 minutes, and a curve r4 stands for a process time of 30 minutes.

As seen from this graph, as the first RTA heat treatment time was prolonged, the peak sheet resistance moved to the lower temperature side. Therefore, the first anneal optimum temperature and the optimum process time have a correlation therebetween.

Figure 33:
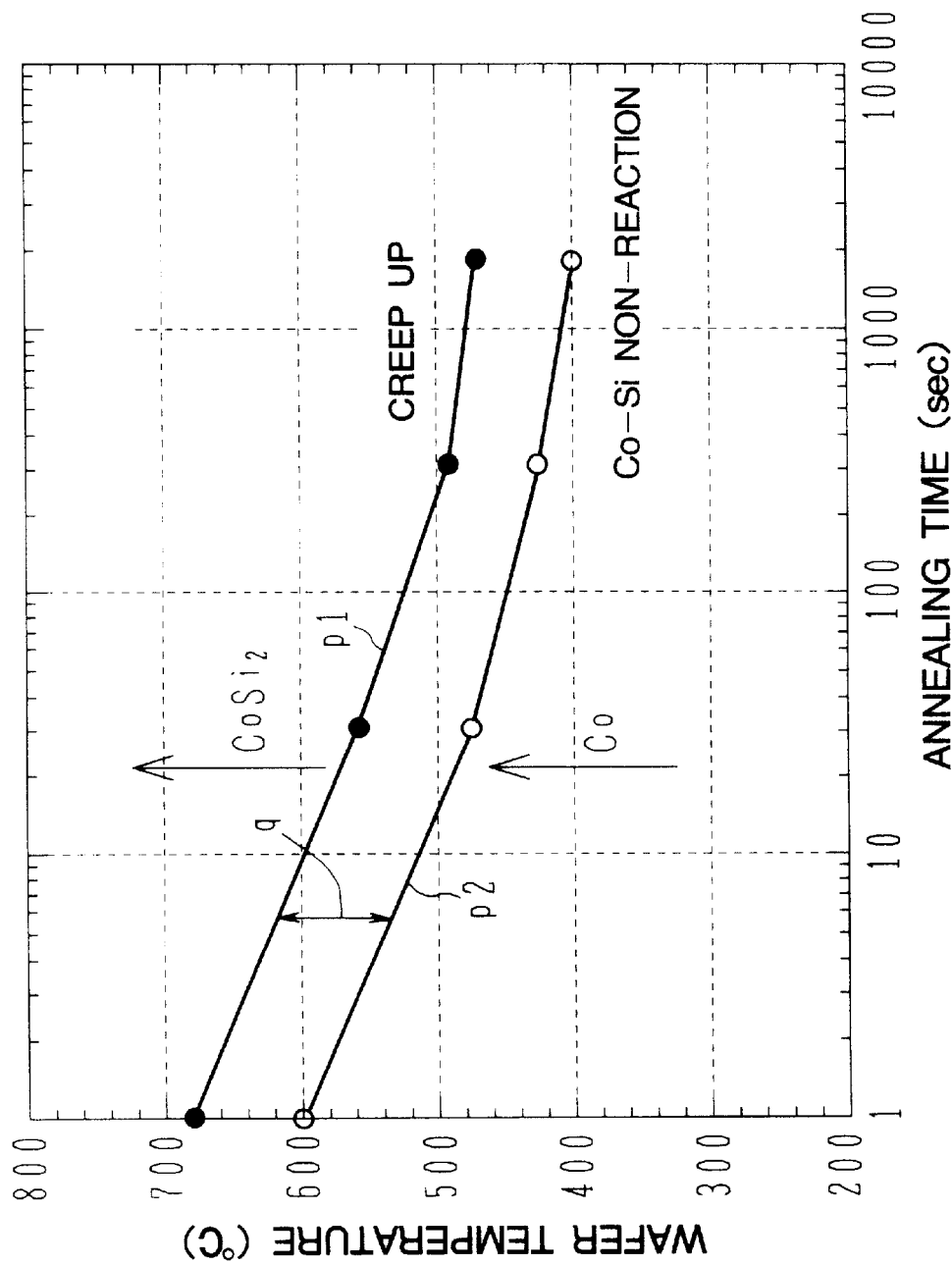
FIG. 33 is a graph showing a relationship between an optimum first heat treatment time and an optimum first heat treatment temperature.

FIG. 33 is a graph showing the conditions which prevent a creep-up of a Co silicide film after the first heat treatment, allow the Co film to completely react with the Si surface, and provide a resistance against the later acid treatment. The abscissa represents an anneal time in unit of second, and the ordinate represents an anneal temperature in unit of ° C.

The region upper than a curve p1 has a great danger of a creep-up of a Co silicide film by the first heat treatment. The region lower than a curve p2 has a great danger of leaving, unreacted Co and dissolving a silicide film by an acid treatment. The optimum conditions of the first heat treatment are therefore in the region q between the curves p1 and p2.

Figure 34:
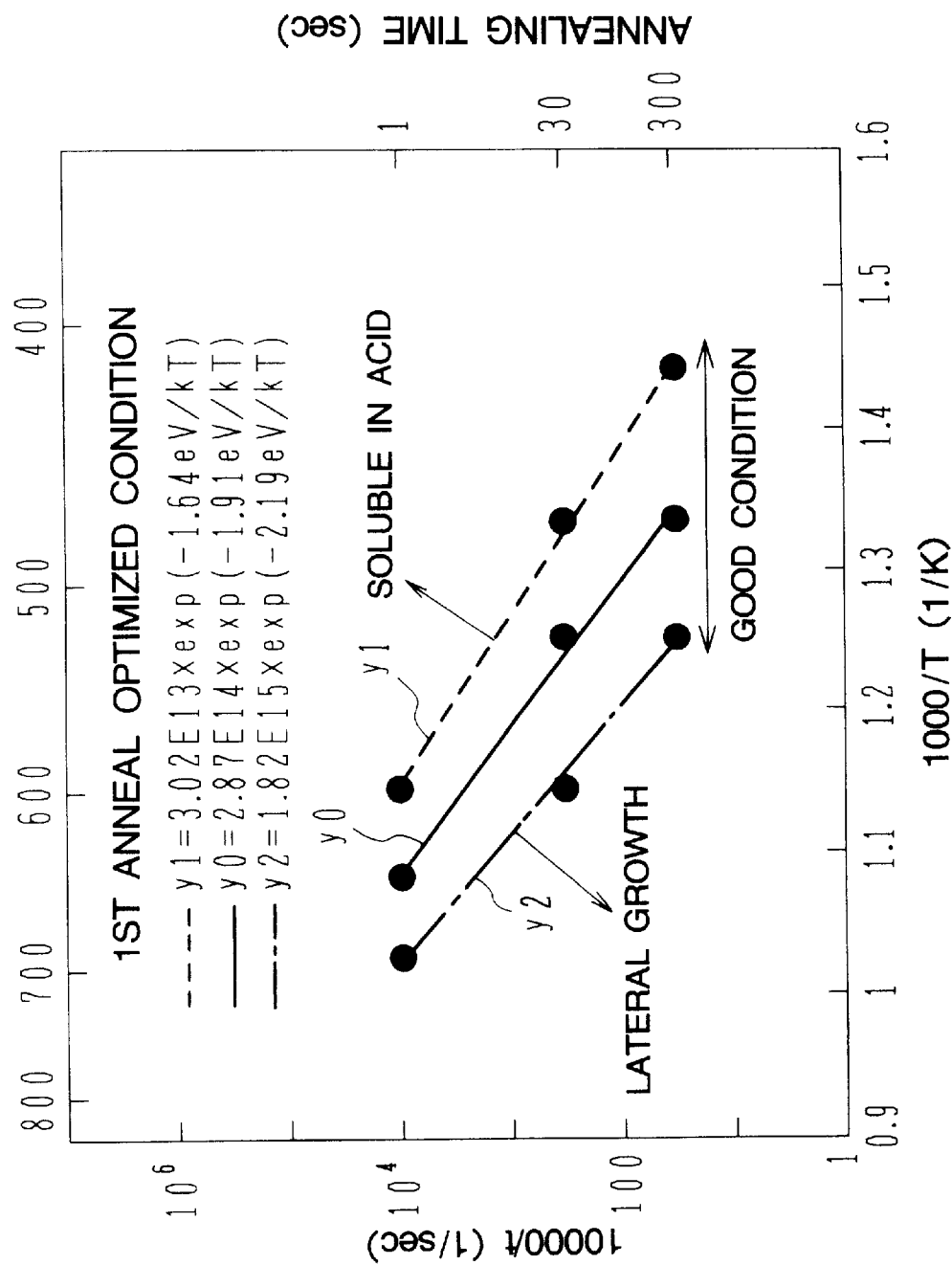
FIG. 34 is a graph showing a relationship between an optimum first heat treatment time and an optimum first heat treatment temperature.

FIG. 34 is a graph obtained through transformation of the graph shown in FIG. 33. The abscissa represents an inverse 1000/T of a first heat treatment temperature T in unit of 1/K, and the ordinate represents an inverse 1000/t of a first heat treatment time t in unit of 1/second. The abscissa is a linear scale, and the ordinate is a logarithmic scale. With such units, the curve p1 shown in FIG. 33 becomes a straight line y1, and the curve p2 becomes a straight line y2, which are given by:

$$y1=3.02\times10^{13}\times\exp[-1.64 \text{ eV}/kT]$$

$$y2=1.82\times10^{15}\times\exp[-2.19 \text{ eV}/kT]$$

The optimum condition at the middle of the two straight lines is given by:

$$y0=2.87\times10^{14}\times\exp[-1.91 \text{ eV}/kT]$$

At the region lower than the straight line y1, there occurs a phenomenon that a silicide film creeps up along a field oxide film. At the region upper than the straight line y2, there is a great danger that a silicide film is dissolved by an acid treatment after the first heat treatment. The above conditions may change with the thickness of a Co film when it is completely silicidated. The change may be estimated qualitatively and may be easily confirmed experimentally.

By performing the second heat treatment after the first heat treatment under the above proper conditions in order to convert CoSi into $CoSi_2$, a silicide film of a low resistance can be formed.

It has been found, however, that depending upon the conditions of the second heat treatment, junction leak current at the impurity doped region becomes as high as not negligible or the gate breakdown voltage of the insulated gate electrode becomes insufficient, even if the silicide film has a sufficiently low resistance. In order to study the conditions of the second heat treatment, the inventors conducted experiments described in the following.

Figure 37A:
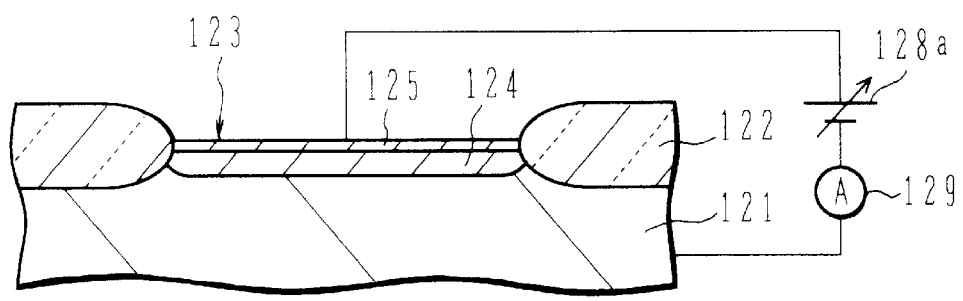
FIGS. 37A and 37B are cross sectional views showing the structures of samples used for the experiments of the second heat treatment.
Figure 37B:
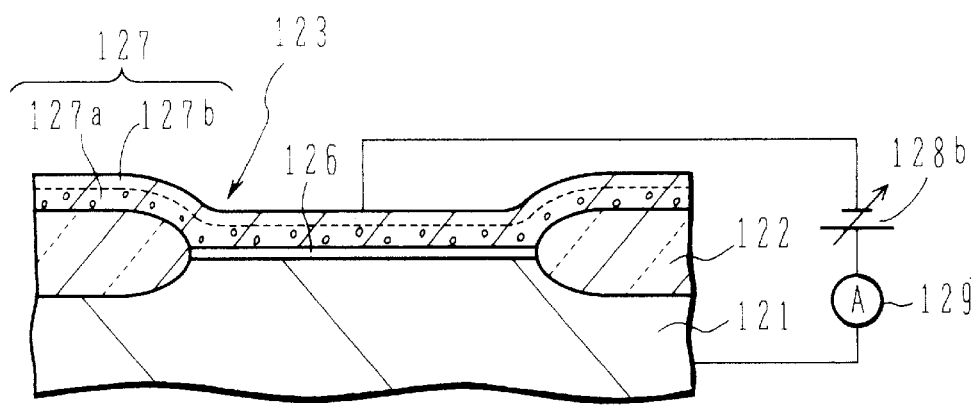

FIGS. 37A and 37B are schematic diagrams showing the structures of samples measured in the experiments.

FIG. 37A shows the structure of a sample used for measuring leak current at a p-n junction. A local field oxide film 122 was formed on the surface of a p-type Si substrate 121 to define an active region. The thickness of the local field oxide film 122 was about 250 nm, and the area of the active region 123 was 320 $\mu$m square. Arsenic (As) ions were implanted into the Si region exposed at the surface of the active region 123 under the conditions of an acceleration voltage of 40 keV and a dose of $2\times10^{15}$ cm$^{-2}$ and activated to form an n-type region 124 of about 0.1 $\mu$m thick. A Co film and a TiN film were deposited on the surface of the n-type region 124 under various salicidation conditions to form a Co salicide film 125. A reverse bias voltage source 128a and an ammeter 129 were connected between the Co salicide film 125 and p-type substrate 121. Leak current at the p-n junction was measured at variously applied reverse voltages.

FIG. 37B is a schematic diagram showing the structure of a sample used for measuring a gate breakdown voltage of an insulated gate electrode. This sample was fabricated on the same wafer as the sample used for measuring p-n junction leak current. The processes up to forming a local field oxide film 122 on the p-type Si substrate were the same as described with FIG. 37A. For this sample, a gate oxide film 126 of about 6 nm thick was formed by thermally oxidizing the surface of an active region 123. A polycrystalline silicon film 127 of about 180 nm thick was deposited on the substrate surface, and a Co film and a TiN film were deposited on the surface of the polycrystalline silicon film 127 under various silicidation conditions to form a Co silicide film 127b. The polycrystalline silicon film 127a and Co silicide film 127b constitute a conductive layer 127 of the gate electrode. A forward bias voltage source 128b and an ammeter 129 were connected between the gate electrode 127 and p-type substrate 121. Breakdown voltage of the gate oxide film 126 was measured at variously applied forward voltages.

FIGS. 38A to 38F show the leak current characteristics at p-n junctions measured by using the samples having the structure shown in FIG. 37A. In each graph shown in FIGS. 38A to 38F, the abscissa represents an applied voltage and indicates 2 V per one division. Therefore, the full scale of the abscissa indicates an applied voltage of 15 V. The ordinate represents a reverse current through the p-n junction in a logarithmic scale, the lowest gradation representing 1 pA, and the highest gradation representing 10 nA.

Figure 38A:
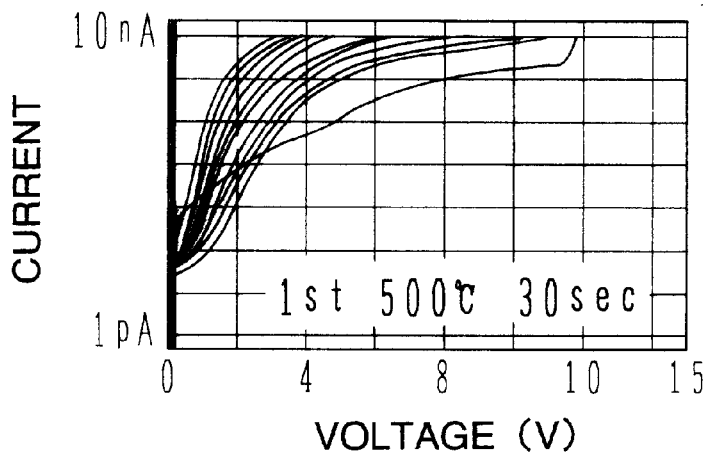
FIGS. 38A to 38F are graphs showing the measurement results of the leak current characteristics of p-n junctions.
Figure 38B:
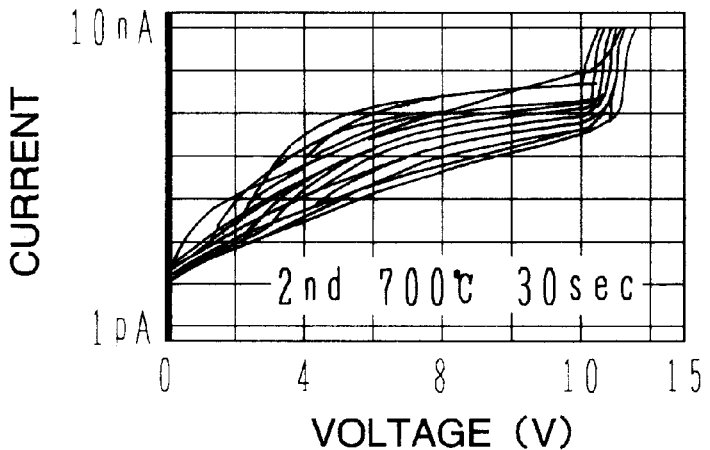
Figure 38C:
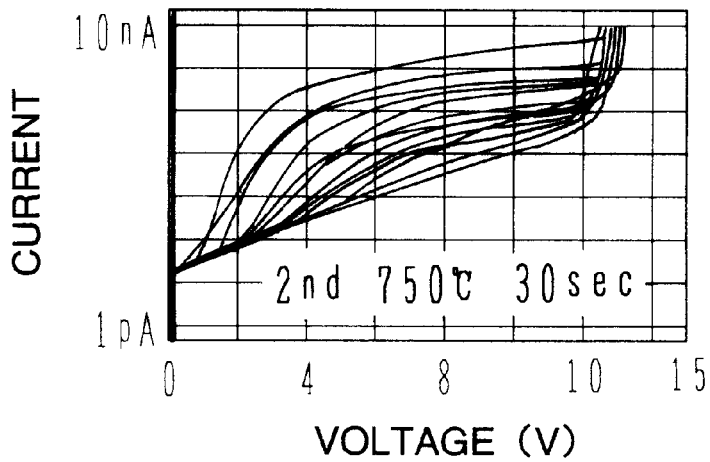

The data shown in FIG. 38A indicates the leak current characteristics of samples subjected to the first (RTA) anneal at about 500° C. for about 30 seconds for forming the Co salicide film. Under these conditions, almost all samples had large leak current and the characteristics of p-n junctions were bad. It can be considered therefore that the p-n junction of a sample after the first heat treatment allows a large amount of leak current to flow.

Samples subjected to the first heat treatment underwent the second heat treatment under different conditions. The data shown in FIGS. 38B and 38C indicates the leak current characteristics of samples subjected to the second thermal anneal (RTA) for about 30 seconds. For the samples of FIG. 38B, the second heat treatment was performed at 700° C., and for the samples of FIG. 38C, the second heat treatment was performed at 750° C. Almost all samples allowed a large amount of leak current to flow and the satisfactory results were not obtained.

Figure 38D:
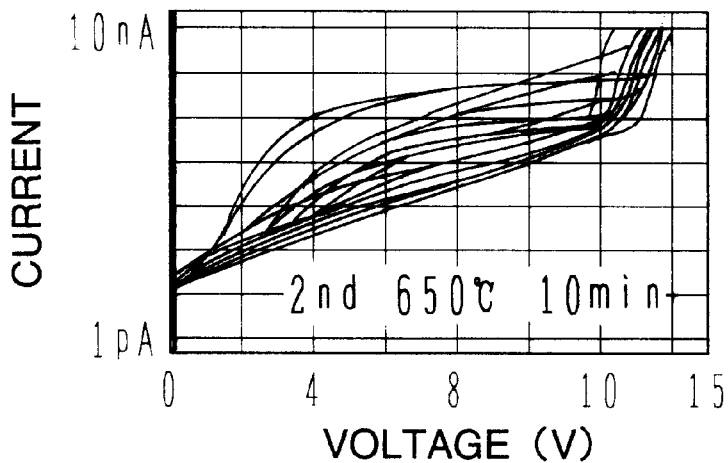
Figure 38E:
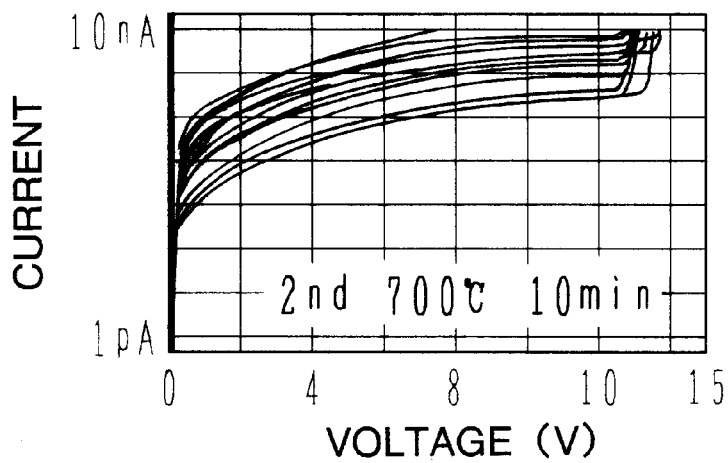
Figure 38F:
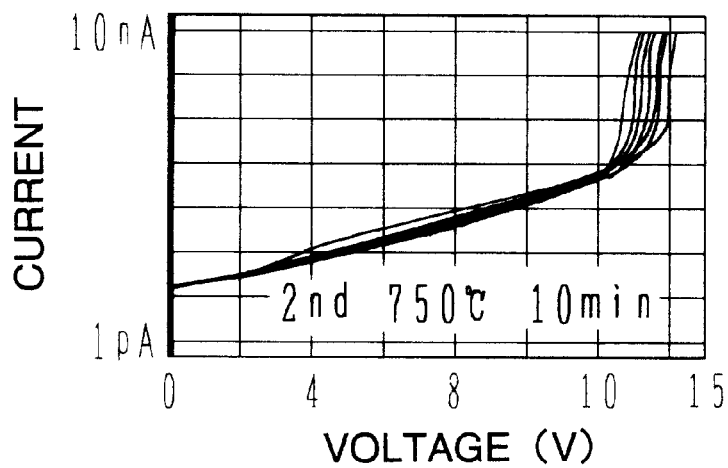

The data shown in FIGS. 38D, 38E, and 38F indicates the leak current characteristics of samples subjected to the second thermal anneal for 10 minutes. For the samples of FIG. 38D, the second heat treatment was performed at 650° C., for the samples of FIG. 38E, it was performed at 700° C., and for the samples of FIG. 38F, it was performed at 750° C.

The data shown in FIGS. 38D and 38E still indicate large leak current and show unsatisfactory results.

The data shown in FIG. 38F indicate the stable characteristics and sufficiently reduced leak current. The satisfactory results can therefore be obtained under the second heat treatment conditions of 750° C. and 10 minutes, although the conditions of 700° C. and 10 minutes are insufficient.

At a higher temperature and/or a longer time of the second heat treatment, leak current through the p-n junction was suppressed sufficiently small.

Figure 42:
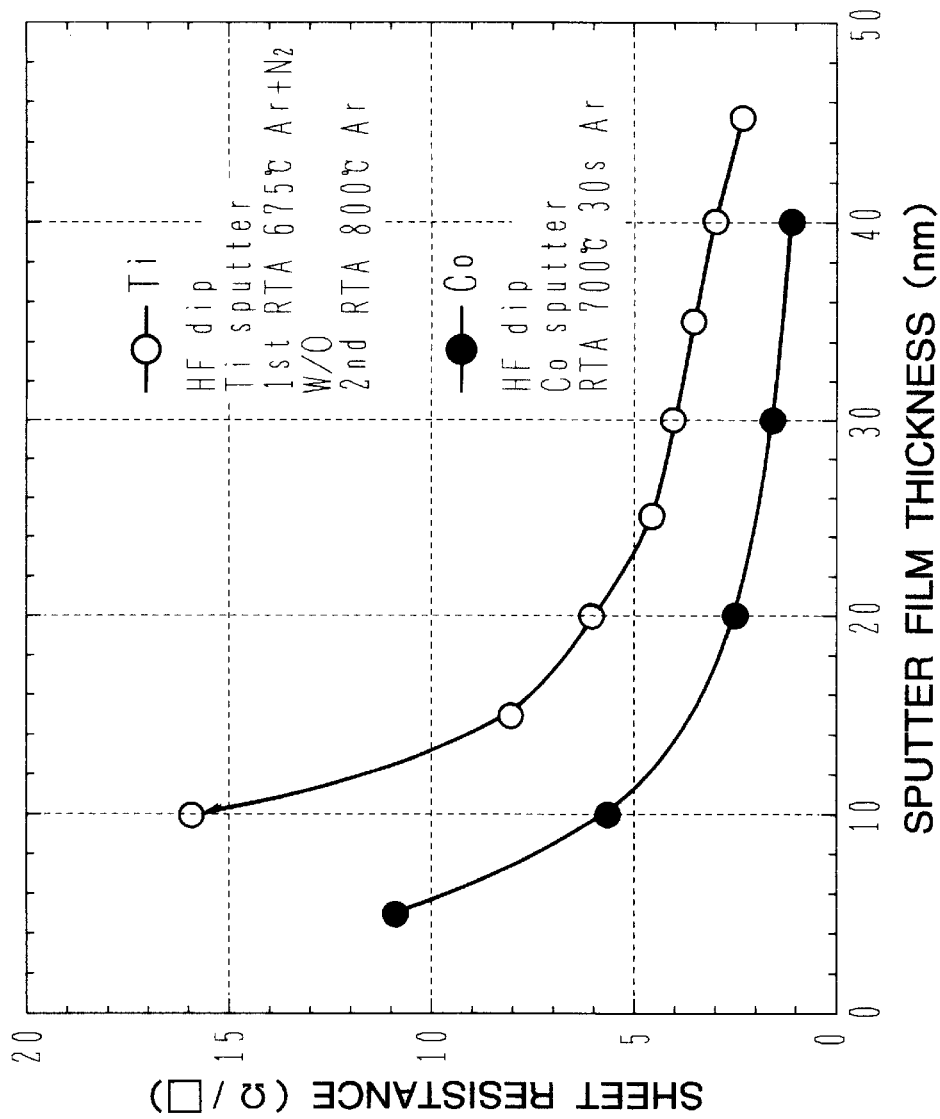
FIG. 42 is a graph showing a relationship between a sheet resistance and a sputter film thickness.

FIG. 42 is a graph showing a relationship between a thickness of a sputter film and a resistance after silicidation. The abscissa represents the film thickness in the unit of nm, and the ordinate represents a sheet resistance in the unit of $\Omega/\square$. A solid circle indicates the data of a Co sputter film, and a white circle indicates the data of a Ti sputter film.

As a Co sputter film becomes thinner than 40 nm, the sheet resistance gradually increases. As the Co sputter film becomes thinner than 20 nm in particular, the sheet resistance increases greatly. In order to obtain a silicide film having a lower resistance, it is preferable to make the sputter film thick.

For the comparison, the sheet resistance of a Ti film is also shown. The Ti sputter film has a higher sheet resistance than the Co sputter film having the same thickness.

Figure 43:
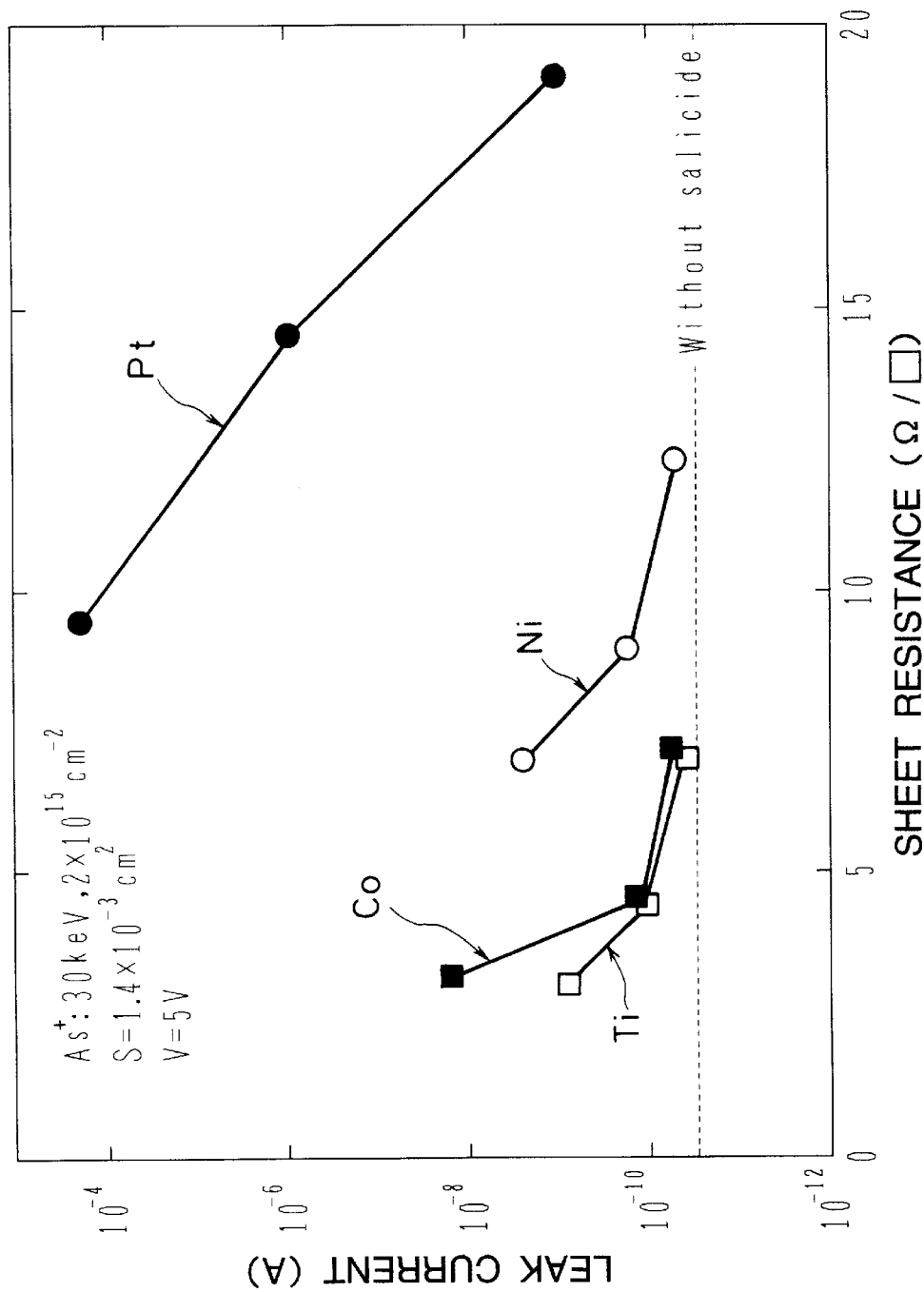
FIG. 43 is a graph showing a relationship between a leak current and a sheet resistance.

FIG. 43 is a graph showing a relationship between the sheet resistances of silicide films and leak current of the source/drain region. A broken line indicates leak current without a silicide film. As the sheet resistance of a Co silicide film becomes lower than about 7 $\Omega/\square$, leak current increases. As the sheet resistance becomes lower than 5 $\Omega/\square$ in particular, the leak current increases greatly. For example, if the sheet resistance is 3 $\Omega/\square$, the leak current increases by one digit as compared to the leak current without a silicide film.

Ti, Ni, and Pt silicide films are also shown in FIG. 43. As shown, leak current is relatively small in the case of a Ti silicide film. Leak current increases at higher sheet resistances in the case of Ni and Pt silicide films.

Although the sheet resistance of a source/drain region is preferably low if a shallow junction is to be formed, leak current increases if silicidation makes the sheet resistance too low. If the leak current is to be set in an allowable range, the Co film cannot be made too thick. In order to satisfy the conditions of both a low sheet resistance and a small leak current, the thickness is preferably set in a range from 5 to 15 nm.

FIGS. 39A to 39H show the leak (breakdown voltage) characteristics of an insulated gate electrode measured by using the samples having the structure shown in FIG. 37B. In each graph shown in FIGS. 39A to 39H, the abscissa represents an applied voltage and indicates 1 V per one division. Therefore, the full scale of the abscissa indicates an applied voltage of 10 V. The ordinate represents leak current of an insulated gate electrode in a logarithmic scale, the lowest gradation representing 1 pA, and the highest gradation representing 10 nA.

Figure 39A:
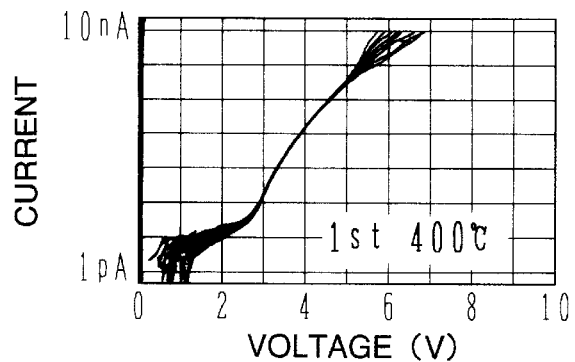
FIGS. 39A to 39H are graphs showing the measurement results of the breakdown voltage characteristics of insulated gate electrodes.
Figure 39B:
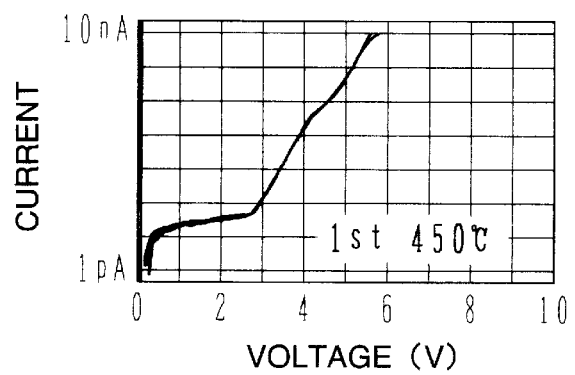
Figure 39C:
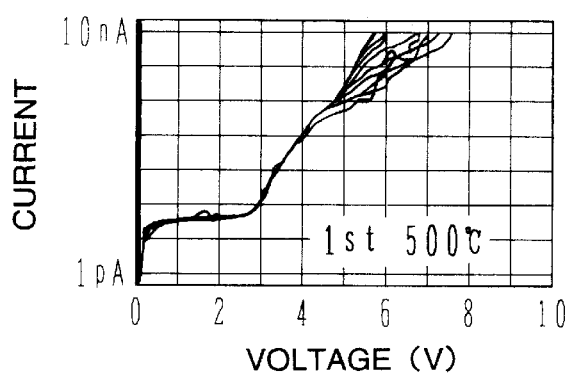
Figure 39D:
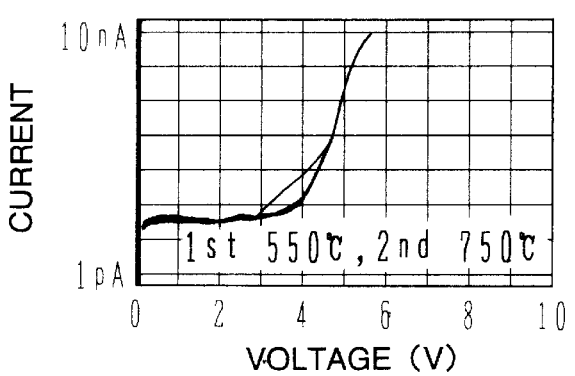
Figure 39E:
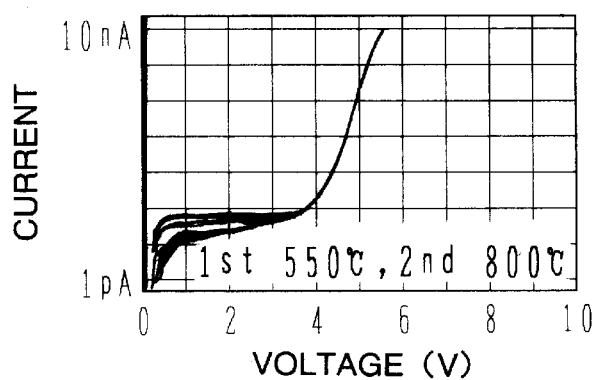
Figure 39F:
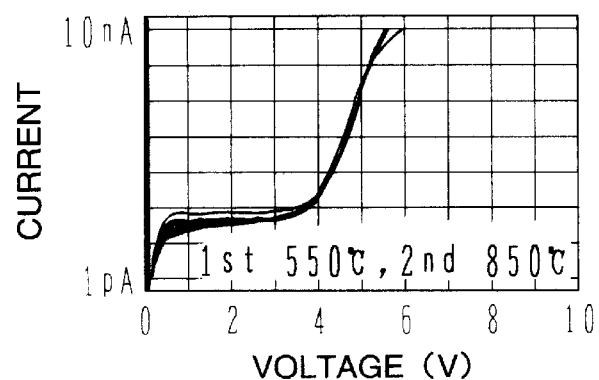
Figure 39G:
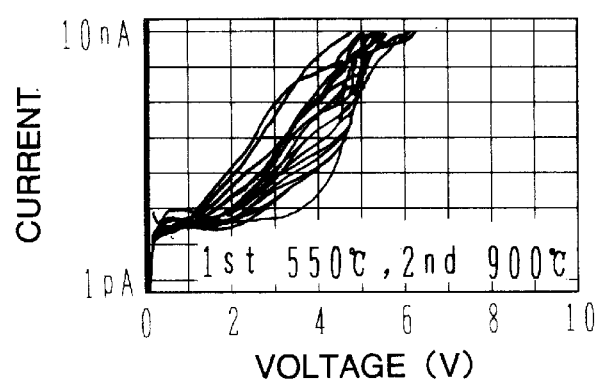
Figure 39H:
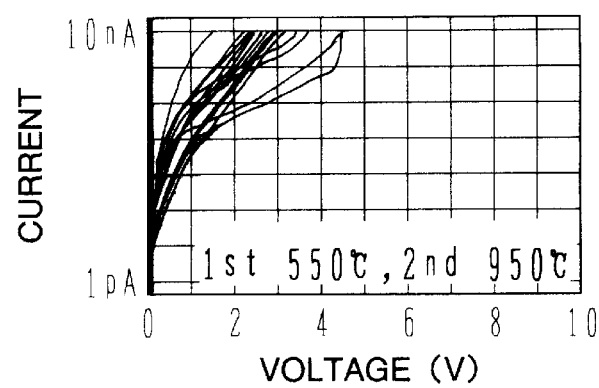

The data shown in FIGS. 39A, 39B, and 39C indicates the characteristics of samples subjected to the first silicidation heat treatment (RTA) for 30 seconds. The data shown in FIG. 39A was obtained at 400° C. of the first heat treatment, and the data shown in FIGS. 39B and 39C was obtained at 450° C. and 500° C. of the first heat treatment.

Since a rated voltage of the gate electrode 2 is assumed to be 2.5 V, it is necessary for the leak characteristics to be stable up to about 2.5 V.

The characteristics of samples of insulated gate electrodes after the first heat treatment are generally satisfactory. However, the second heat treatment is necessary because a silicide film having a sufficiently low resistance cannot be formed only by the first heat treatment.

The data shown in FIGS. 39D to 39H indicates the characteristics of insulated gate electrodes after the second heat treatment. The data shown in FIGS. 39D, 39E, 39F, 39G, and 39H was obtained by the first heat treatment at about 550° C. for 30 seconds and by the second heat treatment for 30 seconds at 750° C., 800° C., 850° C., 900° C., and 950° C., respectively. The data shown in FIGS. 39D, 39E, and 39F indicates that the gate breakdown voltages of insulated gate electrodes are better than that after the first heat treatment. However, the data shown in FIGS. 39G and 39H indicates insufficient gate breakdown voltages. The data shown in FIG. 39H in particular indicates that the breakdown voltages of insulated gate electrodes are almost zero.

From the above measurements, it can be understood that the breakdown voltage of an insulated gate electrode is lost if the second heat treatment is performed at too high a temperature.

The inventors have studied why the phenomena indicated in FIGS. 38A to 38F and FIGS. 39A to 39H occur.

Figure 40A:
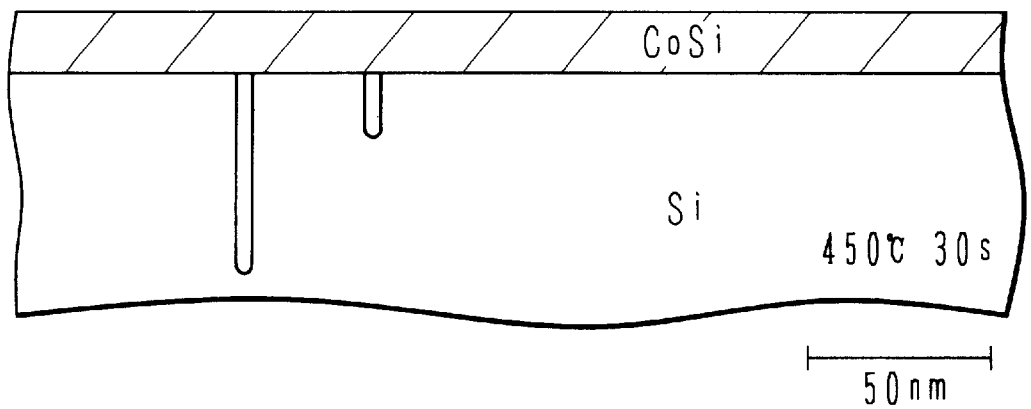
FIGS. 40A to 40C are sketches taken from photographs, showing the cross sections of a thin film, illustrating a formation of a projecting spike and an extinction thereof.
Figure 40B:
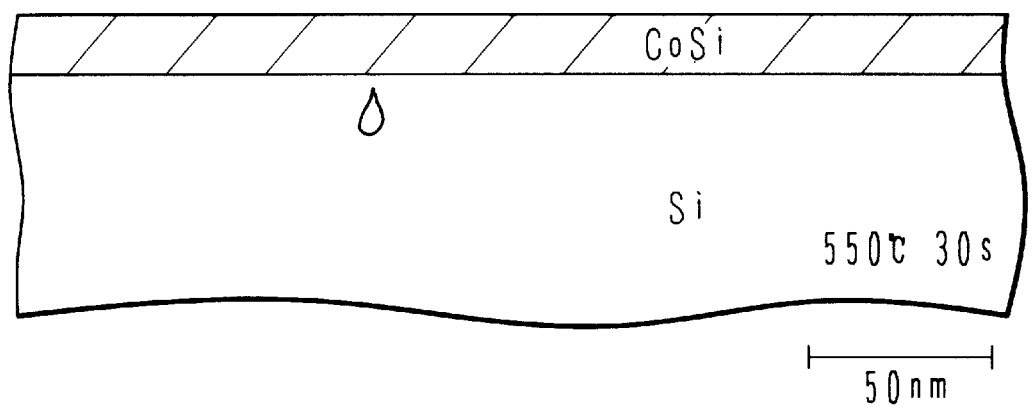
Figure 40C:
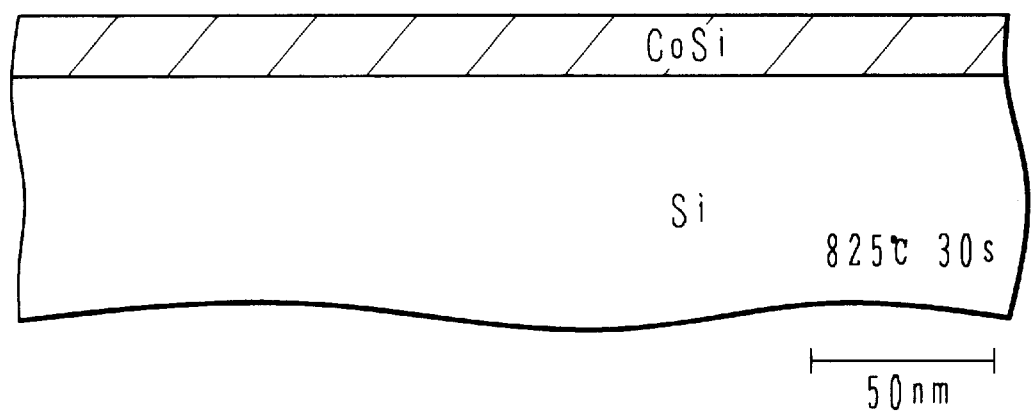

FIGS. 40A to 40C are sketches of transmission type electron microscope images, showing the cross sections of thin film samples obtained by forming a Co film on the Si surface and performing heat treatment thereon. FIG. 40A is a sketch of a sample subjected to a heat treatment at 450° C. for 30 seconds, and FIGS. 40B and 40C are sketches of samples subjected to heat treatments at 550° C. for 30 seconds and at 825° C. for 30 seconds.

As shown in FIG. 40A, a spike can be observed projecting from a CoSi film on the Si surface into the Si substrate. It was confirmed that the projecting spike contained Co. The length of the projecting spike was 50 to 100 nm and the diameter was about 10 nm.

The sketch shown in FIG. 40B does not show the projecting spike, but a shrunk solid near a sphere can be observed. The photograph shown in FIG. 40C shows neither the projecting spike nor the spherical solid.

As above, the heat treatment at 450° C. is likely to form a projecting spike containing Co. However, at a temperature of 500° C. or higher, it can be considered that the projecting spike shrinks and at a further higher temperature it becomes extinct.

If the depth of a p-n junction is about 100 nm or less, the p-n junction traverses the projecting spike. If the projecting spike is conductive, leak current flows through the p-n junction. The high temperature treatment shrinks the projecting spike and extinguishes it. This phenomenon can be supposed that Co diffuses and the projecting spike gradually extinguishes.

The data shown in FIGS. 38A to 38F can be clarified on the assumption that this projecting spike is formed while CoSi is formed. Specifically, although a large leak current flows in the sample after the first anneal because of projecting spikes, this leak current gradually reduces as a higher temperature heat treatment is further performed.

The measurement results shown in FIGS. 39A to 39H can be reasoned as in the following.

Although the high temperature second heat treatment improved the characteristics of a p-n Junction, the heat treatment at too high a temperature make Co in the suicide film diffuse and reach the gate oxide film. As Co diffuses into the gate oxide film, the gate breakdown voltage lowers and leak current flows through the insulated gate electrode.

Figure 41:
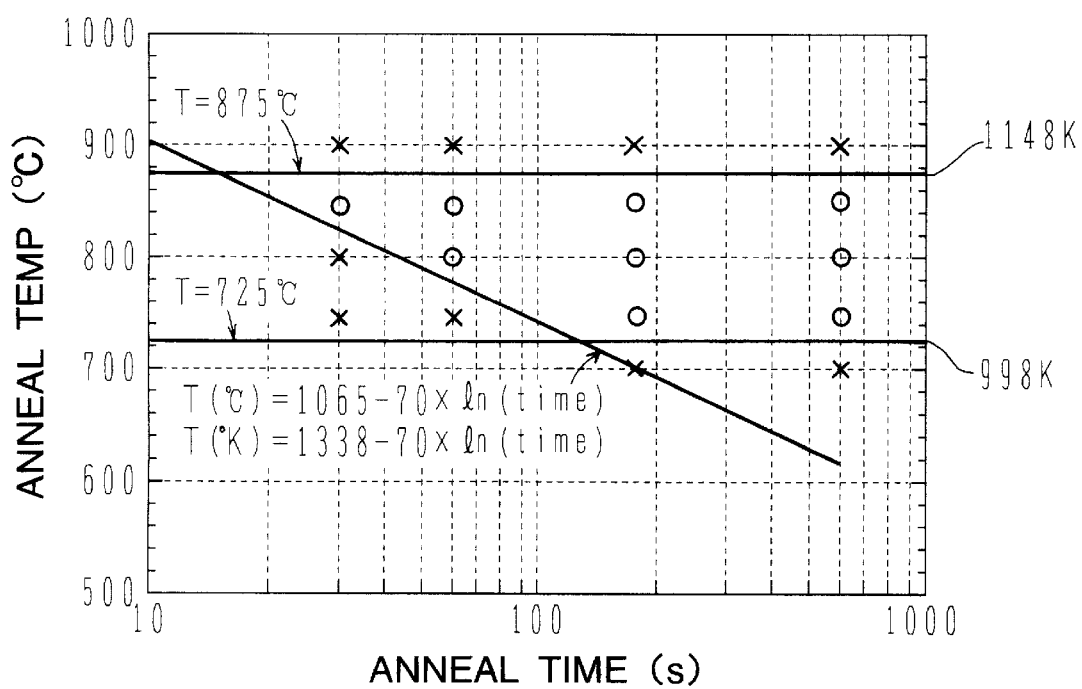
FIG. 41 is a graph showing the range of the proper conditions of the second heat treatment.

FIG. 41 shows the measurement results of leak current of a p-n junction and a breakdown voltage of an insulating gate electrode. The abscissa represents a time of the second heat treatment in unit of second, and the ordinate represents a temperature of the second heat treatment in unit of ° C. In FIG. 41, a circle represents a sample which got a pass in both the measurements, and a cross represents a sample which got a fail in one of the measurements. Namely, although the satisfactory results were obtained in the region surrounded by solid lines, they were not obtained in the regions above and under the horizontal solid lines. Also, they were not obtained in the region under the lower horizontal solid line. In the region under the lower solid lines, leak current of the p-n junction becomes large as shown in FIGS. 38A to 38F. In the region above the upper solid line, the breakdown voltage of the insulated gate electrode lowers and leak current of the insulated gate electrode increases as shown in FIGS. 39A to 39H.

The region where the satisfactory characteristics shown in FIG. 41 are obtained can be mathematically formulated as in the following.

$725° C. \leq T \leq 875° C.$ and $T \geq 1065 - 70 \cdot ln(t) (° C.)$ where T is a temperature (° C.) and $t$ is a time (second). By representing the temperature by an absolute temperature, the formula are transformed into:

$998° K. \leq T \leq 1148° K.$ and $T \geq 1338 - 70 \cdot ln(t) (° K.)$

By selecting the conditions of the first and second heat treatments for silicifying Co with reference to the above experiment results, an insulated gate and an impurity doped region having good characteristics can be formed.

The RTA system used for the above experiments is a customized laboratory equipment manufactured by Koyo-Lindbergh Ltd. eight years ago. A temperature monitor is a Chromel-Alumel thermocouple of 0.5 mm diameter. This thermocouple has a temperature limit of 870° C. and the temperature controllability of the RTA system is not so good.

Figure 44B:
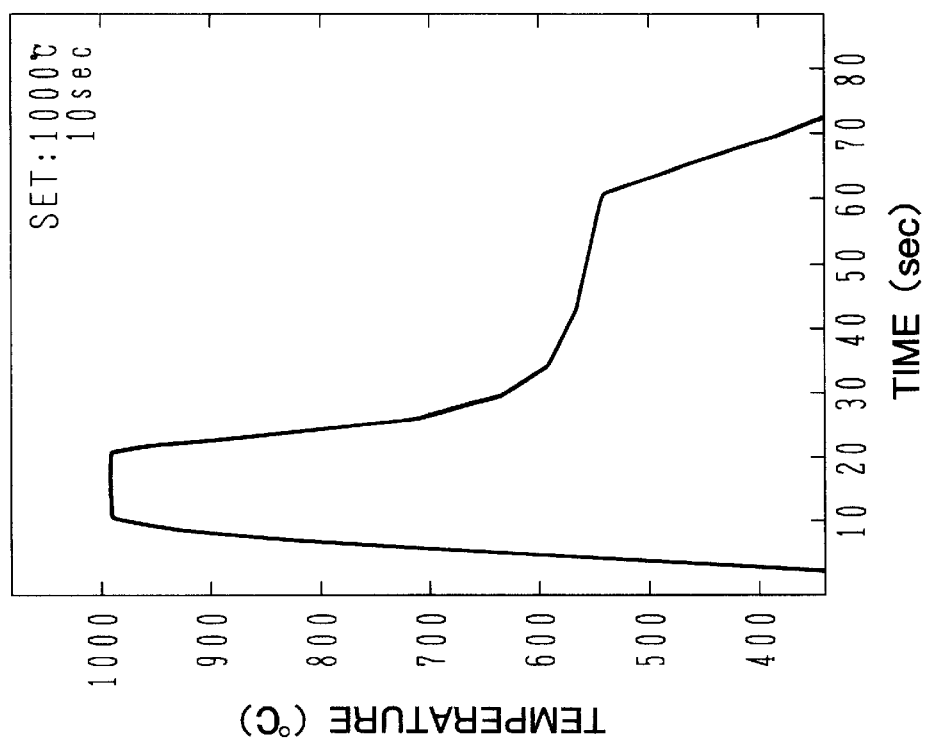
FIGS. 44A and 44B are graphs showing the heating characteristics of an RTA system.
Figure 44A:
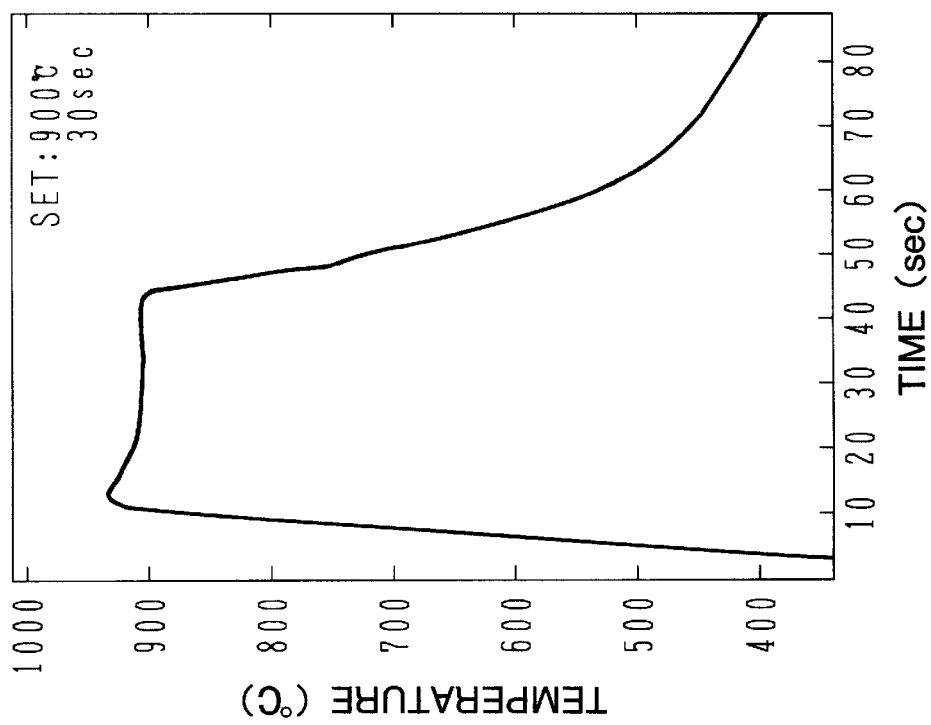

FIG. 44A is a graph showing a temperature change at the settings of a heating temperature of 900° C. and a heating time of 30 seconds. As seen from the graph, in initial several seconds, an overshoot occurs exceeding the set temperature. The temperature at the peak is higher than the set temperature by about 20° C. The heating time is also somewhat longer than the set time.

A mass production RTA system was installed which was manufactured by Dainippon Screen Manufacturing Co. Ltd. and has a product name LAW. This mass production RTA system has an excellent temperature controllability. A precision of the heating temperature is within +/−1° C.

FIG. 44B is a graph showing a temperature change of the mass production RTA system at the settings of a heating temperature of 1000° C. and a heating time of 10 seconds. As seen from the graph, the heating temperature rises quickly and reaches the set temperature at a precision of +/−1° C. or higher without any overshoot. A precision of the heating time is also high. These characteristics were measured at the time of installing the RTA system. Also at present, the temperature precision maintains +/−1° C. or higher. An excellent precision can be obtained also at the settings of a heating temperature of 900° C. and a heating time of 30 seconds.

The temperature monitor of the mass production RTA system monitors infrared rays radiated from a rear substrate surface. Therefore, there is no aged deterioration of the temperature monitor as in a Chromel-Alumel thermocouple. Annealing for 30 seconds or shorter and/or at 900° C. or higher can be performed at high precision by using this mass production RTA system.

The experiments similar to those illustrated in FIG. 37A were conducted more extensively by using this mass production RTA system.

Figure 45A:
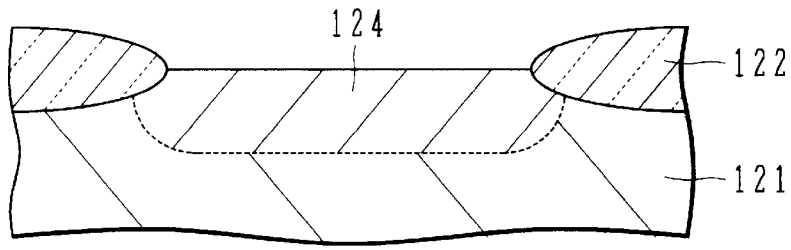
FIGS. 45A to 45D are cross sectional views illustrating the processes of forming a sample.

FIGS. 45A to 45D illustrate the processes of forming a sample. As shown in FIG. 45A, the surface of a Si substrate 121 was subjected to a LOCOS oxidation process to form a field oxide film 122 which defined an active region of 320 µm square. After ion implantation for forming a well and a channel, As$^+$ ions were implanted under the conditions of an acceleration energy of 40 keV and a does of $2 \times 10^{15}$ cm$^{-2}$ to form an ion doped region 124 corresponding to a source/drain. The depth of the p-n junction was 0.1 µm.

Figure 45B:
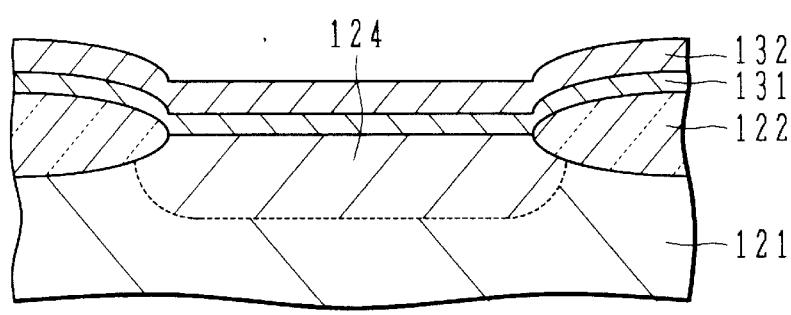

As shown in FIG. 45B, after the substrate surface was processed with HF, a Co film 131 of 10 nm thick and a TiN film 132 of 30 nm thick were deposited through sputtering. Thereafter, silicidation was performed by the two-step anneal process similar to the process described previously.

Figure 45C:
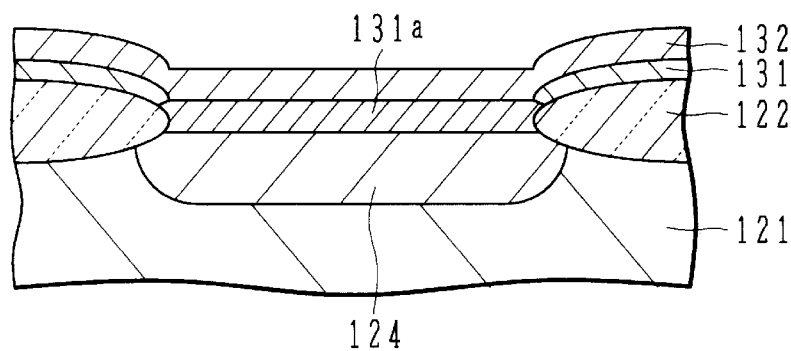

FIG. 45C illustrates the first heat treatment process. The first heat treatment was performed by an RTA process at a heating temperature of 550° C. and a heating time of 30 seconds. It can be expected that the Co film 131 reacts with the Si substrate and changes to a $Co_2Si$ or CoSi film 131*a*. Thereafter, the TiN film 132 and unreacted Co film 131 ware washed out.

Figure 45D:
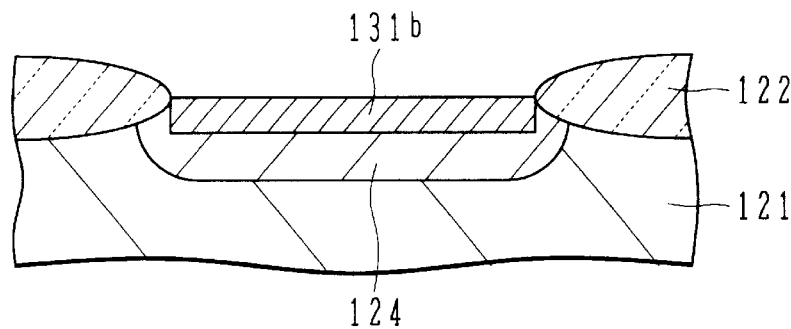

FIG. 45D illustrates the second heat treatment process. The second heat treatment is a process of changing the Co$_2$Si or CoSi silicide film 131a to a CoSi$_2$ silicide film 131b. As the conditions of the second heat treatment, the heating time was changed in the range from 10 seconds to 10 minutes and the heating temperature was changed in the range from 700° C. to 950° C. Twenty five samples were measured at each of the measurement conditions. Leak current was measured with the measurement system shown in FIG. 37A.

Figure 46:
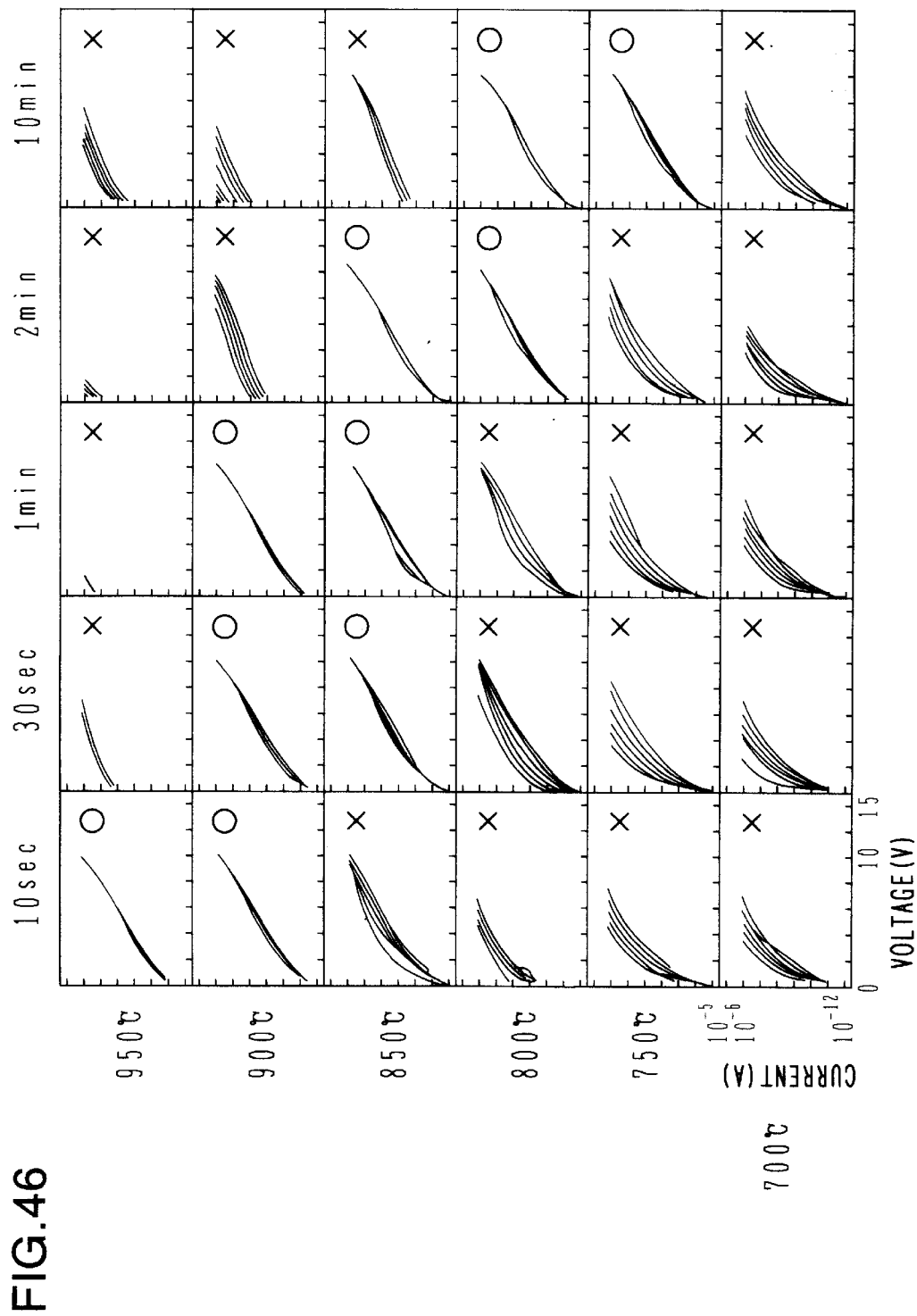
FIG. 46 is a graph showing the results of leak current measurements.

FIG. 46 shows changes in leak current under the second heat treatment conditions. In FIG. 46, the abscissa represents an applied voltage and indicates 2 V per one division. The ordinate represents leak current in a logarithmic scale, the lowest gradation representing $10^{-12}$ A, and the highest gradation representing $10^{-6}$ A. The vertical column uses the same heating time, and the horizontal row uses the same heating temperature. The heating times are 10 seconds, 30 seconds, 1 minute, 2 minutes, and 10 minutes, and the heating temperatures are 700° C., 750° C., 800° C., 850° C., 900° C., and 950° C.

Samples having large leak current at a low applied voltage and samples having a variation in characteristics under the same conditions, are not satisfactory. In FIG. 46, a circle represents a satisfactory sample and a cross represents an unsatisfactory sample.

For example, under the condition of a heating time of 30 seconds, leak current at the heating temperatures of 850° C. and 900° C. is satisfactory. Under the condition of a heating time of 10 seconds, leak current at the heating temperatures of 900° C. and 950° C. is satisfactory.

As the heating time is prolonged, an optimum heating temperature gradually lowers. At the heating time of 10 minutes, leak current at the heating temperatures of 750° C. and 800° C. is satisfactory.

The conditions leading to unsatisfactory results exist under and above the condition leading to satisfactory results. Under the condition (lower heating temperature) below the condition leading to a satisfactory sample, it is supposed that leak current through a CoSi spike flows. Under the condition (higher heating temperature) above the condition leading to a satisfactory sample, it is supposed that Co atoms diffuse from the Co silicide layer into semiconductor and leak current flows uniformly over the whole area of the pn junction. This tendency is supposed to be common in all conditions shown in FIG. 46.

Figure 47:
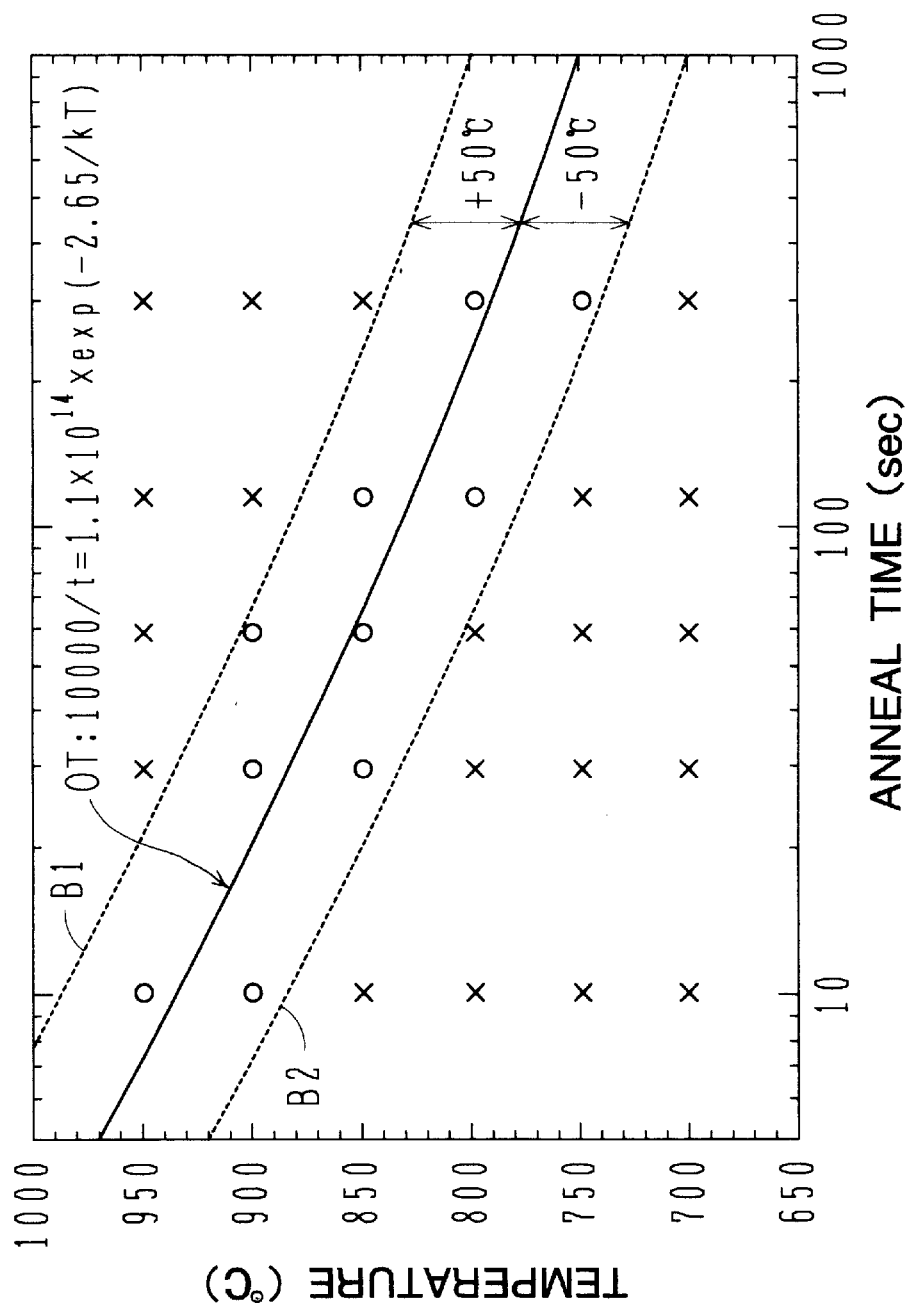
FIG. 47 is a graph showing the results of leak current measurements as a relationship between a heating temperature and a heating time.

FIG. 47 is a graph summarizing the experiment results shown in FIG. 46. The abscissa represents an anneal time in unit of second, and the ordinate represents a heating time in unit of ° C. The condition leading to a satisfactory low leak current is indicated by a hollow circle and the condition leading to an unsatisfactory high leak current is indicated by a cross. As seen from this graph, the second heat treatment conditions include an optimum condition OT leading to a most satisfactory sample indicated by a solid line and the boundary conditions B1 and B2 leading to a satisfactory sample indicated by broken lines.

Figure 48:
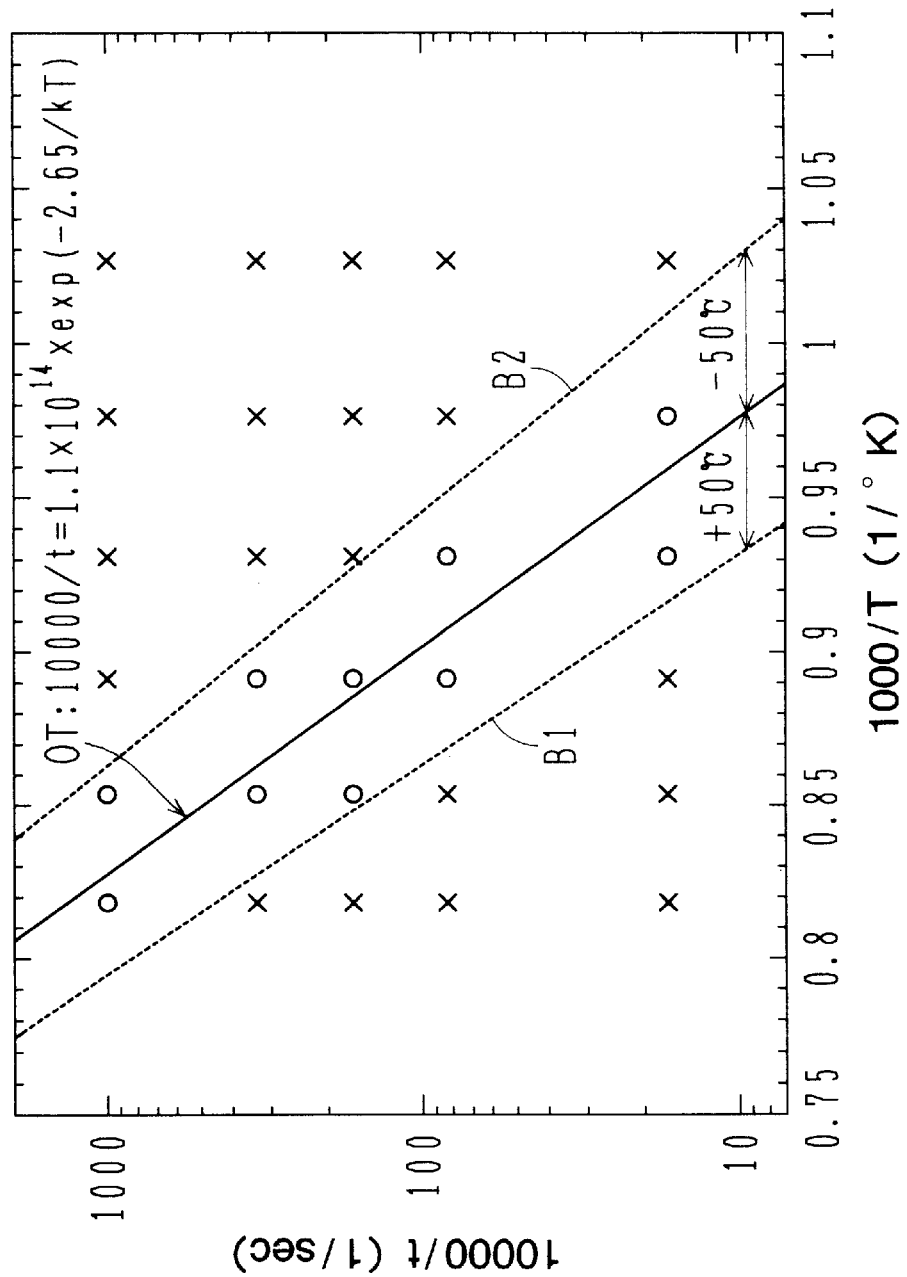
FIG. 48 is a graph obtained by converting the plots of FIG. 47 into Arrhenius plots.

FIG. 48 is a graph obtained by converting the graph shown in FIG. 47 into the Arenius plot in order to qualitatively shows the optimum condition OT and boundary conditions B1 and B2. The abscissa represents a heating temperature T (° K.) in 1000/T(1/K) and the ordinate represents a heating time $\underline{t}$ (sec) in 10000/t(1/sec). In FIG. 48, the circles and crosses have the same meanings as in FIG. 47. As seen from FIG. 48, the optimum condition OT and boundary conditions B1 and B2 are indicated by straight lines. These conditions can be represented by the following equations using activation energy, where $\underline{k}$ represents the Boltzmann's constant.

The optimum condition OT is given by:

$$10000/t = 1.1 \times 10^{14} \times \exp(-2.65/kT) \quad (1)$$

The boundary condition B1 is given by:

$$10000/t = 1.1 \times 10^{14} \exp[-2.65/k(T+50)] \quad (2)$$

The boundary condition B2 is given by:

$$10000/t = 1.1 \times 10^{14} \exp[-2.65/k(T-50)] \quad (3)$$

The second heat treatment at the heating time and temperature satisfying the above conditions can minimize leak current after Co salicidation.

As above, by using the mass production RTA system having a high heating precision, the more systematic results were obtained.

The results shown in FIGS. 38A to 38F, FIGS. 39A to 39H, and FIG. 41 are not meaningless, but they are sufficiently significant if a heat treatment system with a low heating precision, particularly with an overshoot of a heating temperature, is used and an insulated gate is formed on the substrate.

The condition leading to a satisfactory result also depends upon the Co film thickness and the depth of a p-n junction. There is a tendency that the range of the conditions leading to a satisfactory result becomes narrow if the Co film is made thick or the junction depth is made shallow. If the Co film is made thin or the junction depth is made deep, the range of the conditions leading to a satisfactory result becomes broader. The experiment results described above are effective in the Co film thickness range from 8 to 20 nm.

FIGS. 25A to 25D are schematic cross sectional diagrams explaining a method of manufacturing a semiconductor device according to another embodiment of the invention.

Figure 25A:
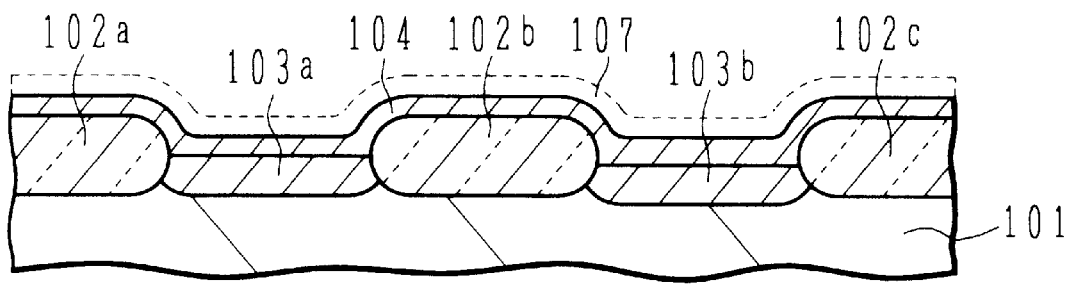
FIGS. 25A to 25D are schematic cross sectional views explaining a method of manufacturing a semiconductor device according another embodiment of the invention.

First, as shown in FIG. 25A, a field oxide film 102 is formed on the surface of an Si substrate 101 by LOCOS. LOCOS may be performed by a conventionally known method such as explained with FIGS. 28A to 28C. If necessary, a gate electrode (wiring) made of a gate oxide film, a silicon gate electrode, and the like, and other structures may be formed on the active region defined by the field oxide film 102.

By using as a mask the gate electrode (wiring), field oxide film, and a resist pattern formed when necessary, ions are implanted to form impurity doped regions 103a and 103b such as source/drain regions in the active regions. As having a small diffusion coefficient is suitable as impurities for forming a shallow n-type region. The n-type region is defined by the field oxide film and insulated gate electrode.

On the Si substrate 101 prepared in the above manner, a Co film 104 is deposited, for example, by sputtering. The Co film 104 may be covered with a TiN film 107 having an oxidation resistant function which may be deposited by sputtering or other processes. As a cap film having such an oxidation resistant function, a W film or a WN film may be used instead of the TiN film.

As described with reference to FIGS. 28A to 28D, the active region such as the impurity doped region 103 is applied with a lateral force by a stress generated when the field oxide film 102 is formed.

Figure 25B:
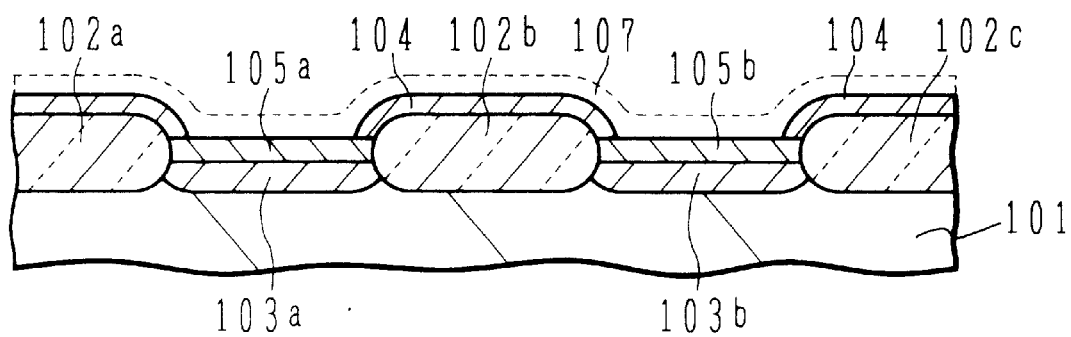

As shown in FIG. 25B, the Si substrate 101 is subjected to the first heat treatment. This first heat treatment temperature is sufficient if it is set to a value satisfying the conditions in the region between the two straight lines y1 and y2 shown in FIG. 34. With this condition, Co and Si react with each other and CoSi (Co$_2$Si) is formed. The condition not to form CoSi$_2$ in the silicide film is also satisfied.

A Co film 104 contacting with the Si surface changes to a Co silicide film 105 by this reaction. In FIG. 25B, a Co silicide film 105a is being formed on an impurity doped region 103a, and another Co silicide film 105b is being formed on another impurity doped region 103b. $CoSi_2$ is not substantially formed in the Co silicide films 105a and 105b.

Figure 25C:
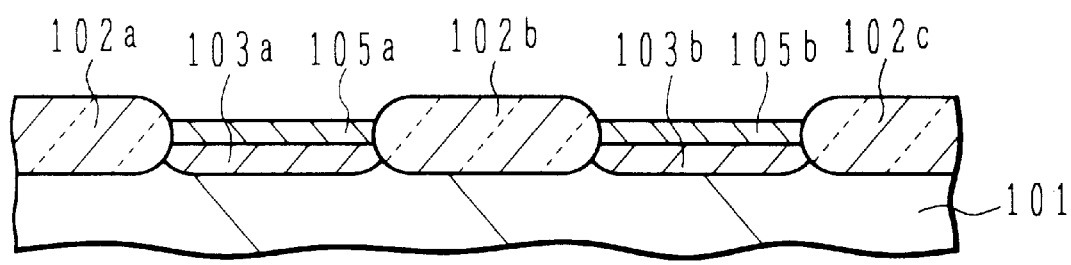

As shown in FIG. 25C, an unreacted Co film 104 left on the field oxide film on the Si substrate 101 subjected to underwent the first heat treatment and the TiN film 107 are washed out. For example, the TiN film 107 may be washed out by $NH_4OH+H_2O_2$. The unreacted Co film 104 may be washed out by $HCl+H_2O_2$ or $H_2SO_4+H_2O_2$.

If As ions are implanted in the regions 103a and 103b at a dose of $5\times10^{15}$ $cm^{-2}$ and the wash-out process is performed by $HCl+H_2O_2$, there is an ample danger of forming $SiO_2$ on the silicide films 105a and 105b to change the silicide films to insulating films. In such a case, if the wash-out process is performed by $H_2SO_4+H_2O_2$, formation of $SiO_2$ can be avoided.

Therefore, if As ions are implanted into the active regions 103a and 103b at a dose of about $3\times10^{15}$ $cm^{-2}$ having a large possibility of forming $SiO_2$, it is preferable to perform the wash-out by $H_2SO_4+H_2O_2$.

Figure 25D:
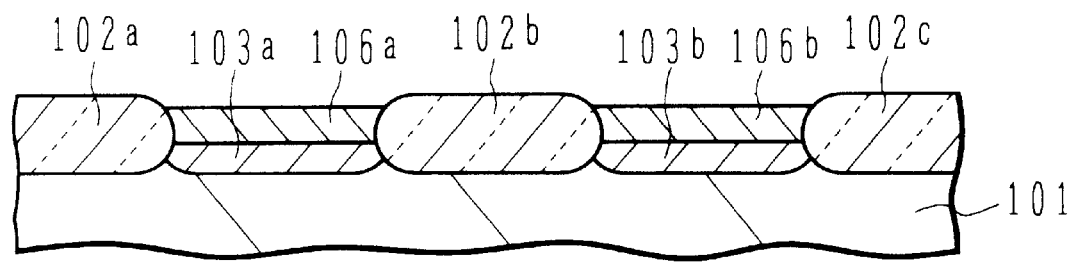

As shown in FIG. 25D, the Si substrate 101 with the unreacted Co film having been washed out is subjected to the second heat treatment to change Co silicide to $CoSi_2$. The second heat treatment is performed under the conditions in the range leading to a satisfactory result shown in FIG. 41 or FIGS. 47 and 48. For example, an RTA process is performed at 800° C. for 3 minutes.

With such a second heat treatment, the silicide films 105a and 105b of CoSi ($Co_2Si$) change to silicide films 106a and 106b of $CoSi_2$. Since the unreacted Co film was removed and there is no Co source, the silicide film is hard to creep up along the field oxide film 102 also at the reaction of changing CoSi to $CoSi_2$. at the first heat treatment.

The present invention has been described in connection with the preferred embodiments. The invention is not limited only to the above embodiments. It is apparent to those skilled in the art that various modifications, improvements, combinations and the like can be made without departing from the scope of the appended claims.

What is claimed is:

1. A method of manufacturing a semiconductor device which comprises the steps of:
    forming an insulated gate structure on a p-type active region of a silicon substrate, said insulated gate structure having a gate length of about 0.3 μm or less and side wall insulating regions;
    implanting arsenic ions in source/drain regions on opposite sides of said insulated gate electrode structure on said substrate at a dose less than $5\times10^{15}$ $cm^{-2}$;
    activating the implanted arsenic to form doped source/drain regions having a junction depth of 0.1 μm or less;
    forming a laminated layer of a Co film having a thickness in a range of 5 to 15 nm and a TiN film covering the Co film, on the surface of said substrate, covering said doped source/drain regions;
    heating said substrate to let said co film react with an underlying Si region of the doped source/drain regions for proceeding with silicidation and form Co-containing spikes which project and allow leak current to flow across the junction;
    removing said TiN film;
    removing unreacted Co film; and
    heating said substrate to further proceed silicidation and let the Co-containing spikes shrink or extinguish.

2. A method according to claim 1, further comprising the step of forming a Ti film before the step of forming the laminate.

3. A method according to claim 1, wherein said step of removing the unreacted Co film includes immersing the substrate in a solution containing sulfuric acid.

4. A method according to claim 1, wherein said step of heating said substrate is done under the first conditions of a temperature and a time selected not to form $CoSi_2$, and to form Co silicide through silicidation reaction between the silicon region of the second conductivity type and the Co film, the method further comprises the step of
    heating the silicon substrate under the second conditions of a temperature and a time to change the Co silicide to $CoSi_2$, the second conditions being 998° K.$\leq$T$\leq$1148° K. and T$\geq$1338−70·ln(t), where T is the temperature in ° K., and t is the time in seconds.

5. A method according to claim 4, wherein said first conditions being y1$\geq$y$\geq$y2, y=$10^4$/t, y1=$3.02\times10^{13}\times$exp[−1.64 eV/kT], and y2=$1.82\times10^{15}\times$exp[−2.19 eV/kT], where T is the temperature in ° K. and t is the time in seconds, and $\underline{k}$ is the Boltzmann's constant.

6. A method according to claim 1, wherein said step of heating said substrate is done under the first conditions of a temperature and a time selected not to form $CoSi_2$, and to form Co silicide through silicidation reaction between the silicon region of the second conductivity type and the Co film, the method further comprises the step of
    heating the silicon substrate under the second conditions to change the Co silicide to $CoSi_2$, the second conditions being B1$\leq$B$\leq$B2, where B=$10^4$/t, t is time in seconds, T is temperature in ° K., B1=$1.1\times10^{14}$ exp[−2.65/k(T+50)], and B2=$1.1\times10^{14}$ exp[−2.65/k(T−50)].

7. A method according to claim 6, wherein said first conditions being y1$\geq$y$\geq$y2, y=$10^4$/t, y1=$3.02\times10^{13}\times$exp[−1.64 eV/kT], and y2=$1.82\times10^{15}\times$exp[−2.19 eV/kT], where T is the temperature in ° K. and $\underline{t}$ is the time in seconds, and $\underline{k}$ is the Boltzmann's constant.

8. A method of manufacturing a semiconductor device which comprises the steps of:
    forming an insulated gate structure on a p-type active region of a silicon substrate, said insulated gate structure having a gate length of 0.3 μm or less and side wall insulating regions;
    implanting arsenic ions in source/drain regions on opposite sides of said insulated gate electrode structure on said substrate at an acceleration energy of 30 keV or less and at a dose of $2\times10^{15}$ $cm^{-2}$ or more;
    activating the implanted arsenic to form doped source/drain regions having a junction depth of 0.1 μm or less;
    forming a laminated layer of a Co film having a thickness in a range of 5 to 15 nm and a TiN film on the surface of said substrate, covering said ion-implanted source/drain regions;
    heating said substrate to let said Co film react with an underlying Si region of the doped source/drain regions for proceeding with silicidation, and form Co-containing spikes which project downward and allow leak current to flow across the junction;
    removing said TiN film;
    removing unreacted Co film; and
    heating said substrate to further proceed silicidation and let the Co-containing spikes shrink or extinguish.

9. A method according to claim 8, wherein said step of removing said unreacted Co film uses a treatment liquid containing sulfuric acid.

10. A method according to claim 8, further including the step of depositing a Ti film before said step of forming a laminated layer of said Co film and said TiN film.

11. A method of manufacturing a semiconductor device which comprises the steps of:

forming a field oxide film on the surface of a silicon substrate for element isolation, the field oxide film defining an active region;

forming an insulated gate structure having a gate length of 0.3 µm or less and side wall insulating regions on said active region of the substrate;

implanting arsenic ions in the surface region of the active region of said silicon substrate defined by said field oxide film and said insulated gate structure and forming a conductive silicon region having a junction depth of 0.1 µm or less;

depositing a Co film having a thickness in a range of 5 to 15 nm on said silicon substrate, covering said conductive silicon region, under the condition that whole area of said surface region defined by said field oxide film and said insulated gate structure is exposed and not covered by an oxide film;

heating said silicon substrate for less than 30 minutes to react said Co film with said conductive silicon region for silicidation, to form Co silicide without forming $CoSi_2$;

removing unreacted Co film; and heating said silicon substrate in an oxygen-free atmosphere to convert said Co silicide to $CoSi_2$.

12. A method according to claim 11, wherein said step of removing said unreacted Co film includes the step of immersing said silicon substrate in solution containing sulfuric acid and hydrogen peroxide.

13. A method according to claim 11, wherein said conductive silicon region is a region in which As ions are implanted at a dose of $3 \times 10^{15}$ cm$^{-2}$ or more.

14. A method according to claim 11, further including the step of depositing a TiN film on said Co film after said step of depositing said Co film.

15. A method according to claim 11, wherein said step of heating the silicon substrate for less than 30 minutes is at T° K. for t seconds, wherein:

$y=10^4/t$;

$y1=3.02 \times 10^{13} \times \exp(-1.64 \text{ eV}/kT)$; and $y2=1.82 \times 10^{15} \times \exp(-2.19 \text{ eV}/kT)$; wherein k is Boltzmann's constant; and $y2 \leq y \leq y1$.

16. A method according to claim 15, further comprises the step of heating the silicon substrate under the second conditions to change the Co silicide to $CoSi_2$, the second conditions being $B1 \leq B \leq B2$, where $B=10^4/t$, t is time in seconds, T is temperature in ° K., $B1=1.1 \times 10^{14} \exp[-2.65/k(T+50)]$, and $B2=1.1 \times 10^{14} \exp[-2.65/k(T-50)]$.

17. A method of manufacturing a semiconductor device comprising the steps of:

forming a field oxide film on the surface of a silicon substrate having a silicon region of a first conductivity type to separate an active region;

implanting ions of a second conductivity type into the surface layer of the Si substrate defined by said field oxide film and forming a silicon region of the second conductivity type in contact with the silicon region of the first conductivity type to form a p-n junction having a junction depth of 0.1 µm or less;

depositing a Co film on the surface of the silicon substrate in a state where the surface of the silicon region of the second conductivity type is exposed adjacent to the field oxide film;

heating the silicon substrate under the first conditions of a temperature and a time selected not to form $CoSi_2$, and to form Co silicide through silicidation reaction between the silicon region of the second conductivity type and the Co film;

removing an unreacted Co film; and heating the silicon substrate under the second conditions of a temperature and a time to change the Co silicide to $CoSi_2$, the second conditions being $998° K. \leq T \leq 1148° K.$ and $T \geq 1338-70 \ln(t)$, where T is the temperature in ° K., and t is the time in seconds.

18. A method according to claim 17, wherein said first conditions being $y1 \geq y \geq y2$, $y=10^4/t$, $y1=3.02 \times 10^{13} \times \exp[-1.64 \text{ eV}/kT]$, and $y2=1.82 \times 10^{15} \times \exp[-2.19 \text{ eV}/kT]$, where T is the temperature in ° K. and t is the time in seconds, and k is the Boltzmann's constant.

19. A method according to claim 17, further comprising the step of depositing a cap film having an oxidation resistant function after said step of depositing the Co film.

20. A method according to claim 17, wherein said step of removing the unreacted Co film includes a step of immersing the silicon substrate into solution containing sulfuric acid and hydrogen peroxide.

21. A method according to claim 17, wherein the silicon region of the second conductivity type is an As ion implanted region having a depth of about 0.1 µm or shallower.

22. A method according to claim 17, further comprising the step of forming an insulated gate electrode on the surface of said active region, before said step of implanting ions, wherein the semiconductor device is a MOS transistor having a gate length of 0.25 µm or shorter, and the deposited Co film has a thickness of 6 to 15 nm.

23. A method according to claim 17, further comprising the step of depositing a Ti film on the silicon substrate before said step of depositing the Co film, the Co film being deposited on the Ti film formed on the silicon substrate.

24. A method of manufacturing a semiconductor device comprising the steps of:

forming a field oxide film on the surface of a silicon substrate having a silicon region of a first conductivity type to separate an active region;

implanting ions of a second conductivity type into the surface layer of the Si substrate defined by said field oxide film and forming a silicon region of the second conductivity type in contact with the silicon region of the first conductivity type to form a p-n junction having a junction depth of 0.1 µm or less;

depositing a Co film on the surface of the silicon substrate in a state where the surface of the silicon region of the second conductivity type is exposed adjacent to the field oxide film;

heating the silicon substrate under the first conditions of a temperature and a time selected not to form $CoSi_2$, but to form Co silicide through silicidation reaction between the silicon region of the second conductivity type and the Co film;

removing an unreacted Co film; and heating the silicon substrate under the second conditions to change the Co silicide to $CoSi_2$, the second conditions being $B1 \leq B \leq B2$, where $B=10^4/t$, t is time in seconds, T is temperature in °K., $B1=1.1\times10^{14}$ exp $(-2.65/k(T+50))$, and $B2=1.1\times10^{14}$ exp $(-2.65/k(T-50)]$.

25. A method according to claim 24, wherein said first conditions being $y1 \geq y \geq y2$, $y=10^4/t$, $y1=3.02\times10^{13}\times\exp[-1.64\,eV/kT]$, and $y2=1.82\times10^{15}\times\exp[-2.19\,eV/kT]$, where T is the temperature in °K. and t is the time in seconds, and k is the Boltzmann's constant.

26. A method according to claim 24, further comprising the step of depositing a cap film having an oxidation resistant function after said step of depositing the Co film.

27. A method according to claim 24, wherein said step of removing the unreacted Co film includes a step of immersing the silicon substrate into solution containing sulfuric acid and hydrogen peroxide.

28. A method according to claim 24, wherein the silicon region of the second conductivity type is an As ion implanted region having a depth of about 0.1 µm or shallower.

29. A method according to claim 24, wherein the semiconductor device is a MOS transistor having a gate length of 0.25 µm or shorter, and the deposited Co film has a thickness of 8 to 20 nm.

30. A method according to claim 24, further comprising the step of depositing a Ti film on the silicon substrate before said step of depositing the Co film, the Co film being deposited on the Ti film formed on the silicon substrate.

31. A method of manufacturing a semiconductor device comprising the steps of:

forming a pn junction having a junction depth of 0.1 micrometer or less, in an active region in a silicon substrate;

depositing a Co layer on the silicon substrate including said active region;

performing a first thermal treatment for reacting Co and Si to form cobalt silicide and to grow Co-containing spikes which allow leak current to flow across the pn junction;

removing unreacted Co with acid liquid;

performing a second thermal treatment for further reacting the cobalt silicide and for making the Co-containing spikes shrink or extinguish.

32. A method of manufacturing a semiconductor device according to claim 31, wherein said second thermal treatment is done under such temperature and time conditions that Co atoms do not diffuse from $CoSi_2$ region.

33. A method of manufacturing a semiconductor device according to claim 32, wherein said second thermal treatment is done under temperature and time condition of:

$B1 \leq B \leq B2$, where $B=10^4/t$, t is time in seconds, T is temperature in °K., $B1=1.1\times10^{14}$ exp $(-2.65/k(T+50))$, and $B2=1.1\times10^{14}$ exp $(-2.65/k\,(T-50))$.

34. A method of manufacturing a semiconductor device according to claim 31, further comprising the steps of:

depositing an anti-oxidation cap layer on the Co layer; and after the first thermal treatment, removing the anti-oxidation layer and unreacted Co.

* * * * *

UNITED STATES PATENT AND TRADEMARK OFFICE
CERTIFICATE OF CORRECTION

PATENT NO.        : 6,197,646 B1
APPLICATION NO. : 08/693635
DATED             : March 6, 2001
INVENTOR(S)       : Kenichi Goto et al.

It is certified that error appears in the above-identified patent and that said Letters Patent is hereby corrected as shown below:

On the Figures

Sheet 48 of 49 On Fig. 47, please change "B1" to --B2--, and change "B2" to --B1--.

Sheet 49 of 49 On Fig. 48, please change "B1" to --B2--, and change "B2" to --B1--.

On Column 30, line 30, please change "$B1 \leqq B \leqq B2$" to --$B1 \geqq B \geqq B2$--.

Column 31, line 54, please change "$B1 \leqq B \leqq B2$" to --$B1 \geqq B \geqq B2$--.

On Column 33, line 1, please change "$B1 \leqq B \leqq B2$" to --$B1 \geqq B \geqq B2$--.

On Column 34, line 21, please change "$B1 \leqq B \leqq B2$" to --$B1 \geqq B \geqq B2$--.

Signed and Sealed this

Twenty-second Day of August, 2006

JON W. DUDAS
*Director of the United States Patent and Trademark Office*